(12) United States Patent
Ranjan et al.

(10) Patent No.: US 8,535,952 B2
(45) Date of Patent: Sep. 17, 2013

(54) METHOD FOR MANUFACTURING NON-VOLATILE MAGNETIC MEMORY

(75) Inventors: Rajiv Yadav Ranjan, San Jose, CA (US); Parviz Keshtbod, Los Altos Hills, CA (US); Roger Klas Malmhall, San Jose, CA (US)

(73) Assignee: Avalanche Technology, Inc., Fremont, CA (US)

( * ) Notice: Subject to any disclaimer, the term of this patent is extended or adjusted under 35 U.S.C. 154(b) by 1449 days.

(21) Appl. No.: 12/040,827

(22) Filed: Feb. 29, 2008

(65) Prior Publication Data
US 2008/0293165 A1 Nov. 27, 2008

Related U.S. Application Data

(63) Continuation-in-part of application No. 11/674,124, filed on Feb. 12, 2007, now Pat. No. 8,084,835, and a continuation-in-part of application No. 11/678,515, filed on Feb. 23, 2007, now Pat. No. 8,058,696, and a continuation-in-part of application No. 11/739,648, filed on Apr. 24, 2007, now Pat. No. 8,183,652, and a continuation-in-part of application No. 11/776,692, filed on Jul. 12, 2007, now Pat. No. 8,063,459, and a continuation-in-part of application No. 11/860,467, filed on Sep. 24, 2007, now Pat. No. 8,018,011, and a continuation-in-part of application No. 11/866,830, filed on Oct. 3, 2007.

(60) Provisional application No. 60/853,115, filed on Oct. 20, 2006, provisional application No. 60/777,012, filed on Feb. 25, 2006.

(51) Int. Cl.
*H01L 21/00* (2006.01)

(52) U.S. Cl.
USPC 438/3; 257/295; 257/E21.001; 257/E21.665; 257/E27.005

(58) Field of Classification Search
USPC ............. 438/3; 257/295, E21.001, E21.665, 257/E27.005
See application file for complete search history.

(56) References Cited

U.S. PATENT DOCUMENTS

| 3,665,264 A | 5/1972 | Yukami et al. |
| 5,060,098 A | 10/1991 | Gotoh et al. |

(Continued)

FOREIGN PATENT DOCUMENTS

| JP | 2002197851 A | 7/2002 |
| JP | 2004006774 A | 1/2004 |

(Continued)

OTHER PUBLICATIONS

T. Sek et al.; Spin-polarized current-induced magnetization reversal in perpendicularly magnetized L10-FePt layers; Applied Physics Letters; 88, 172504 2006 ; Apr. 25, 2006.

(Continued)

*Primary Examiner* — Andy Huynh
(74) *Attorney, Agent, or Firm* — Maryam Imam; IPxLAW Group LLP

(57) ABSTRACT

In accordance with a method of the present invention, a method of manufacturing a magnetic random access memory (MRAM) cell and a corresponding structure thereof are disclosed to include a multi-stage manufacturing process. The multi-stage manufacturing process includes performing a front end on-line (FEOL) stage to manufacture logic and non-magnetic portions of the memory cell by forming an intermediate interlayer dielectric (ILD) layer, forming intermediate metal pillars embedded in the intermediate ILD layer, depositing a conductive metal cap on top of the intermediate ILD layer and the metal pillars, performing magnetic fabrication stage to make a magnetic material portion of the memory cell being manufactured, and performing back end on-line (BEOL) stage to make metal and contacts of the memory cell being manufactured.

23 Claims, 33 Drawing Sheets

(56) References Cited

U.S. PATENT DOCUMENTS

| | | | |
|---|---|---|---|
| 5,695,864 | A | 12/1997 | Slonczewski |
| 6,072,718 | A | 6/2000 | Abraham et al. |
| 6,169,689 | B1 | 1/2001 | Naji |
| 6,285,581 | B1 | 9/2001 | Tehrani et al. |
| 6,365,419 | B1 | 4/2002 | Durlam et al. |
| 6,421,270 | B1 | 7/2002 | Tai |
| 6,469,926 | B1 | 10/2002 | Chen |
| 6,501,139 | B1 | 12/2002 | Petti |
| 6,590,806 | B1 | 7/2003 | Bhattacharyya |
| 6,603,677 | B2 | 8/2003 | Redon et al. |
| 6,639,312 | B2 | 10/2003 | Herner et al. |
| 6,642,595 | B1 | 11/2003 | Hung et al. |
| 6,649,451 | B1 | 11/2003 | Vyvoda et al. |
| 6,670,660 | B2 | 12/2003 | Hosotani |
| 6,697,294 | B1 | 2/2004 | Qi et al. |
| 6,714,444 | B2 | 3/2004 | Huai et al. |
| 6,724,585 | B2 | 4/2004 | Hayashi |
| 6,743,642 | B2 | 6/2004 | Costrini et al. |
| 6,744,086 | B2 | 6/2004 | Daughton et al. |
| 6,759,263 | B2 | 7/2004 | Ying et al. |
| 6,783,999 | B1 | 8/2004 | Lee |
| 6,821,907 | B2 | 11/2004 | Hwang et al. |
| 6,893,893 | B2 | 5/2005 | Nallan et al. |
| 6,905,578 | B1 | 6/2005 | Moslehi et al. |
| 6,920,063 | B2 | 7/2005 | Huai et al. |
| 6,933,155 | B2 | 8/2005 | Albert et al. |
| 6,964,928 | B2 | 11/2005 | Ying et al. |
| 6,984,561 | B2 | 1/2006 | Herner et al. |
| 6,984,585 | B2 | 1/2006 | Ying et al. |
| 6,985,385 | B2 | 1/2006 | Nguyen et al. |
| 6,992,359 | B2 | 1/2006 | Nguyen et al. |
| 6,995,422 | B2 | 2/2006 | Herner et al. |
| 7,002,781 | B2 | 2/2006 | Sugawara |
| 7,005,730 | B2 | 2/2006 | Verma et al. |
| 7,009,877 | B1 | 3/2006 | Huai et al. |
| 7,018,878 | B2 | 3/2006 | Vyvoda et al. |
| 7,023,725 | B2 | 4/2006 | Saito et al. |
| 7,023,739 | B2 | 4/2006 | Chen et al. |
| 7,026,673 | B2 | 4/2006 | Abraham |
| 7,057,921 | B2 | 6/2006 | Valet |
| 7,088,609 | B2 | 8/2006 | Valet |
| 7,106,624 | B2 | 9/2006 | Huai et al. |
| 7,109,539 | B2 | 9/2006 | Lu |
| 7,120,049 | B2 | 10/2006 | Nakamura et al. |
| 7,123,498 | B2 | 10/2006 | Miyatake et al. |
| 7,126,201 | B2 | 10/2006 | Matsutera et al. |
| 7,148,531 | B2 | 12/2006 | Daughton et al. |
| 7,170,775 | B2 | 1/2007 | Lin et al. |
| 7,183,130 | B2 | 2/2007 | Nuetzel et al. |
| 2002/0048128 | A1 | 4/2002 | Kamiguchi et al. |
| 2003/0108776 | A1 | 6/2003 | Chang et al. |
| 2003/0123200 | A1 | 7/2003 | Nagasaka et al. |
| 2003/0128483 | A1 | 7/2003 | Kamijo |
| 2003/0232223 | A1 | 12/2003 | Leddy et al. |
| 2004/0042128 | A1 | 3/2004 | Slaughter et al. |
| 2004/0130936 | A1 | 7/2004 | Nguyen et al. |
| 2004/0159832 | A1 | 8/2004 | Hack |
| 2004/0170055 | A1 | 9/2004 | Albert et al. |
| 2004/0201070 | A1 | 10/2004 | Deak |
| 2005/0045913 | A1 | 3/2005 | Nguyen et al. |
| 2005/0063222 | A1 | 3/2005 | Huai et al. |
| 2005/0105325 | A1 | 5/2005 | Haneda et al. |
| 2005/0167657 | A1 | 8/2005 | Nickel et al. |
| 2005/0195532 | A1 | 9/2005 | Sugiyama et al. |
| 2005/0201020 | A1 | 9/2005 | Fuke et al. |
| 2005/0207219 | A1 | 9/2005 | Lee et al. |
| 2005/0254287 | A1 | 11/2005 | Valet et al. |
| 2006/0017081 | A1 | 1/2006 | Sun et al. |
| 2006/0081953 | A1 | 4/2006 | Nguyen et al. |
| 2006/0083056 | A1 | 4/2006 | Daughton et al. |
| 2006/0104110 | A1 | 5/2006 | Sun et al. |
| 2006/0109591 | A1 | 5/2006 | Ranjan et al. |
| 2006/0114620 | A1 | 6/2006 | Sbiaa et al. |
| 2006/0141640 | A1 | 6/2006 | Huai et al. |
| 2006/0171198 | A1 | 8/2006 | Saito et al. |
| 2006/0187703 | A1 | 8/2006 | Mizuguchi et al. |
| 2006/0192237 | A1 | 8/2006 | Huai |
| 2006/0227465 | A1 | 10/2006 | Inokuchi et al. |
| 2006/0239066 | A1 | 10/2006 | Liaw |
| 2006/0268604 | A1 | 11/2006 | Onogi et al. |
| 2007/0007609 | A1 | 1/2007 | Saito et al. |
| 2007/0085068 | A1 | 4/2007 | Apalkov et al. |
| 2007/0164336 | A1 | 7/2007 | Saito et al. |
| 2008/0043519 | A1 | 2/2008 | Kitagawa et al. |

FOREIGN PATENT DOCUMENTS

| | | | |
|---|---|---|---|
| JP | 2006157027 | A | 6/2006 |
| JP | 2006269530 | A | 10/2006 |
| JP | 2006277864 | A | 10/2006 |
| JP | 2006295198 | | 10/2006 |
| JP | 2007073971 | | 3/2007 |
| JP | 2007096105 | A | 4/2007 |
| JP | 2007142364 | A | 6/2007 |

OTHER PUBLICATIONS

Yingfan, Xu et al.; In situ ordering of FePt thin films with face-centered-tetragonal 001 texture on Cr100ÅxRux underlayer at low substrate temperature; Applied Physics Letters, vol. 80, No. 18, May 6, 2002.

S. Mangin et al.; Current-induced magnetization reversal in nanopillars with perpendicular anisotropy; Nature Materials; Mar. 2005; vol. 5.

F. J. Albert, et al.; Quantitative Study of Magnetization Reversal by Spin-Polarized Current in Magnetic Multilayer Nanopillars; Physical Review Letters; vol. 89, No. 22; Nov. 25, 2002.

Hao Meng, et al.; Current Confined Effect of Magnet Nano-Current-Channel for Magnetic Random Access Memory; The Center for Micromagnetics and Information Technology; Oct. 31, 2006.

L. Berge; Emission of spin waves by a magnetic multilayer traversed by a current; Physical Review; Oct. 1, 1996; vol. 54, No. 13.

G. D. Fuchs, et al.; Spin Torque, Tunnel-Current Spin Polarization, and Magnetoresistance in MgO Magnetic Tunnel Junctions; Physical Review Letters; PRL 96, 186603 (2006); May 12, 2006.

Jun Hayakawa; Current-Driven Magnetization Switching in CoFeB/MgO/CoFeB Magnetic Tunnel Junctions; Japanese Journal of Applied Physics; vol. 44, No. 41, 2005, pp. L 1267-L 1270.

Hao Meng, et al.; Composite free layer for high density magnetic random access memory with lower spin transfer current; Applied Physics Letters 89, 152509; Oct. 12, 2006.

Hao Meng, et al.; Low critical current for spin transfer in magnetic tunnel junctions; Applied Physics Letters; 88; Feb. 23, 2006.

G. D. Fuchs; Spin-transfer effects in nanoscale magnetic tunnel junctions; Applied Physics Letters; vol. 85, No. 7; Aug. 16, 2004.

J.C. Slonezewski; Current-driven excitation of magnetic multi-layers; Journal of Magnetism and Magnetic Materials; Dec. 19, 1995.

G. Consolo, et al.; Spin-torque switching in Py/Cu/Py and Py/Cu/CoPt spin-valve nanopillars; Journal of Magnetism and Magnetic Materials; Mar. 23, 2007.

F. J. Albert; Spin-polarized current switching of a Co thin film nanomagnet; Applied Physics Letters; vol. 77, No. 23; Dec. 4, 2000.

Xiaochun Zhu; Spin Torque and Field-Driven Perpendicular MRAM Designs Scalable to Multi-Gb/Chip Capacity; , vol. 42, No. 10, Oct. 2006.

C. J. Sun, et al.; Epitaxial L1o FePt magnetic thin films sputtered on Cu (001); Applied Physics Letters; vol. 82, No. 12; Mar. 24, 2003.

J. A. Katine et al.; Current-Driven Magnetization Reversal and Spin-Wave Excitations in CoCuCo Pillars; Physical Review Letters; vol. 84; Apr. 3, 2000.

L.Berger, Emission of spin waves by a magnetic nulitlayer traversed by a current, article, Oct. 1, 1996, 6 pages, vol. 54, No. 13, The American Physical Society.

F.J. Albert, J.A. Katine, R.A. Buhrman, and D.C. Ralph, Spin-polarized current switching of a Co thin film nanomagnet, article, Dec. 4, 2000, 3 pages, vol. 77-No. 23, American Institute of Physics.

B.N. Engel, J. Akerman, B. Butcher, R.W. Dave, M. Deherrera, M. Durlam, G. Grynkewich, J. Janesky, S.V. Pietambaram, N.D. Rizzo, J.M. Slaughter, K. Smith, J.J. Sun, and S. Tehrani, A 4-Mb Toggle MRAM Based on a Novel Bit and Switching Method, article, Jan. 2005, 5 pages, vol. 41-No. 1, IEEE Transactions on Magnetics.

J.C. Slonczewski, Letter to the Editor: Current-driven excitation of magnetic multilayers, journal, Dec. 19, 1995, 7 pages, Journal of Magnetism and Magnetic Materials 159.

Sossmeier, K.D. et al., Comparison between ac and dc current annealing in CoFeSiB glass-covered amorphouse microwires, J. Phys. D: Appl. Phys. 40 (2007) 3233-3238.

Nowosielski, R. et al., Crystallization kinetics of an amorphous Co77Si11.5B11.5 alloy, JAMME, Jul.-Aug. 2006. vol. 17, Issue 1-2, pp. 121-124.

Hiki, Y., et al., Stabilization of metallic glass by isochronal and isothermal annealing treatments, J. Phys.: Condens. Matter 19 (2007) 2005147 (7 pp).

Kubota, H., et al., Dependence of spin-transfer switching current on free layer thickness in Co-Fe-B/MgO/Co-Fe-B magnetic tunnel junctions, App. Phys. Letters 89, 032505 (2006) (3 pp.).

Tsunekawa, K., et al., Structural and Electrical Properties of (CoxFe100-x)81B19/MgO/(CoxFe100-x)81B19 Magnetic Tunnel Junctions, HA-01 Intermag, May 12, 2006, 15 pp.

Munakata, M., et al., B-Concentration Dependence on Anisotropy Field of CoFeB Thin Film for Gigahertz Frequency Use, IEEE Transactions on Magnetics, vol. 41, No. 10, Oct. 2005, pp. 3262-3264.

Park, C., et al., Annealing effects on structural and transport properties of rf-sputtered CoFeB/MgO/CoFeB magnetic tunnel junctions, J. Applied Physics 99, 08A901 (2006), pp. 2639-2641.

Burton, J.D., et al., Atomic and Electronic Structure of the CoFeB/MgO Interface from First Principles, 3 pp.

Hayakawa, J., et al., Dependence of Giant Tunnel Magnetoresistance of Sputtered CoFeB/MgO/CoFeB Magnetic Tunnel Junctions on MgO Barrier Thickness and Annealing Temperature, 17 pp.

Ikeda, S., et al., Dependence of tunnel magnetoresistance on ferromagnetic electrode materials in MgO-barrier magnetic tunnel junctions, 9 pp.

Lee, Y.M., et al., Giant tunnel magnetoresistance and high annealing stability in CoFeB/MgO/CoFeB magnetic tunnel junctions with synthetic pinned layer, 17 pp.

Albert, F.J., et al., Spin-polarized current switching of a Co thin film nanomagnet, Applied Physics Letters, vol. 77, No. 23, Dec. 4, 2000, pp. 3809-3811.

Emley, N.C., et al., Reduction of spin transfer by synthetic antiferromagnets, Applied Physics Letters, vol. 84, No. 21, May 24, 2004, pp. 4257-4259.

Fuchs, G.D., et al., Spin-transfer effects in nanoscale magnetic tunnel junctions, Applied Physics Letters, vol. 85, No. 7, Aug. 16, 2004, pp. 1205-1207.

Fuchs, G.D., et al., Adjustable spin torque in magnetic tunnel junctions with two fixed layers, Applied Physics Letters, 86, 152509 (2005), 3 pp.

Braganca, P.M., et al., Reducing the critical current for short-pulse spin-transfer switching of nanomagnets, Applied Physics Letters 87, 112507 (2005), 3 pp.

Ozatay, O., et al., Spin transfer by nonuniform current injection into a nanomagnet, Applied Physics Letters 88, 202502 (2006), 3 pp.

Kiselev, S., et al., Spin-Transfer-Driven Magnetic Switching and Precession, Nanomagnetics Workshop, May 14, 2004, 25 pp.

Tinkham, M., et al., Tunneling Through Metallic Quantum Dots, J. of Low Temperature Physics, vol. 118, Nos. 5/6, 2000, pp. 271-285.

Krivorotov, I.N., et al., Large-amplitude coherent spin waves exited by spin-polarized current in nanoscale spin valves, 24 pp.

Pribiag, V.S., et al., Magnetic vortex oscillator driven by dc spin-polarized current, 14 pp.

Salinas, D.G., et al., Effects of spin-orbit interactions on tunneling via discrete energy levels in metal nanoparticles, Physical Review B, vol. 60, No. 8, Aug. 15, 1999, pp. 6137-6145.

Waintal, X., et al., Role of spin-dependent interface scattering in generating current-induced torques in magnetic multilayers, Physical Review B, vol. 62, No. 18, Nov. 1, 2000, pp. 12317-12327.

Kiselev, S. I., et al., Spin-transfer excitations of permalloy nanopillars for large applied currents, Physical Review B 72, 064430 (2005), 10 pp.

Katine, J.A., et al., Current-Driven Magnetization Reversal and Spin-Wave Excitations in Co/Cu/Co Pillars, Physical Review Letters, vol. 84., No. 14, Apr. 3, 2000, pp. 3149-3152.

Myers, E.B., et al., Thermally Activated Magnetic Reversal Induced by a Spin-Polarized Current, Physical Review Letters, vol. 89, No. 19, Nov. 4, 2002, 4 pp.

Albert, F.J., et al., Quantitative Study of Magnetization Reversal by Spin-Polarized Current in Magnetic Multilayer Nanopillars, Physical Review Letters, vol. 89, No. 22, Nov. 25, 2002, 4 pp.

Kiselev, S. I., et al., Current-Induced Nanomagnetic Dynamics for Magnetic Fields Perpendicular to the Sample Plane, Physical Review Letters, vol. 93, No. 3, Jul. 16, 2004, 4 pp.

Krivorotov, I.N., Temperature Dependence of Spin-Transfer-Induced Switching of Nanomagnets, Physical Review Letters, vol. 93. No. 16, Oct. 15, 2004, 4 pp.

Fuchs, G.D., et al., Spin Torque Tunnel-Current Spin Polarization and Magnetoresistance in MgO Magnetic Tunnel Junctions, Physical Review Letters 96, 186603, May 12, 2006, 4 pp.

Myers, E.B., Current-Induced Switching of Domains in Magnetic Multilayer Devices, Science, vol. 285, Aug. 6. 1999, pp. 867-870.

Krivorotov, I.N., Time-Domain Measurements of Nanomagnet Dynamics Driven by Spin-Transfer Torques, Science, vol. 307, Jan. 14, 2005.

Myers, E.B., Currrent-Induced Switching of Domains in Magnetic Multilayer Devices, 14 pp.

Shibata, J., et al., Magnetic Vortex Dynamics Induced by Spin-Transfer Torque, 1 p.

Klaui, M., et al., Direct Observation of Domain-Wall Configurations Transformed by Spin Currents, Physical Review Letters 95, 026601 Jul. 8, 2005, 4 pp.

Thomas, L., et al., Oscillatory dependence of current-driven magnetic domain wall motion on current pulse length, Nature, vol. 443/14, Sep. 2006, pp. 197-200.

Saitoh, E., et al., Current-induced resonance and mass determination of a single magnetic domain wall, Nature, vol. 431, Nov. 11, 2004, pp. 203-206.

Jung, S-W, et al., Current-Induced Magnetic Domain-Wall Motion by Spin Transfer Torque: Collective Coordinate Approach with Domain-Wall Width Variation, 13 pp.

Vanhaverbeke, A., et al., Transverse domain wall propagated by spin-polarized current, IBM Research, Zurich Research Laboratory, 1 p.

Bazaliy, Y.B., et al., Nonlinear regimes of current-induced domain wall motion, 29 pp.

Waintal, X., et al., Current induced distortion of a magnetic domain wall, May 9, 2007, 5 pp.

Laufenberg, M., Dissertation, Interactions Between Current and Domain Wall Spin Structures, Jul. 26, 2006, 210 pp.

Vernier, N., et al., Domain wall propagation in magnetic nanowires by spin polarized current injection, 17 pp.

Beach, G.S.D., et al., Dynamics of field-driven domain-wall propagation in ferromagnetic nanowires, Nature Materials 4, 741-744 (2005).

Varga, E., Domain wall motion in permalloy wires, 12 pp.

Lua, S.Y.H., et al., Effect of an exchange tab on the magnetization switching process of magnetic nanowires, J. Phys. D: Appl. Phys 40 (2007) 3011-3015.

Ohno, H., et al., Electrical Manipulation of Domain Walls in Ferromagnetic Semiconductors, Croucher Advanced Study Institute— Science and Applications of Spin Electronics, The University of Hong Kong, Aug. 15-20, 2005, 23 pp.

Stiles, M.D., et al., Adiabatic Domain Wall Motion and Landau-Lifshitz Damping, May 31, 2007. 6 pp.

Jubert, P.O., Structure and current-induced motion of magnetic domain walls, 4 pp.

Berakdar, J., et al., Spin transport and spin torque in a magnetic nanowire with a non-collinear magnetic order, J. Physics: Conference Series 61 (2007) 105-109.

Tsoi, M., et al, Magnetic domain wall motion triggered by an electric current, App. Phys. Letters, vol. 83, No. 13, Sep. 29, 2003, 2617-2619.

Thiaville, A., et al., Micromagnetic understanding of current-driven domain wall motion in patterned nanowires, Europhys. Lett 69 (6), Mar. 15, 2005, pp. 990-996.

Shibata, J., et al., Current-induced magnetic vortex motion by spin-transfer torque, Physical Review B 73, 020403(R) (2006), 4 pp.

Yamaguchi, A., et al., Reduction of threshold current density for current-driven domain wall motion by shape control, 16 pp.

Kimura, T., et al., Spin-current-assisted domain-wall depinning in a submicron magnetic wire, J. App. Phys., vol. 94, No. 12, Dec. 15, 2003, pp. 7947-7949.

Grollier, J., et al., Switching a spin-valve back and forth by current-induced domain wall motion, 4 pp.

Grollier, J., et al., Switching the magnetic configuration of a spin valve by current-induced domain wall motion, J. App. Phys., vol. 92, No. 8, Oct. 15, 2002, pp. 4825-4827.

Gomez, R.D., et al., An approach to Wearable Magnetic Random Access Memory, ECE Dept., University of Maryland, 12 pp.

Hajto, J., et al., Quantized Electron Transport in Amorphous-Silicon Memory Structures, Physical Review Letters, vol. 66, No. 14, Apr. 8, 1991, pp. 1918-1921.

Rossel, C., et al., Electrical current distribution across a metal-insulator-metal structure during bistable switching, J. Appl. Phys., vol. 90, No. 6, Sep. 15, 2001, pp. 2892-2898.

DeBrosse, J., Circuit Considerations for Spin-Switched MRAM Devices, IBM Microelectronics, May 14, 2004, 15 pp.

Mal-Fitt, T.M., et al., Design considerations for MRAM, IBM J. Res. & Devl., vol. 50, No. 1, Jan. 2006, pp. 25-39.

Gallagher, W. J. et al., Development of the magnetic tunnel junction MRAM at IBM: From first junctions to a 16-Mb MRAM demonstrator chip, IBM J. Res. & Devl., vol. 50, No. 1, Jan. 2006, pp. 5-23A.

Jiang, X., et al., Highly efficient room-temperature tunnel spin injector using CoFe/MgO(001), IBM J. Res. & Dev., vol. 50, No. 1, Jan. 2006, pp. 111-120.

Parkin, Stuart, Magnetic Race-Track Memory: Current Induced Domain Wall Motion!, IBM Research, 2006, 60 pp.

Abraham, D.W., Rapid-turnaround characterization methods for MRAM development, IBM J. Res. & Dev., vol. 50, No. 1, Jan. 2006, pp. 55-67.

Worledge, D.C., Single-domain model for toggle MRAM, IBM J. Res. & Dev., vol. 50, No. 1, Jan. 2006 pp. 69-79.

Sun, J.Z., Spin angular momentum transfer in current-prpendicular nanomagnetic junctions, IBM J. Res. & Dev., vol. 50, No. 1, Jan. 2006, pp. 81-100.

Wolf, S.A., Spintronics—A retrospective and perspective, IBM J. Res. & Dev., vol. 50, No. 1, Jan. 2006, pp. 101-110.

Gaidis, M.C., Two-level BEOL processing for rapid iteration in MRAM development, IBM J. Res. & Dev., vol. 50, No. 1, Jan. 2006, pp. 41-54.

Ikeda, S., Magnetic Tunnel Junctions for Spintronic Memories and Beyond, IEEE Trans. on Electron Devices, vol. 54., No. 5, May 2007, pp. 991-1002.

Johnson, M., Optimized Device Characteristics of Lateral Spin Valves, IEEE Trans. on Electron Devices, vol. 54., No. 5, May 2007, pp. 1024-1031.

Tanaka, M., et al., MOS-Based Spin Devices for Reconfigurable Logic, IEEE Trans. on Electron Devices, vol. 54., No. 5, May 2007, pp. 961-976.

Bibes M., et al., Oxide Spintronics, IEEE Trans. on Electron Devices, vol. 54., No. 5, May 2007, pp. 1003-1023.

Van Roy, W., et al., Spin Injection and Detection in Semiconductors—Electrical Issues and Device Aspects, IEEE Trans. on Electron Devices, vol. 54., No. 5, May 2007, pp. 933-944.

Sanchez, David, et al., Spin-Polarized Transport in II-VI Magnetic Resonant-Tunneling Devices, IEEE Trans. on Electron Devices, vol. 54., No. 5, May 2007, pp. 984-990.

Nitta, J. et al., Electrical Manipulation of Spin Precession in an InGaAs-Based 2DEG Due to the Rashba Spin-Orbit Interaction, IEEE Trans. on Electron Devices, vol. 54., No. 5, May 2007, pp. 955-960.

Flatte, M.E., Spintronics, IEEE Trans. on Electron Devices, vol. 54., No. 5, May 2007, pp. 907-920.

Gould, C. et al., Tunneling Anisotropic Magnetoresistance-Based Devices, IEEE Trans. on Electron Devices, vol. 54., No. 5, May 2007, pp. 977-983.

Pearton, S.J., et al., ZnO Doped With Transition Metal Ions, IEEE Trans. on Electron Devices, vol. 54., No. 5, May 2007, pp. 1040-1048.

Seneor, P. et al., Nanospintronics: when spintronics meets single electron physics, J. Phys: Condens. Matter 19 (2007) 22 pp.

Ernult, F. et al., Spin accumulation in metallic nanoparticles, J. Phys: Condens. Matter 19 (2007) 19 pp.

Dieny, B. et al., Spin Electronics, J. Phys: Condens. Matter 19 (2007) 3 pp.

Kimura, T. et al., Spin transport in lateral ferromagnetic/nonmagnetic hybrid structures, J. Phys: Condens. Matter 19 (2007) 13 pp.

Tiusan, C. et al., Spin tunnelling phenomena in single-crystal magnetic tunnel junction systems, J. Phys: Condens. Matter 19 (2007) 35 pp.

Diao, Z. et al., Spin-transfer torque switching in magnetic tunnel junctions and spin-transfer torque random access memory, J. Phys: Condens. Matter 19 (2007) 13 pp.

Attema, J.J., et al, Spintronic materials based on main-group elements, J. Phys: Condens. Matter 19 (2007) 11 pp.

Moodera, J.S. et al., The phenomena of spin-filter tunnelling, J. Phys: Condens. Matter 19 (2007) 24 pp.

Ding, Y. et al., Fabrication of current-induced magnetization switching devices using etch-back planarization process, J. Appl. Phys. 97 (2005) 3 pp.

Meng, H. et al., Low resistance spin-dependent magnetic tunnel junction nwith high breakdown voltage for current-induced induced magnetization-switching devices, J. Appl. Phys. 97 (2005) 3 pp.

Meng, H., Spin Transfer with Low Switching Current Density, University of Minnesota, 2006 MINT Review, 14 pp.

Meng, H. et al., Spin Transfer Effect in Magnetic Tunnel Junction with Nano-Current-Channel, University of Minnesota, InterMag 2005, 14 pp.

Meng, H. et al., Composite free layer for high density magnetic random access memory with lower spin transfer current, Appl. Phys. Letters 89 (2006) 3 pp.

Meng, H. et al., Spin transfer in nanomagnetic devices with perpendicular anisotropy, Appl. Phys. Letters 88 (2006) 3 pp.

Meng, H. et al., A Composite Free Layer for High Density Magnetic Random Access Memory with Lower Spin Transfer Current, Submitted to Appl. Phys. Letters, May 2006, 14 pp.

Meng, H. et al., Spin Transfer Effect in Magnetic Tunnel Junction With a Nano-Current-Channel Layer in Free Layer, IEEE Trans. on Magnetics, vol. 41, No. 10, Oct. 2005, pp. 2612-2614.

Meng, H. et al., Spin Transfer Effect in Magnetic Tunnel Junction with Low Resistance, The Center for Micromagnetic and Information Technology (MINT) & Department of Electrical & Computer Engineering, University of Minnesota, 2 pp.

Meng, H. et al., A New Memory Cell Structure for MRAM with Low Writing Threshold, MMM 2005, University of Minnesota, 13 pp.

Meng, H. et al., Spin Transfer in Magnetic Nano Devices with Perpendicular Anisotropy, MMM 2005, University of Minnesota, 13 pp.

Meng, H. et al., Low critical current for spin transfer in magnetic tunnel junctions, Appl. Phys. Letters 88 (2006) 3 pp.

Meng, H. et al., A New Memory Cell Structure for Magnetic Random Access Memory with Low Writing Threshold, The Center for Micromagnetic and Information Technology (MINT) & Department of Electrical & Computer Engineering, University of Minnesota, 1 p.

Wang, J.-P. et al., Spin Transfer in Magnetic Nano Devices with Perpendicular Anisotropy, University of Minnesota, 2006 APS A-22. 00011, 14 pp.

Lo, T.N. et al., E-beam lithography and electrodeposition fabrication of thick nanostructured devices, J. Phys. D: Appl. Phys 40 (2007) pp. 3172-3176.

Technology Backgrounder: Immersion Lithography, IC Knowledge 2003, 5 pp.

Martin, J.I. et al., Ordered magnetic nanostructures: fabrication and properties, J. Magnetism and Magnetic Materials 256 (2003) pp. 449-501.

Onai, T. et al., Outlook for Advanced Semiconductor Process and Manufacturing Technologies, Hitachi Review, vol. 52 (2003) No. 3, pp. 117-124.

Garner, C.M., Technology Challenges & Opportunities for Nanomaterials, 2007 ITRS Public Conference, 15 pp.

Chezan, A.R. et al., Influence of stresses and magnetostriction on the soft magnetic behavior of metallic films, J. Magnetism and Magnetic Materials 299 (2006) pp. 219-224.

Wang, D. et al., Magnetostriction Effect of Amorphous CoFeB Thin Films and Application in Spin Dependent Tunnel Junctions, NVE Corporation, 2004, pp. 1-14.

Shin, C.-S. et al., Growth, surface morphology, and electrical resistivity of fully strained substoichiometric epitaxial TiNx ($0.67<\_x<1.0$) layers on MgO(001), J. Appl. Phys., vol. 95, No. 1, Jan. 1, 2004, pp. 356-362.

Itoh, H., Theory of tunnel magnetoresistance and spin filter effect in magnetic tunnel junctions, J. Phys. D: Appl. Phys. 40 (2007) 1228-1233.

Liu, X. et al., Thermal stability of magnetic tunneling junctions with MgO barriers for high temperature spintronics, Appl. Phys. Lett. 89, 023504 (2006) 3 pp.

Trachenko, K. et al., How the nature of the chemical bond governs resistance to amorphization by radiation damage, Physical Review B 71, 184104 (2005) 5 pp.

Shen, W. et al., Effect of film roughness in MgO-based magnetic tunnel junctions, Appl. Phys. Lett. 88, 182508 (2006) 3 pp.

Ikeda, S. et al., Dependence of tunnel magnetoresistance in MgO based magnetic tunnel junctions on Ar pressure during MgO sputtering, 19 pp.

Miao, G-X. G-X et al., Inelastic tunneling spectroscopy of magnetic tunnel junctions based on CoFeB/MgO/CoFeB with Mg insertion layer, J. Appl. Phys. 99, 08T305 (2006) 3 pp.

Diao, Z. et al., Spin transfer switching in dual MgO magnetic tunnel junctions, Appl. Phys. Lett. 90, 132508 (2007) 3 pp.

Padhan, P. P et al., Frequency-dependent magnetoresistance and magnetocapacitance properties of magnetic tunnel junctions with MgO tunnel barrier, Appl. Phys. Lett. 90, 142105 (2007) 3 pp.

Lee, J.M. et al., Current-Induced Magnetization Switching Probability in MgO-Based Magnetic Tunnel Junctions, IEEE Transactions on Magnetics, vol. 43, No. 2, Feb. 2007, pp. 917-919.

Kawahara, T. et al., 2Mb Spin-Transfer Torque RAM (SPRAM) with Bit-by-Bit Bidirectional Current Write and Parallelizing-Direction Current Read, ISSCC 2007, Session 26, Non-Volatile Memories, 26.5, pp. 480-481.

Lee, Y.M. et al., tunnel magnetoresistance and high annealing stability in CoFeB/MgO/CoFeB magnetic tunnel junctions with synthetic pinned inned layer, pp. 1-17.

Dave, R.W. et al., MgO-Based Tunnel Junction Material for High-Speed Toggle Magnetic Random Access Memory, IEEE Transactions on Magnetics, vol. 42, No. 8, Aug. 2006, pp. 1935-1939.

Lee, K.J., Excitations of Incoherent Spin-Waves due to Spin-Transfer Torque, pp. 1-14.

Kiselev, S.I. et al., Current-Induced Nanomagnetic Dynamics for Magnetic Fields Perpendicular to the Sample Plane, Phys. Rev. Lett., vol. 93, No. 3, Jul. 16, 2004, 4 pp.

Sankey, J.C. et al., Mechanisms limiting the coherence time of spontaneous magnetic oscillations driven by dc spin-polarized currents, Physical Review B 72, 224427 (2005) 5 pp.

Nogi, Y. et al., Preparation and magnetotransport properties of MgO-barrier-based magnetic double tunnel junctions including nonmagnetic nanoparticles, J. Phys. D: Appl. Phys. 40 )2007) pp. 1242-1246.

Barnetson, D., QDMtm Flash Memory, Semicon West 2007, Jul. 17, 2007, 18 pp.

Ernult, F. et al., Spin accumulation in metallic nanoparticles, J. Phys: Condens. Matter 19 (2007) 165214, 19 pp.

Hayakawa, J. et al., Current-driven switching of exchange biased spin-valve giant magnetoresistive nanopillars using a conducting nanoprobe, J. Appl. Phys., vol. 96, No. 6, Sep. 15, 2004, pp. 3440-3442.

Rippard, W.H. et al., Quantitative studies of spin-momentum-transfer-induced excitations in Co/Cu multilayer films using point-contact spectroscopy, Appl. Phys. Lett., vol. 82, No. 8, Feb. 24, 2003, pp. 1260-1262.

Chen, T.Y. et al., Current-induced switching in a single exchange-biased ferromagnetic layer, J. Appl. Phys. 97, 10C709 (2005) 3 pp.

Chen, T.Y. et al., Enhanced Magnetoresistance Induced by Spin Transfer Torque in Granular Films with a Magnetic Field, PRL 96, 207203 (2006) 4 pp.

Chen, T. et et al., Oxygen-pressure dependence of the crystallinity of MgO films grown on Si(1 0 0) by PLD, Journal of Crystal Growth 270 (2004), pp. 553-559.

Xiao, J. et al., Macrospin models of spin transfer dynamics, Phys. Rev. B 72, 014446 (2005), 13 pp.

Stiles, M.D. et al., Phenomenological Theory of Current-Induced Magnetization Precession, Nov. 20, 2003, 16 pp.

Stiles, M.D. et al., Spin Transfer Torque and Dynamics, 85 pp.

Rippard, W.H. et al., Spin-Transfer Induced Dynamics in Magnetic Nanostructures, NIST nanomagntodynamics and DARPA SpinS program, 29 pp.

Xiao, J. et al., Spin-transfer torque for continuously variable magnetization, Phys. Rev. B 73, 054428 (2006) 10 pp.

Derbenwick, G.F. et al., Advances in FeRAM Technologies, Celis Semiconductor Corporation, 3 pp.

Liu, S. et al., A New Concept for Non-Volatile Memory: The Electric-Pulse Induced Resistive Change Effect in Colossal Magnetoresistive Thin Films, Non-Volatile Memory Conference, San Diego, CA, Nov. 6-7, 2001, 32 pp.

Liu, S.Q. et al., A New Concept for Non-Volatile Memory: The Electric-Pulse Induced Resistive Change Effect in Colossal Magnetoresistive Thin Films, Space Vacuum Epitaxy Center, 7 pp.

Dippert, B., Hitting their stride: Nonvolatile-memory upstarts draw near to established leaders, designfeature: Advanced nonvolatile memories, Jan. 20, 2005, EDN 55, 6 pp.

Lupo, D.W., Thin Film Electronics ASA, ThinFilm Presentation, May 9, 2007, Thin Film Electronics, 33 pp.

Derbenwick, G.F. et al., Advances in FeRAM Technology, Non Volatile Memory Technology Symposium, Nov. 15-16, 2000, Arlington, VA, 23 pp.

Lenssen, J.-M.H. et al., Expectations of MRAM in comparison with other non-volatile memory technologies, 6 pp.

Maimon, J. et al., Chalcogenide-Based Non-Volatile Memory Technology, Mission Research Corporation, 18 p.

Deak, J.G., Spin Injection in Thermally Assisted Magnetic Random Access Memory, NVE Corporation, 15 pp.

Anderson, J.M. et al., Address line-assisted switching of vertical magnetoresistive random access memory (VMRAM) cells, 49th Conference on Magnetism and Magnetic Materials, 15 pp.

Daughton, J., Magnetic Spin Devices: 7 Years from Lab to Product, Symposium X, MRS 2004 Fall Meeting, Dec. 1, 2004, 27 pp.

Tondra, M. et al., High Temperature Pinning Properties of IrMn vs. FeMn in Spin Valves, J. Vacuum Science and Technology, Jul./Aug. 1999, 15 pp.

Deak, J., Thermal Magnetic Random Access Memory, IEEE International Conference on Computer Design, New Memory Technologies, Oct. 4, 2005, 38 pp.

Deak, J. et al., Effect of Resistance-Area-Product and Thermal Environment on Writing of Magneto-Thermal MRAM, Mar. 13, 2006, 3 pp.

Daughton, J., Spintronic Applications at NVE, Cornell University, May 14, 2004, 39 pp.

Wang, D. et al., Spin dependent tunneling junctions with reduced Neel coupling, J. Appl. Phys., vol. 93, No. 10, Parts 2 & 3, May 15, 2003, pp. 8558-8560.

Sinclair, A. et al., Scaling and Power Properties of Thermally Written MRAM, Abstract, NVE Corporation, 1 p.

Carson, J.C. et al., High Density Packaging of Non-Volatile Memory, Irvine Sensors Corporation, 3 pp.

Diao, Z. et al., Spin-transfer torque switching in magnetic tunnel junctions and spin-transfer torque random access memory, J. Phys. Condens. Matter 19 (2007) 165209, 13 pp.

Manchon, A. et al., Modelling spin transfer torque and magnetoresistance in magnetic multilayers, J. Phys. Condens. Matter 19 (2007) 165212, 42 pp.

Tiusan, C. et al., Spin tunnelling phenomena in single-crystal magnetic tunnel junction systems, J. Phys. Condens. Matter 19 (2007) 165201, 35 pp.

Ochiai, T. et al., Distinctive current-induced magnetization switching in a current-perpendicular-to-plane giantmagnetoresistance nanopillar with a synthetic antiferromagnet free layer, Appl. Phys. Lett 86, 242506 (2005), 3 pp.

Berger, L., Multilayer configuration for experiments of spin precession induced by a dc current, J. Appl. Phys., vol. 93, No. 10, Parts 2 & 3, May 15, 2003, pp. 7693-7695.

Jiang, Y. et al., Substantial reduction of critical current for magnetization switching in an exchange-biased spin valve, Nature Materials, vol. 3, Jun. 2004, pp. 361-364.

Slonczewski, J.C., Conductance and exchange coupling of two ferromagnets separated by a tunneling barrier, Phys. Rev. B, vol. 39, No. 10, Apr. 1, 1989, pp. 6995-7002.

Slonczewski, J.C., Currents, torques, and polarization factors in magnetic tunnel junctions, Phys. Rev. B 71, 024411 (2005), 10 pp.

Mao, S. et al., Commercial TMR Heads for Hard Disk Drives: Characterization and Extendibility At 300 Gbit/in2, IEEE Transactions on Magnetics, vol. 42, No. 2, Feb. 2006, pp. 97-102.

Coyne, J., Storage Market: Opportunities, Myths and Facts, Western Digital, May 17, 2007, 24 pp.

Shimazawa, K. et al., Enhanced GMR Ratio of Dual Spin Valve With Monolayer Pinned Structure, IEEE Transactions on Magnetics, vol. 42, No. 2, Feb. 2006, pp. 120-125.

Wurz, M.C. et al., Fabrication of a Micro Coil for Magnetooptical Data Storage, IEEE Transactions on Magnetics, vol. 42, No. 10, Oct. 2006, pp. 2468-2470.

Rottmayer, R.E. et al., Heat-Assisted Magnetic Recording, IEEE Transactions on Magnetics, vol. 42, No. 10, Oct. 2006, pp. 2417-2421.

Covington, M., Spin transfer and other challenges in data storage, Seagate Research, Pittsburgh, PA, 27 pp.

Kumar, S.B. et al., MR Enhancement in a Current Perpendicular-to-Plane Spin Valve by Insertion of a Ferromagnetic Layer Within the Space Layer, IEEE Transactions on Magnetics, vol. 42, No. 10, Oct. 2006, pp. 2459-2461.

Wong, R-K. et al., Reliability of Tunneling Magnetoresistance Recording Head—Lifetime, Failure Mode, and Production Screening, IEEE Transactions on Magnetics, vol. 42, No. 2, Feb. 2006, pp. 232-236.

White, R.M. et al., Spin Transfer Stimulated Noise in Magnetic Recording Heads, Data Storage Systems Center, 41 pp.

Park, C. et al., Annealing effects on structural and transport properties of rf-sputtered CoFeB/MgO/CoFeB magnetic tunnel junctions, J. Appl. Phys. 99, 08A901 (2006), 3 pp.

Wiese, N. et al., Antiferromagnetically coupled CoFeB/Ru/CoFeB trilayers, arXiv:cond-mat10509749v1, Sep. 28, 2005, 3 pp.

Peng, Y. et al., Characterization of interfacial reactions in magnetite tunnel junctions with transmission electron microscopy, J. Appl. Phys., vol. 95, No. 11, pp. Jun. 1, 2004, 6798-6800.

Svedberg, E.B., Diffusion in Co90Fe10/Ru multilayers, J. Appl. Phys., vol. 94, No. 2, Jul. 15, 2003, pp. 993-1000.

Park, C. et al., Effect of Adjacent Layers on Crystallization and Magnetoresistance in CoFeB/MgO/CoFeB Magnetic Tunnel Junction, IEEE Transactions on Magnetics, vol. 42, No. 10, Oct. 2006, pp. 2639-2641.

Roy, A.G. et al., Effect of seed layers in improving the crystallographic texture of CoCrPt perpendicular recording media, J. Appl. Phys., vol. 91, No. 10, May 15, 2002, pp. 8076-8078.

Perdue, K.L. et al., Exchange Bias and Giant Magnetoresistance in Spin Valves with Angstrom-Scale Antiferromagnetic Layers at 5 K, Harvey Mudd College, Apr. 29, 2005, 40 pp.

Svedberg, E.B. et al., Interdiffusion in CoFe/Cu multilayers and its application to spin-valve structures for data storage, J. Appl. Phys., vol. 94, No. 2, Jul. 15, 2003, pp. 1001-1006.

Park, C. et al., Interfacial Composition and Microstructure of Fe3O4 Magnetic Tunnel Junctions, IEEE Transactions on Magnetics, vol. 39, No. 5, Sep. 2003, pp. 2806-2808.

Kim, Y.K. et al., Investigation of Magnetoresistive Characteristics of Metallic Multilayers Comprising Ru-Based Synthetic Antiferromagnetic Layers, J. Korean Phys. Soc., vol. 43, No. 3, Sep. 2003, pp. 396-399.

Moyerman, S. et al., Magnetic structure variations during giant magnetoresistance training in spin valves with picoscale antiferromagnetic layers, J. Appl. Phys. 99, 08R505 (2006), 3 pp.

Lu, B. et al., The Physics of Ultrahigh-Density Magnetic Recording (Springer Series in Surface Sciences, 41), Chapter 2, Microstructure of Longitudinal Media, 38 pp.

Li, H.F. et al., Nanocrystallisation of an Fe44.5Co44.4Zr7B4 amorphous magnetic alloy, Philosophical Magazine, vol. 86, No. 10, Apr. 1, 2006, pp. 1355-1372.

Jeong, S. et al., Nanostructure and magnetic properties of polycrystalline FePdPt/MgO thin films, J. Appl. Phys., vol. 91, No. 10. May 15, 2002, pp. 8813-8815.

Hsu, Y.-N. et al, New Ni5Al3 Underlayer for Longitudinal Magnetic Recording Media, IEEE Transactions on Magnetics, vol. 38, No. 4, Jul. 2002, pp. 1803-1806.

Wierman, K.W. et al., RuxCr1-x/Ta underlayer for Co-alloy perpendicular magnetic recording, J. Appl. Phys., vol. 91, No. 10, May 15, 2002, pp. 8031-8033.

Lee, J.C. et al., Stability enhancement of nanopillar structure for spin transfer magnetization switching using IrMn buffer layer, J. Appl. Phys. 99, 08G517 (2006), 3 pp.

Hsiao, A. et al., The Thermal, Magnetic, and Structural Characterization of the Crystallization Kinetics of Fe88Z47B4Cu1, An Amorphous Soft Magnetic Ribbon, IEEE Transactions on Magnetics, vol. 38, No. 5, Sep. 2002, pp. 3039-3044.

Stohr, J. et al., Magnetization Manipulation in Nanostructures by Spin Currents, NSF, Div. of Condensed Matter Physics & U.S. Dept. of Energy, 14 pp.

Kong, J.H. et al, Magnetization Reversal of Co\Cu\Co Pillars by Spin-Polarized Current with Magnetic Fields, J. Korean Phys. Soc., vol. 46, No. 4, Apr. 2005, pp. 931-936.

Berger, L., Emission of spin waves by a magnetic multilayer traversed by a current, Phys. Rev. B, vol. 54, No. 13, Oct. 1, 1996, pp. 9353-9358.

Slonczewski, J.C., Current-driven excitation of magnetic multilayers, Journal of Magnetism and Magnetic Materials 159 (1996), pp. L1-L7.

Albert, F.J. et al., Spin-polarized current switching of a Co thin film nanomagnet, Appl. Phys. Lett., vol. 77, No. 23, Dec. 4, 2000, pp. 3809-3811.

Berger, L., Multilayer configuration for experiments of spin precession induced by a dc current, J. Appl. Phys., vol. 93, No. 10, May 15, 2003, pp. 7693-7695.

Huai, Y. et al., Observation of spin-transfer switching in deep submicron-sized and low-resistance magnetic tunnel junctions, Appl. Phys. Lett., vol. 84, No. 16, Apr. 19, 2004, pp. 3118-3120.

Fuchs, G.D. et al., Adjustable spin torque n magnetic tunnel junctions with two fixed layers, Appl. Phys. Lett. 86, 152509 (2005), 3 pp.

Huai, Y. et al., Spin transfer switching current reduction in magnetic tunnel junction based dual spin filter structures, Appl. Phys. Lett. 87, 222510 (2005), 3 pp.

Hayakawa, J. et al., Current-Driven Magnetization Switching in CoFeB/MgO/CoFeB Magnetic Tunnel Junctions, JJAP, vol. 44, No. 41, 2005, pp. L1267-L1270.

Kalitsov, A. et al., Spin-polarized current-induced torque in magnetic tunnel junctions, J. Appl. Phys. 99, 08G501 (2006), 3 pp.

Vedyayev, A. et al., Resonant spin-torque in double barrier magnetic tunnel junctions, Physics Letters A 355 (2006), pp. 243-246.

Manchon, A. Modelling spin transfer torque and magnetoresistance in magnetic multilayers, J. Phys: Condens. Matter 19 (2007) 165212, 42 pp.

Mangin, S. et al., Current-induced magnetization reversal in nanopillars with perpendicular anisotropy, Nature Materials, vol. 5, Mar. 2006, pp. 210-215.

Wetzels, W. Interaction effects in spin-valve structures, Casimir PhD Series, Delft-Leiden, 2007-03, 117 pp.

Stiles, M.D. et al., Phenomenological Theory of Current-Induced Magnetization Precession, 16 pp.

Jeong, W.C. et al., Field assisted spin switching in magnetic random access memory, Samsung Electronics Co., Ltd., 14 pp.

Boulle, O. et al., Shaped Angular dependence of the spin transfer torque and microwave generation without magnetic field, 17 pp.

Wei, Z. et al., Spin transfer in an antiferromagnet, 5 pp.

Rivkin, K. et al., Switching spin valves using r.f. currents, 15 pp.

Yang, T. et al., Influence of capping layer on the current-induced magnetization switching in magnetic nanopillars, J. Appl Phys. 99, 073708 (2006), 5 pp.

Ji, Y. et al., Current-induced spin-wave excitations in a single ferromagnetic layer, 4 pp.

Nozieres, J.P., Magnetic Random Access Memories (M-RAM): A truly universal memory?, SPINTEC, 8 pp.

Dieny, B., Spintronics, Hong Kong Critical Components Manufacturing Inustry Quarterly Journal (Jun. 2002), 4 pp.

Dieny, B., Spin-Valves, 104 pp.

Karabacak, T. et al., Enhanced Step Coverage of Thin Films on Patterned Substrates by Oblique Angle Physical Vapor Deposition, May 22, 2004, 21 pp.

Yoda, H. et al., 1.8 V Power Supply 16 Mb-MRAMs With 42.3% Array Efficiency, IEEE Transactions on Magnetics, vol. 42, No. 10, Oct. 2006, pp. 2724-2726.

Engel, B.N. et al., A 4-Mb Toggle MRAM Based on a Novel Bit and Switching Method, IEEE Transactions on Magnetics, vol. 41, No. 1, Jan. 2005, pp. 132-136.

Tsuji, K. et al., 0.1 um-rule MRAM Development using Double-Layered Hard Mask, IEEE, IEDM 01-799-802.

Dittrich, R. et al., Energy barriers in magnetic random access memory elements, IEEE, 3 pp.

Slaughter, J. et al., MRAM Technology: Status and Future Challenges, Cornell CNS Nanotechnology Symposium, May 14, 2004, 45 pp.

Dave, Renu W., et al., MgO-Based Tunnel Junction Material for High-Speed Toggle Magnetic Random Access Memory, IEEE Transactions on Magnetics, vol. 42, No. 8, Aug. 2006. pp. 1935-1939.

Ju, K. et al., Multibit Cells Schemes for Toggle MRAM Applications, IEEE Transactions on Magnetics, vol. 42, No. 10, Oct. 2006, pp. 2730-2732.

Tehrani, S., Magnetoresistive RAM, Freescale Semiconductor, Jul. 17, 2007, 27 pp.

Boeve, H. et al., Technology assessment for the implementation of magnetoresistive elements with semiconductor components in magnetic random access memory (MRAM) architecture, IEEE Transactions on Magnetics, vol. 35, No. 5, Sep. 1999, pp. 2820-2825.

Schrefl, T. et al., Micromagnetic Simulations and Applications, Vienna University of Technology, 5 pp.

Kasai, S. et al., Current-driven resonant excitation of magnetic vortex, 16 pp.

Pribiag, V.S. et al., Magnetic vortex oscillator driven by dc spin-polarized current, Cornell University, 14 pp.

Acremann, Y. et al., Time Resolved Imaging of Spin Transfer Switching: Beyond the Macro-Spin Concept, PRL 96, 217202 (2006), 4 pp.

Ohldag, H. et al., Interfacial Moments in Co/NiO Origins of Antiferromagnetic/Ferromagnetic Coupling, 1 large page.

Ultrafast Magnetic Switching of Nanoelements with Spin Currents, Spin Injection, 8 pp.

Stohr, J., Probing the Ultrafast Magnetic Nanoworld with X-Rays, Stanford Synchrotron Radiation Laboratory, Stanford University, 43 pp.

Stohr, J., Soft X-Ray Science—From Photon Drought to Free Electron Lasers, Stanford Synchrotron Radiation Laboratory, 30 pp.

Stohr, J., The Magic of Magnetism: From Physical Attraction to Spin Doctors, Stanford Synchrotron Radiation Laboratory, Stanford Linear Accelerator Center, 45 pp.

Urban, R. et al., Gilbert Damping in Single and Multilayer Ultrathin Films: Role of Interfaces in Nonlocal Spin Dynamics, PRB, vol. 87, No. 21, 4 pp.

Fuchs, G.D. et al., Adjustable spin torque in magnetic tunnel junctions with two fixed layers, Appl. Phys. Lett. 86, 152509 (2005), 3 pp.

Petukhov, A.G. et al., 100% spin accumulation in non-half-metallic ferromagnet-semiconductor junctions, J. Phys.: Condens. Matter 19 (2007) 315205, 16 pp.

Bowen, M. et al., Using half-metallic manganite interfaces to reveal insights into spintronics, J. Phys: Condens. Matter 19 (2007) 315208, 27 pp.

Galanakis, I. et al., Spin-polarization and electronic properties of half-metallic Heusler alloys calculated from first principles, J. Phys., Condens. Matter 19 (2007) 315213, 16 pp.

Chen, T.Y. et al., Current-Driven Switching in a Single Exchange-Biased Ferromagnetic Layer, 3 pp.

Isogami, S. et al., Current-Induced Magnetization Switching and CPP-GMR in 30 nm o/ Scale Spin Valves Fabricated Using EB-Assisted CVD Hard Masks, IEEE Transactions on Magnetics, vol. 42, No. 10, Oct. 2006, pp. 2676-2678.

Chen, T.Y. et al., Current-Driven Switching in a Single Exchange-Biased Ferromagnetic Layer, J. Appl. Phys. 97, 10C709 (2005) 3 pp.

Craig, B.R. et al., The effect of roughness on the micromagnetic properties of high moment multilayer films, J. Phys. D: Appl. Phys. 40 (2007), pp. 3991-3997.

Kim, K-S et al., Effect of Nitrogen Incorporation to Oxidation Process on the Reliability of Magnetic Tunnel Junctions, IEEE Transactions on Magnetics, vol. 42, No. 1, Jan. 2006, pp. 2-4.

Yang, T. et al., Estimation of local and nonlocal contributions to the current-induced magnetization switching, Phys. Rev. B 74, 153301 (2006), 4 pp.

MacGillivray, G., Flash Memory Trends & Perspectives, Semiconductor Insights, 24 pp.

Marukame, T. et al., Highly Spin-Polarized Tunneling in Fully Epitaxial Magnetic Tunnel Junctions Using Full-Heusler Alloy Co2Cr0.6Fe0.4Al Thin Film and MgO Tunnel Barrier, IEEE Transactions on Magnetics, vol. 42, No. 10, Oct. 2006, pp. 2652-2654.

Tsunekawa, K. et al., Huge Magnetoresistance and Low Junction Resistance in Magnetic Tunnel Junctions With Crystalline MgO Barrier, IEEE Transactions on Magnetics, vol. 42, No. 2, Feb. 2006, pp. 103-107.

Boslet, M., IBM to reveal chip advance, Nanotechnology Boosts Products' Speed, Efficiency, Mercury News, 3 pp.

Sharma, M. et al., Inversion of Spin Polarization and Tunneling Magnetoresistance in Spin-Dependent Tunneling Junctions, Physical Review Letters, vol. 82, No. 3, Jan. 18, 1999, pp. 616-619.

Guhr, I.L. et al., Magnetization reversal in exchange biased nanocap arrays, J. Phys. D: Appl. Phys. 40 (2007), pp. 3005-3010.

Ohsawa, Y., Magnetoresistance and Current-Driven Resistance Change Measurements in NiFe Film With a Nanoconstriction, IEEE Transactions on Magnetics, vol. 42, No. 10, Oct. 2006, pp. 2615-2617.

Mendes, M.J., Manipulation of Magnetization by Spin Polarized Current in GMR Devices, Rice University, Nanostructures and Nanotechnology I, Fall 2005, 12 pp.

Lee, J. et al., Nano Spin Transistor, 33 pp.

Braganca, P.M. et al., Reducing the critical current for short-pulse spin-transfer switching of nanomagnets, Appl. Phys. Lett. 87, 112507 (2005), 3 pp.

Chen, S-P et al., Spin Accumulation from the Spin Hall Effect Studied Using the Effective Mean-Free-Path Model, IEEE Transactions on Magnetics, vol. 42, No. 10, Oct. 2006, pp. 2667-2669.

Zheng, Y.K. et al., Spin Flop Switching of the Guided Synthetic Antiferromagnet MRAM, IEEE Transactions on Magnetics, vol. 42, No. 10, Oct. 2006, pp. 2742-2744.

Joly, L. et al., Spin Motion of Electrons Upon Reflecting From Ferromagnetic Surfaces, IEEE Transactions on Magnetics, vol. 42, No. 10, Oct. 2006, pp. 2645-2648.

Zhu, X. et al., Spin Torque and Field-Driven Perpendicular MRAM Designs Scalable to Multi-Gb/Chip Capacity, IEEE Transactions on Magnetics, vol. 42, No. 10, Oct. 2006, pp. 2739-2741.

Zutic, I. et al., Spintronics: Fundamentals and applications, Reviews of Modern Physics, vol. 76, Apr. 2004, pp. 323-410.

Jin, W. et al., Spin-Wave Excitations in Nanopillars With Perpendicular Polarizers, IEEE Transactions on Magnetics, vol. 42, No. 10, Oct. 2006, pp. 2682-2684.

Shimomura, N. et al., Switching Current Fluctuation and Repeatability for MRAM With Propeller-Shape MTJ, IEEE Transactions on Magnetics, vol. 42, No. 10, Oct. 2006, pp. 2757-2759.

Apalkov, D. et al., Temperature Dependence of Spin Transfer Switching in Nanosecond Regime, IEEE Transactions on Magnetics, vol. 42, No. 10, Oct. 2006, pp. 2685-2687.

Kumar, S.B. et al., The Effect of Spreading Resistance on the Magnetoresistance of Current-Perpendicular-to-Plane Spin Valves With Patterned Layers, IEEE Transactions on Magnetics, vol. 42, No. 10, Oct. 2006, pp. 3788-3790.

Serpico, C. et al., Thermal Stability in Uniaxial Nanomagnets Driven by Spin-Polarized Currents, IEEE Transactions on Magnetics, vol. 42, No. 10, Oct. 2006, pp. 2679-2681.

Daibou, T. et al., Tunnel Magnetoresistance Effect in CoFeB/MgO/CoxFeSi and Co2MnSi Tunnel Junctions, IEEE Transactions on Magnetics, vol. 42, No. 10, Oct. 2006, pp. 2655-2657.

Stine, B.E. et al., The Physical and Electrical Effects of Metal-Fill Patterning Practices for Oxide Chemical-Mechanical Polishing Processes, IEEE Transactions on Magnetics, vol. 45, No. 3, Mar. 1998, pp. 665-679.

Lee, J.W. et al., A Planarization Model in Chemical Mechanical Polishing of Silicon Oxide Using High Selective CeO2 Slurry, Samsung Electronics, 1 p.

Nguyen, V.H. et al., Hybrid CMP process for copper and ultra low-k materials integration, 2 pp.

Zhang, J. et al., Automated Process Control of Within-Wafer and Wafer-to-Wafer Uniformity in Oxide CMP, CMP-MIC Mar. 2002, 6 pp.

Karuppiah, L. et al., Overview of CMP Process Control Strategies, Applied Materials, TFG Division, Sunnyvale, CA, 10 pp.

Wijekoon, K. et al., Minimization of Metal Loss during Chemical Mechanical Planerization of Copper-Oxide and Copper-Low k Damascene Structures, CMP-MIC Mar. 2002, 4 pp.

Healey, J., Current Technical Trends: Dual Damascene & Low-k Dielectrics, Threshold Systems, 2002, 6 pp.

Lai, J-Y et al., Evolution of Copper-Oxide Damascene Structures in Chemical Mechanical Polishing, J. Electrochem. Soc., 149 (1), 2002, pp. G41-G50.

Chen, L., Breakthrough technology for CMP, Semiconductor Fabtech—24th Ed., pp. 137-141.

Araswat, EE311/Cu Interconnect, Stanford University, 18 pp.

Chang, R.Z. et al., Modeling the electrical effects of metal dishing due to CMP for on-chip interconnect optimization, University of California Postprints, 2004, Paper 52, 9 pp.

Wolf, P.J., Overview of Dual Damascene Cu/Low-k Interconnect, International Sematech, Aug. 14, 2003, 21 pp.

Buehler, M., CMP Challenges for 32nm, Semicon West 2007, Jul. 2007, 21 pp.

Lai, J-Y, Mechanics, Mechanisms, and Modeling of the Chemical Mechanical Polishing Process, MIT, Feb. 2001, 314 pp.

Wallace, R.M., New Devices and Materials for 32nm and Beyond, Semicon West 2007, 15 pp.

Technology backgrounder: High-k gate oxides, IC Knowledge 2002, 3 pp.

Hoover, C., Enabling Materials for Contact Metallization, Advanced Processes for Advanced Devices, Jul. 2007, 16 pp.

Stokbro, K., Nanoelectronics modeling platform, Atomisitx Inc., 12 pp.

Arghavani, R., Technologies to Enable High-k/Metal Gate Implementation, Semicon West 2007, Jul. 17, 2007, 20 pp.

The Microscopic Twelve Point Probe, Capres A/S, 1 p.

Petersen, C.L., The Four-Point Probe, Thesis at the Technical University of Denmark, Feb. 1999, 110 pp.

SPM-CIPTech, APRES A/S, 1 p.

SPC-CIPTech (Ver. 3) Technical Specifications (rev. Jan. 2006), 4 pp.

Karpan, V.M. et al., Graphite and graphene as perfect spin filters, Feb. 1, 2007, 5 pp.

Cherian, J.G., Quantum Electrodynamics in Graphene, Kutztown University of PA, Physics REU 2006, Univ. of Washington, 13 pp.

Parkin, S., Magnetic Race-Track Memory: Current Induced Domain Wall Motion!, IBM Corporation, 2005, 60 pp.

Hajto, J. et al., Quantized Electron Transport in Amorphous-Silicon Memory Structures, Phys. Rev. Lett., vol. 66, No. 14, Apr. 8, 1991, pp. 1918-1921.

Rossel, C. et al., Electrical current distribution across a metal-insulator-metal structure during bistable switching, J. Appl. Phys., vol. 90, No. 6, Sep. 15, 2001, pp. 2892-2898.

Yuasa, S. et al., Characterization of growth and crystallization processes in CoFeB/MgO/CoFeB magnetic tunnel junction structure by reflective high-energy electron diffraction, Appl. Phys. Lett. 87, 242503 (2005), 3 pp.

Hayakawa, J. et al., Dependence of Giant Tunnel Magnetoresistance of Sputtered CoFeB/MgO/CoFeB Magnetic Tunnel Junctions on MgO Barrier Thickness and Annealing Temperature, JJAP, vol. 44, No. 19, 2005, pp. L587-L589.

Lammers, D., MRAM debut cues memory transition, Jul. 10, 2006, 1 p.

Edwards, D.M., et al., Theory of spin current in magnetic nanopillars for zero-field microwave generation, J. Phys.: Condens. Matter 19 (2007) 165210, 8 pp.

Economikos, L. et al., STI Planarization Using Fixed Abrasive Technology, Feb. 2, 2002, 1 p.

Cu Damascene Process, 6 pp.

Parkin, S., The Spin on Electronics!, Jan. 29, 2008, 1 p.

Barnas, J. et al., Current-induced switching in spin-valve structures, phys. stat. sol. (b) 244, No. 7, pp. 2304-2310.

Carpentieri, M. et al., Micromagnetic Investigation of Precession Dynamics in Magnetic Nanopillars, IEEE Transactions on Magnetics, vol. 43, No. 6, Jun. 2007, pp. 2935-2937.

He, J. et al., Switching speed distribution of spin-torque-induced magnetic reversal, J. Appl. Phys. 101, 09A501 (2007), 3 pp.

Persson, J. et al., Phase-locked spin torque oscillators: Impact of device variability and time delay, J. Appl. Phys. 101, 09A503 (2007), 3 pp.

Kim, W.J. et al., Effect of ac on current-induced domain wall motion, J. Appl. Phys. 101, 09A504 (2007), 3 pp.

Serpico, C. et al., Power spectrum of current-induced magnetization dynamics in uniaxial nanomagnets, J. Appl. Phys. 101, 09A507 (2007), 3 pp.

Finocchio, G. et al., Magnetization dynamics in CoFe/AlO/Permalloy and CoFe/MgO/Permalloy magnetic tunnel junctions, J. Appl. Phys. 101, 09A508 (2007), 3 pp.

Zhou, Y. et al., Intrinsic phase shift between a spin torque oscillator and an alternating current, J. Appl. Phys. 101, 09A510 (2007), 3 pp.

Consolo, G. et al., Influence of the Oersted field in the dynamics of spin-transfer microwave oscillators, J. Appl. Phys. 101, 09C108 (2007), 3 pp.

Devolder, T. et al., Spin transfer oscillators emitting microwave in zero applied magnetic field, J. Appl. Phys. 101, 063916 (2007), 5 pp.

Maat, S. et al., Magnetotransport propeties and spin-torque effects in current perpendicular to the plane spin valves with Co-Fe-Al magnetic layers, J. Appl. Phys. 101, 093905 (2007), 6 pp.

Jalil, M.B.A. et al, Layer thickness and angular dependence of spin transfer torque in ferromagnetic trilayers, J. Appl. Phys. 101, 124314 (2007), 4 pp.

Mizushima, K. et al., Analytical expression of output power spectra of spin-transfer nano-oscillators, Journal of Magnetism and Magnetic Materials 316 (2007) c960-c962.

Meier, G. et al., Current-induced domain-wall motion in permalloy semi rings, Journal of Magnetism and Magnetic Materials 316 (2007) c966-c968.

Slonczewski, J.C. et al., Theory of voltage-driven current and torque in magnetic tunnel junctions, Journal of Magnetism and Magnetic Materials 310 (2007) 169-175.

Consolo, G. et al., Spin-torque switching in Py/Cu/Py and Py/Cu/CoPt spin-valve nanopillars, Journal of Magnetism and Magnetic Materials 316 (2007) 492-495.

Houssameddine, D. et al., Spin-torque oscillator using a perpendicular polarizer and a planar free layer, Nature Materials, vol. 6, Jun. 2007, pp. 447-453.

Kent, A., A nanomagnet oscillator, Nature Materials, vol. 6, Jun. 2007, pp. 399-400.

Boulle, O. et al., Shaped angular dependence of the spin-transfer torque and microwave generation without magnetic field, Nature Physics, vol. 3, Jul. 2007, pp. 492-497.

Pribiag, V.S. et al., Magnetic vortex oscillator driven by d.c. spin-polarized current, Nature Physics, vol. 3, Jul. 2007, pp. 498-503.

Vanhaverbeke, A. et al., Simple model of current-induced spin torque in domain walls, Physical Review B 75, 024411 (2007), 5 pp.

Devolder, T. et al., Distribution of the magnetization reversal duration in subnanosecond spin-transfer switching, Physical Review B 75, 064402 (2007), 5 pp.

Pareek, T.P., Spin-orbit-induced torque in a collinear spin valve: A possible route to design fast magnetic memory, Physical Review B 75, 115308 (2007), 6 pp.
Pufall, M.R. et al., Low-field current-hysteretic oscillations in spin-transfer nanocontacts, Physical Review B 75, 140404 (R) (2007), 4 pp.
Berger, L., Relation between damping, current-induced torques, and wall resistance for domain walls in magnetic nanowires, Physical Review B 75, 174401 (2007), 5 pp.
Yang, S. et al., Spin-transfer-torque-driven domain-wall dynamics in Permalloy nanowires, Physical Review B 75, 220403(R) (2007), 4 pp.
Wei, Z. et al., Changing Exchange Bias in Spin Valves with an Electric Current, PRL 98, 116603 (2007), 4 pp.
Hayakawa, J. et al., Effect of high annealing temperature on giant tunnel magnetoresistance ratio of CoFeB/MgO/CoFeB magnetic tunnel junctions, Appl. Phys. Lett. 89, 232510 (2006), 3 pp.
Lee, Y.M. et al., Giant tunnel magnetoresistance and high annealing stability in CoFeB/MgO/CoFeB magnetic tunnel junctions with synthetic pinned layer, Appl. Phys. Lett. 89, 042506 (2006), 3 pp.
Yang, T. et al., Current-induced vortex-vortex switching in a nanopillar comprising two Co nano-rings, Appl. Phys. Lett. 90, 092505 (2007), 3 pp.
Xi, H. et al., Spin waves excited by dc currents injected into single ferromagnetic thin films, Phys. Rev. B 75, 174411 (2007), 8 pp.
Consolo, G. et al., Magnetization dynamics in nanocontact current controlled oscillators, Phys. Rev. B 75, 214428 (2007), 6 pp.
SpinAps Agenda, Abstracts, Mar. 17-19, 2006.
Lee, Y.M. et al. Giant tunnel magnetoresistance and high annealing stability in CoFeB/MgO/CoFeB magntic tunnel junctions with synthetic pinned layer, Appl. Phys. Lett. 89, 042506 (2006), 3 pp.
FEI Company Product Data, VectraVision System, FIB System for Advanced Circuit Editing, 2003, 4 pp.
FEI Company, Tools for Nanotech, CoppeRx II for Mixed-Field FIB Deprocessing, 2006, 1 p.
MoberlyChan, W.J. et al., Fundamentals of Focused Ion Beam Nanostructural Processing: Below, At, and Above the Surface, MRS Bulletin, vol. 32, May 2007, pp. 414-432.
Abstracts, 52nd Magnetism and Magnetic Materials Conference, Nov. 2007, 143 pp.
Zhu, J., Microwave-assisted magnetic recording, International Storage Technology Symposium, Jun. 18-21, 2007, 35 pp.
Kryder, M.H., Perspective on Future Storage Technologies, International Storage Technology Symposium, Jun. 18-21, 2007, 35 pp.
Wood, R. et al., From Rotating- to Solid-State- to 3D-Storage?, Brainstorming the Future, International Storage Technology Symposium, Jun. 18-21, 2007, 6 pp.
Rosen, H., Nano-Bio-Magnetic Horizons, International Storage Technology Symposium, Jun. 18-21, 2007, 14 pp.
Komineas, S., Propagating Coherent Structures in Nanowires, International Storage Technology Symposium, Jun. 18-21, 2007, 12 pp.
Knight, G., Probe-Based Storage: Mechanical Access on a Nano-Scale, International Storage Technology Symposium, Jun. 18-21, 2007, 16 pp.
Knight, G., Semiconductor/Flash Memory Overview, International Storage Technology Symposium, Jun. 18-21, 2007, 19 pp.
Theodonis, I., Spin Transfer Torque (STT) in Magnetic Tunnel Junctions, International Storage Technology Symposium, Jun. 18-21, 2007, 21 pp.
Rohrmann, H., Multilayer and Granular Films on Nanospheres, International Storage Technology Symposium, Jun. 18-21, 2007, 41 pp.
Pearton, S.J. et al., Dry Etching of MRAM Structures, Mat. Res. Soc. Symp. Proc., vol. 614, 2000, 11 pp.
Yung, R.B. et al., Control of Chlorine Inductively Coupled Plasma Using Optical-Emission Spectroscopy, J. Elec. Mat., vol. 31, No. 10, 2002, pp. 994-998.
Ditizio, R. et al., Memory: MRAM Design, Cell Shape and Patterning Considerations for Magnetic Random Access Memory (MRAM) Fabrication, Semiconductor Manufacturing Magazine, pp. 90-96.
Wong, D.F. et al., Magnetic mesa structures fabricated by reactive ion etching with CO/NH3/Xe plasma chemistry for an all-silicon quantum computer, Nanotechnology 16 (2005), pp. 990-994.
Lee, J.W. et al., High-density plasma etching of CoFeSiB magnetic films with hard mask, Journal of Magnetism and Magnetic Materials 304 (2006), pp. c282-c284.
Mukai, T. et al., High-Performance and Damage-Free Magnetic Film Etching using Pulse-Time-Modulated Cl2 Plasma, Jpn. J. Appl. Phys., vol. 45, No. 6B (2006), pp. 5542-5544.
Park, I.H. et al., Nanometer-sized etching of magnetic tunnel junction stack for magnetic random access memory, Journal of Magnetism and Magnetic Materials 304 (2006), pp. c264-c266.
Ruzic, D., Highlights in Plasma Science from around the world, Plasma Material Interaction Group, Univ. of Illinois, Sep. 2006, 55 pp.
Shin, B. et al., Etch Characteristics of CoFeSiB Magnetic Films Using Inductively Coupled Plasma Reactive Ion Etching for Magnetic Random Access Memory, Integrated Ferroelectrics 78, 2006. pp. 223-243.
Takahashi, S. et al., Ion-Beam-Etched Profile Control of MTJ Cells for Improving the Switching Characteristics of High-Density MRAM, IEEE Transactions on Magnetics, vol. 42, No. 10, Oct. 2006, pp. 2745-2747.
Plasma Lab C.Y.C.U., 26 pp.
Etching, Feb. 20, 2005, 110 pp.
ISSCC-2007: Hitachi/Tohuku Univ; Paper D26-5, 12 pp.
Reactive Ion Etching of Magnetic Materials, ISSCC-2007: Hitachi/Tohuku Univ; Paper D26-5, 12 pp.
Rack, P.D., Plasma Etching Outline, Univ. of Tennessee, 34 pp.
An Introduction of Etch Process, Hynix, 69 pp.
Ricci, A., Dry Etch Process Application Note, Pall Microelectronics ABG-106-0405, 6 pp.
Volkert, C.A. et al., Focused Ion Beam Microscopy and Micromachining, MRS Bulletin, vol. 32, May 2007, pp. 389-400.
Mayer, J. et al., TEM Sample Preparation and FIB-Induced Damage, MRS Bulletin, vol. 32, May 2007, pp. 400-407.
Jung, K.B. et al., Electron Cyclotron Resonance Plasma Etching of Materials for Magneto-Resistive Random Access Memory, J. Elec. Mater., vol. 26, No. 11, 1997, pp. 1310-1313.
Balke, B. et al., Mn3Ga, a compensated ferrimagnet with high Curie temperature and low magnetic moment for spin torque transfer applications, Appl. Phys. Lett. 90, 152504 (2007), 3 pp.
Demidov, V.E. et al., Effect of spin-polarized electric current on spin-wave radiation by spin-valve nanocontacts, Appl. Phys. Lett. 90, 172508 (2007), 3 pp.
Laribi, S. et al., Reversible and irreversible current induced domain wall motion in CoFeB based spin valves stripes, Appl. Phys. Lett. 90, 232505 (2007), 3 pp.
V600FIB System, The Most Efficient, Flexible and Cost-effective Device Modification Tool Available for Today's Semiconductor Lab, FEI Company Product Data 2006, 4 pp.
Seo, S-M. et al., Effect of shape anisotropy on threshold current density for current-induced domain wall motion, Appl. Phys. Lett. 90, 252508 (2007), 3 pp.
CMP Technology, 14 pp.
Zhang, S., Current research in current-driven magnetization dynamics, University of Missour-Columbia, Feb. 14, 2006, 48 pp.
Mahorowala, A. et al., Etching of polysilicon in an Inductively Coupled Cl2 and HBr Discharges: III. Photoresist Mask Faceting, Sidewall Deposition, and Microtrenching, Mass. Inst. of Technology, 19 pp.
Consolo, G. et al., Influence of Different Spatial Distributions of Current Density and Spin-Torque Efficiency in the Dynamics of Point-Contact Devices, IEEE Transactions on Magnetics, vol. 43, No. 6, Jun. 2007, 2827-2829.
Guo, J. et al., Effect of Gilbert Damping Term on the Current Induced Magnetization Switching of Ring-Shaped Spin Valve Structures, IEEE Transactions on Magnetics, vol. 43, No. 6, Jun. 2007, 2923-2925.
Lee, J.M. et al., Spin Transfer Magnetization Switching Read/Write Cycle Test in MgO-Based Magntic Tunnel Junctions, IEEE Transactions on Magnetics, vol. 43, No. 7, Jul. 2007, 3349-3353.
Zhu, X. et al., Effect of Damping Constant on Magnetic Switching in Spin Torque Driven Perpendicular MRAM, IEEE Transactions on Magnetics, vol. 43, No. 6, Jun. 2007, 2349-2351.

Myers, E.B. et al., Interplay of Spin-Transfer Torques and Thermal Activation in Nanomagnet Reversal, Cornell University, 14 pp.

Lithography, Lecture 15 (Alignment and Exposure), Semiconductor Manufacturing Technology, Chapters 13-15, 71 pp.

delMoral, A., Magnetostriction: fundamental principles and novel magneto-strictive materials, Europhysics News (2003) vol. 34, No. 6., 9 pp.

Xu, Y. et al., in Situ ordering of FePt thin films with face-centered-tetragonal (001) texture on Cr100-xRux underlayer at low substrate temperature, App. Phys. Lett., vol. 80, No. 18, May 6, 2002, pp. 3325-3327.

Grollier, J. et al., Spin-polarized current induced switching in Co/Cu/Co pillars, App. Phys. Lett., vol. 78, No. 23, Jun. 4, 2001, pp. 3663-3665.

Sun, C.J. et al., Epitaxial Lbo FePt magnetic thin films sputtered on Cu (001), App. Phys. Lett., vol. 82, No. 12, Mar. 24, 2003, pp. 1902-1904.

Yagami, K. et al., Low-current spin-transfer switching and its thermal durability in a low-saturation-magnetization nanomagnet, App. Phys. Lett., vol. 85, No. 23, Dec. 6, 2004, pp. 5634-5636.

Wang, J-P et al., Composite media (dynamic tilted media) for magnetic recording, App. Phys. Lett. 86 (2005), 3 pp.

Seki, T. et al., Spin-polarized current-induced magnetization reversal in perpendicularly magnetized L1o-FePt layers, App. Phys. Lett. 88 (2006), 3 pp.

Gu, J. et al., Distributed Active Decoupling Capacitors for On-Chip Supply Noise Cancellation in Digital VLSI Circuits, IEEE 2660 Symp. on VLSI Circuits Digest of Tech. Papers, 2 pp.

Durlam, M. et al., A 1-Mbit MRAM Based on 1T1MTJ Bit Cell Integrated With Copper Interconnects, IEEE J. of Solid-State Circuits, vol. 38, No. 5, May 2003, pp. 769-773.

Kim, C.H. et al., PVT-Aware Leakage Reduction for On-Die Caches With Improved Read Stability, IEEE J. of Solid-State Circuits, vol. 41, No. 1, Jan. 2006, pp. 170-178.

Kim, T-H et al., A 0.2 V, 480 kb Subthreshold SRAM With 1 k Cells Per Bitline for Ultra-Low-Voltage Computing, IEEE J. of Solid-State Circuits, vol. 43, No. 2, Feb. 2008, pp. 518-529.

Kim, T-H et al., Silicon Odometer: An On-Chip Reliability Monitor for Measuring Frequency Degradation of Digital Circuits, IEEE J. of Solid-State Circuits, vol. 43, No. 4, Apr. 2008, pp. 874-880.

Tehrani, S. et al., Progress and Outlook for MRAM Technology, IEEE Transactions on Magnetics, vol. 35, No. 5, Sep. 1999, pp. 2814-2819.

Victora, R.H. et al., Composite Media for Perpendicular Magnetic Recording, IEEE Transactions on Magnetics, vol. 41, No. 2, Feb. 2005, pp. 537-542.

Kim, T-H et al., A High-Density Subthreshold SRAM with Data-Independent Bitline Leakage and Virtual Ground Replica Scheme, 2007 IEEE International Solid-State Circuits Conference, 3 pp.

Kil, J. et al., A High-Speed Variation-Tolerant Interconnect Technique for Sub-Threshold Circuits Using Capacitive Boosting, ISLPED '06, Oct. 4-6, 2006, pp. 67-72.

Keane, J. et al., An On-Chip NBTI Sensor for Measuring PMOS Threshold Voltage Degradation, ISLPED '07, Aug. 27-29, 2007, pp. 189-194.

Kim, C.H. et al., PVT-Aware Leakage Reduction for On-Die Caches with Improved Read Stability, 2005 IEEE International Solid-State Circuits Conference, 3 pp.

Sousa, R.C. et al., Tunneling hot spots and heating in magnetic tunnel junctions, J. Appl. Phys., vol. 95, No. 11, Jun. 1, 2004, pp. 6783-6785.

Shen, W.K. et al., In situ epitaxial growth of ordered FePt (001) films with ultra small and uniform grain size using a RuAl underlayer, J. Appl. Phys. 97 (2005), 3 pp.

Zhu, J-G, Pinholes and spin transfer effect in magnetic tunnel junction heads, J. Appl. Phys. 97 (2005), 3 pp.

Parkin, S.S.P. et al., Giant tunnelling magnetoresistance at room temperature with MgO (100) tunnel barriers, Nature Materials, vol. 3, Dec. 2004, pp. 862-867.

Yuasa, S. et al., Giant room-temperature magnetoresistance in single-crystal Fe/MgO/Fe magnetic tunnel junctions, Nature Materials, vol. 3, Dec. 2004, pp. 868-871.

Kaka, S. et al., Mutual phase-locking of microwave spin torque nano-oscillators, Nature Letters, vol. 437, Sep. 15, 2005, pp. 389-392.

Mancoff, F.B. et al., Phase-locking in double-point-contact spin-transfer devices, Nature Letters, vol. 437, Sep. 15, 2005, pp. 393-395.

Tsoi, M. et al., Excitation of a Magnetic Multilayer by an Electric Current, PRL, vol. 80, No. 19, May 11, 1998, pp. 4281-4284.

Jiang, Y. et al., Effective Reduction of Critical Current for Current-Induced Magnetization Switching by a Ru Layer Insertion in an Exchange-Biased Spin Valve, PRL, vol. 92, No. 16, Apr. 23, 2004, 4 pp.

Rippard, W.H. et al., Injection Locking and Phase Control of Spin Transfer Nano-oscillators, PRL 95, Aug. 2005, 4 pp.

Gu, J. J et al., A Switched Decoupling Capacitor Circuit for On-Chip Supply Resonance Damping, 2007 Symp. on VLSI Circuits Digest of Technical Papers, pp. 126-127.

Kim, T-H et al., Silicon Odometer: An On-Chip Reliability Monitor for Measuring Frequency Degradation of Digital Circuits, 2007 Symp. on VLSI Circuits Digest of Technical Papers, pp. 122-123.

Kim, C H et al., A Process Variation Compensating Technique for Sub-90nm Dynamic Circuits, 2003 Symp. on VLSI Circuits Digest of Technical Papers, pp. 205-207.

Kim, C.H. et al., An On-Die CMOS Leakage Current Sensor for Measuring Process Variation in Sub-90nm Generations, 2005 IEEE International Conference on Integrated Circuit and Technology, 2 pp.

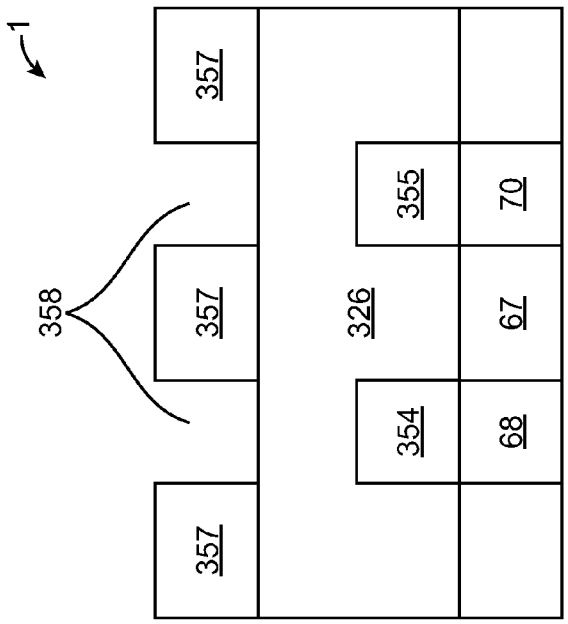
FIG. 2e
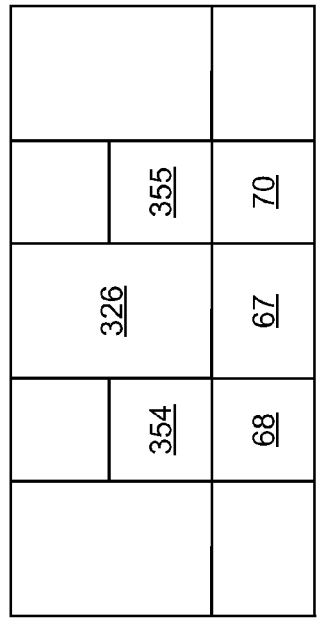
FIG. 2f
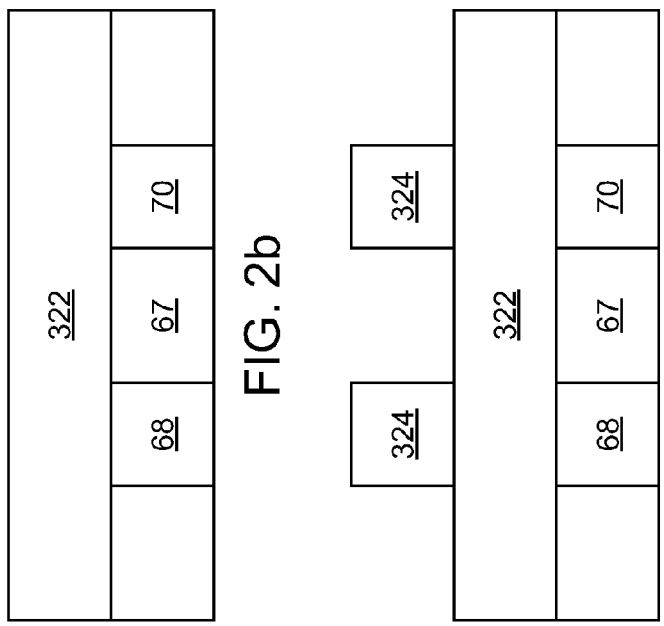
FIG. 2b
FIG. 2c
FIG. 2d
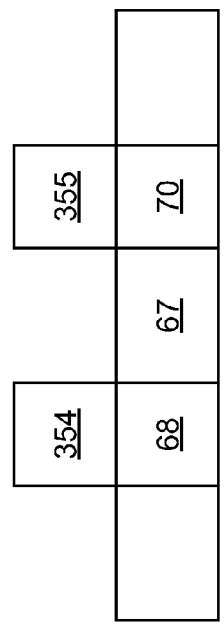

METHOD FOR MANUFACTURING NON-VOLATILE MAGNETIC MEMORY

CROSS REFERENCE TO RELATED APPLICATIONS

This application is a continuation-in-part of U.S. application Ser. No. 11/674,124 filed on Feb. 12, 2007, entitled "Non-Uniform Switching Based Non-Volatile Magnetic Based Memory," which claims priority to U.S. Provisional Application No. 60/853,115 filed on Oct. 20, 2006 entitled "Non-Uniform Switching Based Non-Volatile Magnetic Based Memory"; and is a further continuation-in-part of U.S. application Ser. No. 11/678,515 filed Feb. 23, 2007, entitled "A High Capabity Low Cost Multi-State Magnetic Memory," which claims priority to U.S. Provisional Application No. 60/777,012 filed Feb. 25, 2006 entitled "A High Capacity Low Cost Multi-State Magnetic Memory"; and is a further continuation-in-part of U.S. application Ser. No. 11/739,648, filed Apr. 24, 2007 entitled "Non-Volatile Magnetic Memory with Low Switching Current and High Thermal Stability"; and is a further continuation-in-part of U.S. application Ser. No. 11/776,692, filed Jul. 12, 2007, titled "Non-Volatile Magnetic Memory Element with Graded Layer"; and is a further continuation-in-part of U.S. application Ser. No. 11/860,467 filed Sep. 24, 2007, titled "Low cost multi-state magnetic memory"; and is a further continuation-in-part of U.S. application Ser. No. 11/866,830 filed Oct. 3, 2007 entitled "Improved High Capacity Low Cost Multi-State Magnetic Memory"; and is a further continuation-in-part of U.S. Application No. Not Yet Assigned filed concurrently herewith entitled "An Improved Low Resistance High-TMR Magnetic Tunnel Junction and Process for Fabrication Thereof."

BACKGROUND OF THE INVENTION

1. Field of the Invention

The present invention relates generally to magnetic memory and particularly to methods of manufacturing magnetic memory.

2. Description of the Prior Art

Computers conventionally use rotating magnetic media, such as hard disk drives (HDDs), for data storage. Though widely used and commonly accepted, such media suffer from a variety of deficiencies, such as access latency, higher power dissipation, large physical size and inability to withstand any physical shock. Thus, there is a need for a new type of storage device devoid of such drawbacks.

Other dominant storage devices are dynamic random access memory (DRAM) and static RAM (SRAM) which are volatile and very costly but have fast random read/write access time. Solid state storage, such as solid-state-nonvolatile-memory (SSNVM) devices having memory structures made of NOR/NAND-based Flash memory, providing fast access time, increased input/output (IOP) speed, decreased power dissipation and physical size and increased reliability but at a higher cost which tends to be generally multiple times higher than hard disk drives (HDDs).

Although NAND-based flash memory is more costly than HDD's, it has replaced magnetic hard drives in many applications such as digital cameras, MP3-players, cell phones, and hand held multimedia devices due, at least in part, to its characteristic of being able to retain data even when power is disconnected. However, as memory dimension requirements are dictating decreased sizes, scalability is becoming an issue because the designs of NAND-based Flash memory and DRAM memory are becoming difficult to scale with smaller dimensions. For example, NAND-based flash memory has issues related to capacitive coupling, few electrons/bit, poor error-rate performance and reduced reliability due to decreased read-write endurance. Read-write endurance refers to the number of reading, writing and erase cycles before the memory starts to degrade in performance due primarily to the high voltages required in the program, erase cycles.

It is believed that NAND flash, especially multi-bit designs thereof, would be extremely difficult to scale below 45 nanometers. Likewise, DRAM has issues related to scaling of the trench capacitors leading to very complex designs which are becoming increasingly difficult to manufacture, leading to higher cost.

Currently, applications commonly employ combinations of EEPROM/NOR, NAND, HDD, and DRAM as a part of the memory in a system design. Design of different memory technology in a product adds to design complexity, time to market and increased costs. For example, in hand-held multimedia applications incorporating various memory technologies, such as NAND Flash, DRAM and EEPROM/NOR flash memory, complexity of design is increased as are manufacturing costs and time to market. Another disadvantage is the increase in size of a device that incorporates all of these types of memories therein.

There has been an extensive effort in development of alternative technologies such as Ovanic RAM (or phase-change memory), Ferroelectric RAM (FeRAM), Magnetic RAM (MRAM), Nanochip, and others to replace memories used in current designs such as DRAM, SRAM, EEPROM/NOR flash, NAND flash and HDD in one form or another. Although these various memory/storage technologies have created many challenges, there have been advances made in this field in recent years. MRAM seems to lead the way in terms of its progress in the past few years to replace all types of memories in the system as a universal memory solution.

One of the problems with prior art methods of producing MRAM is that prior art methods are very costly. This high cost is driven by the fact that prior art methods have a low memory-element-per-wafer yield, are unreliable, and are not modular.

In MRAM production, as with many other type of memory production, there is a fixed cost per-wafer. As a result, the more MRAM memory cells that can be manufactured on a single wafer, the lower the cost per memory cell. Prior art methods have an undesirably low memory-element-per-wafer yield making each memory cell correspondingly more costly.

A further problem with prior art methods is that the methods of production are unreliable. Unreliable methods lead to the frequent fabrication of non-functioning memory cells. Each non-functioning unit increases the per-unit cost of the remaining, functioning units.

Also, the non-modular nature of prior art methods exacerbates the cost and reliability problems. The nature of complementary metal-oxide-semiconductor (CMOS) production, used in many types of RAM production, generally precludes the use of many materials present in MRAM production inside CMOS facilities. Thus, with prior art methods, a facility must be wholly converted to MRAM production further increasing the costs. Additionally, contamination results from an MRAM and CMOS combined processes.

These problems reduce MRAM's competitive edge relative to DRAM, SRAM, EEPROM/NOR flash, NAND flash, and HDD storage solutions.

Thus, the need arises for a method of manufacturing a low cost (high volume), high-yield, high-reliability magnetic memory.

SUMMARY OF THE INVENTION

Briefly, in accordance with a method of the present invention, a method of manufacturing a magnetic random access memory (MRAM) cell and a corresponding structure thereof are disclosed to include a multi-stage manufacturing process. The multi-stage manufacturing process includes performing a front end on-line (FEOL) stage to manufacture logic and non-magnetic portions of the memory cell by forming an intermediate interlayer dielectric (ILD) layer, forming intermediate metal pillars embedded in the intermediate ILD layer, depositing a conductive metal cap on top of the intermediate ILD layer and the metal pillars, performing magnetic fabrication stage to make a magnetic material portion of the memory cell being manufactured, and performing back end on-line (BEOL) stage to make metal and contacts of the memory cell being manufactured.

These and other objects and advantages of the present invention will no doubt become apparent to those skilled in the art after having read the following detailed description of the preferred embodiments illustrated in the several figures of the drawing.

IN THE DRAWINGS

FIG. 1 shows a flow chart of the relevant steps performed for manufacturing non-volatile magnetic memory cells (for example, magnetic random access memory (MRAM)), in accordance with a method of the present invention.

FIG. 2 presents a cross section of a memory cell 1, in accordance with the techniques of FIG. 1.

FIG. 2a presents a cross section of a memory cell 1, in accordance with the techniques of FIG. 1.

FIG. 3 shows the structure of a number of memory cells after the CMOS step 10 has been completed, the source, gate and drain are shown to be formed substantially parallel to one another.

FIG. 4 shows the structure of a number of memory cells after the step 12. The memory cell is shown to include the drain, source, and gate, ILD layer and metal contact pillar.

FIG. 5 shows the structure of a number of memory cells after step 14. The memory cell is shown to include the drain, source, and gate, ILD layer, metal contact pillar, and ILD layer.

FIG. 6 shows the structure of a number of memory cells after the step 16. The memory cell is shown to include the drain, source, and gate ILD layer, metal contact pillar, and a post-etch ILD layer with pillar holes.

Figure 7:
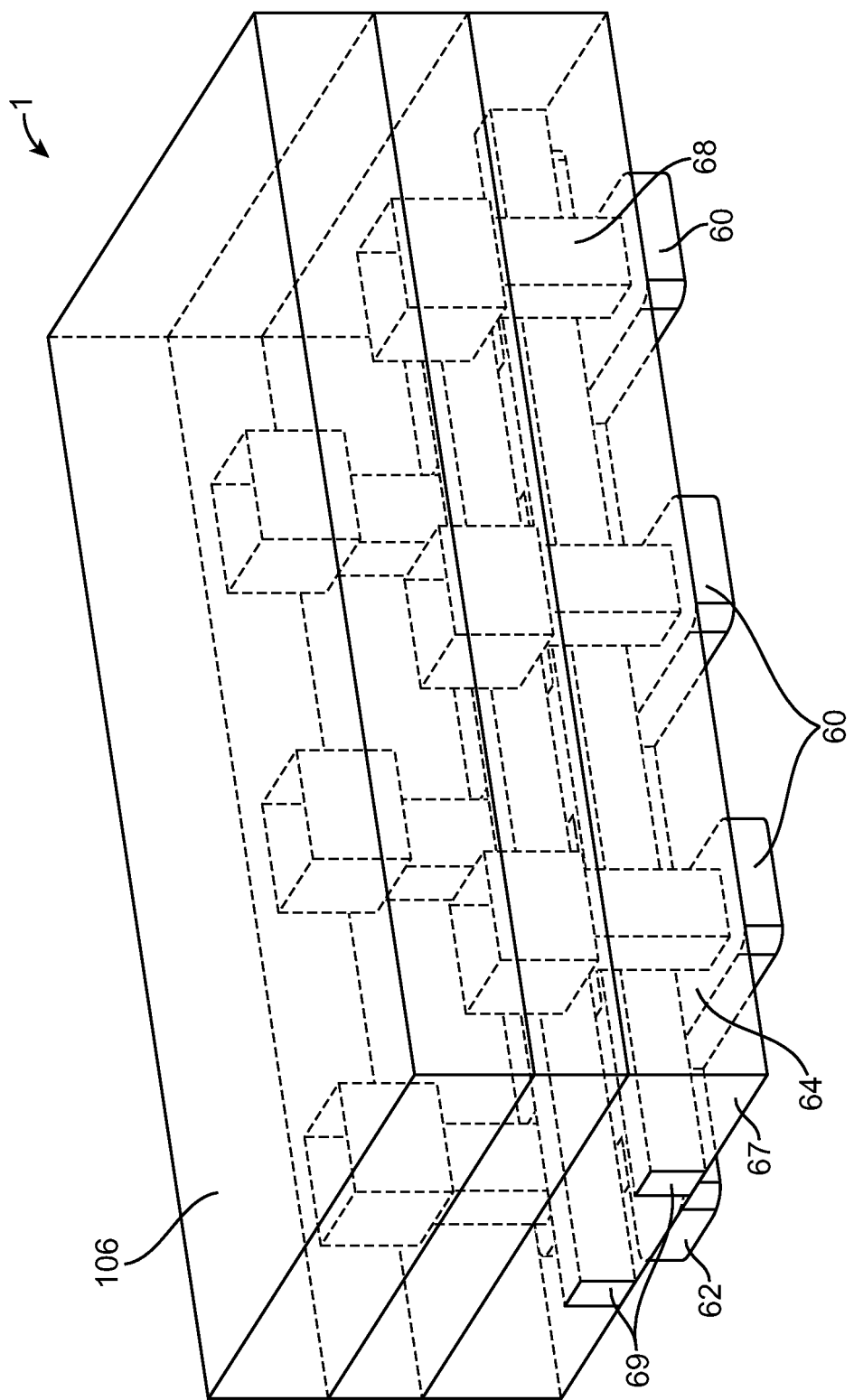
Figure 8:
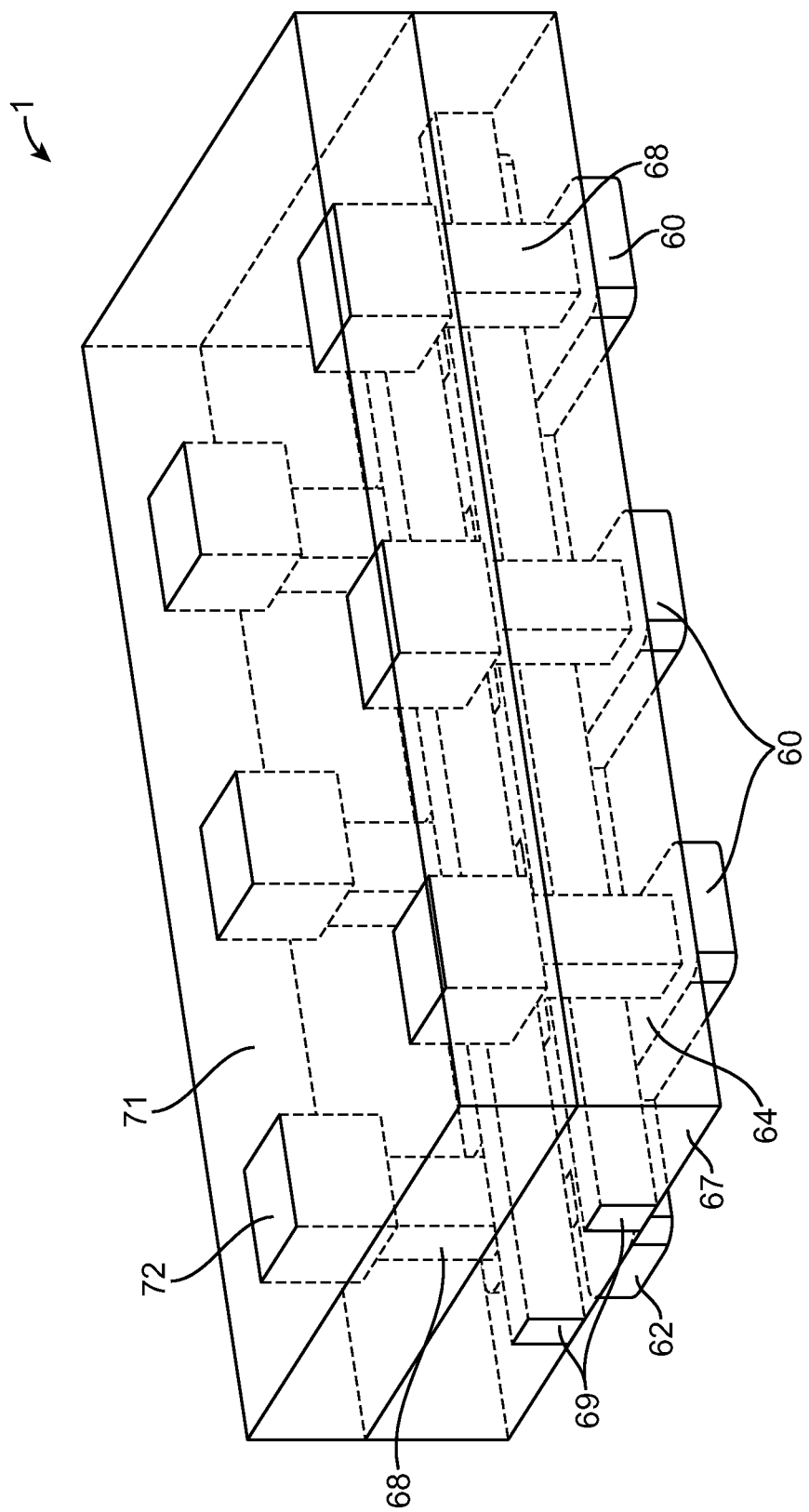

FIG. 7 shows the structure of a number of memory cells after the step 18. The memory cell is shown to include the drain, source, and gate, ILD layer, metal contact pillar, post-etch ILD layer with pillar holes, and metal material FIG. 8 shows the structure of a number of memory cells after the step 20. The memory cell is shown to include the drain, source, and gate, ILD layer, metal contact pillar, ILD layer, and metal pillar.

Figure 9:
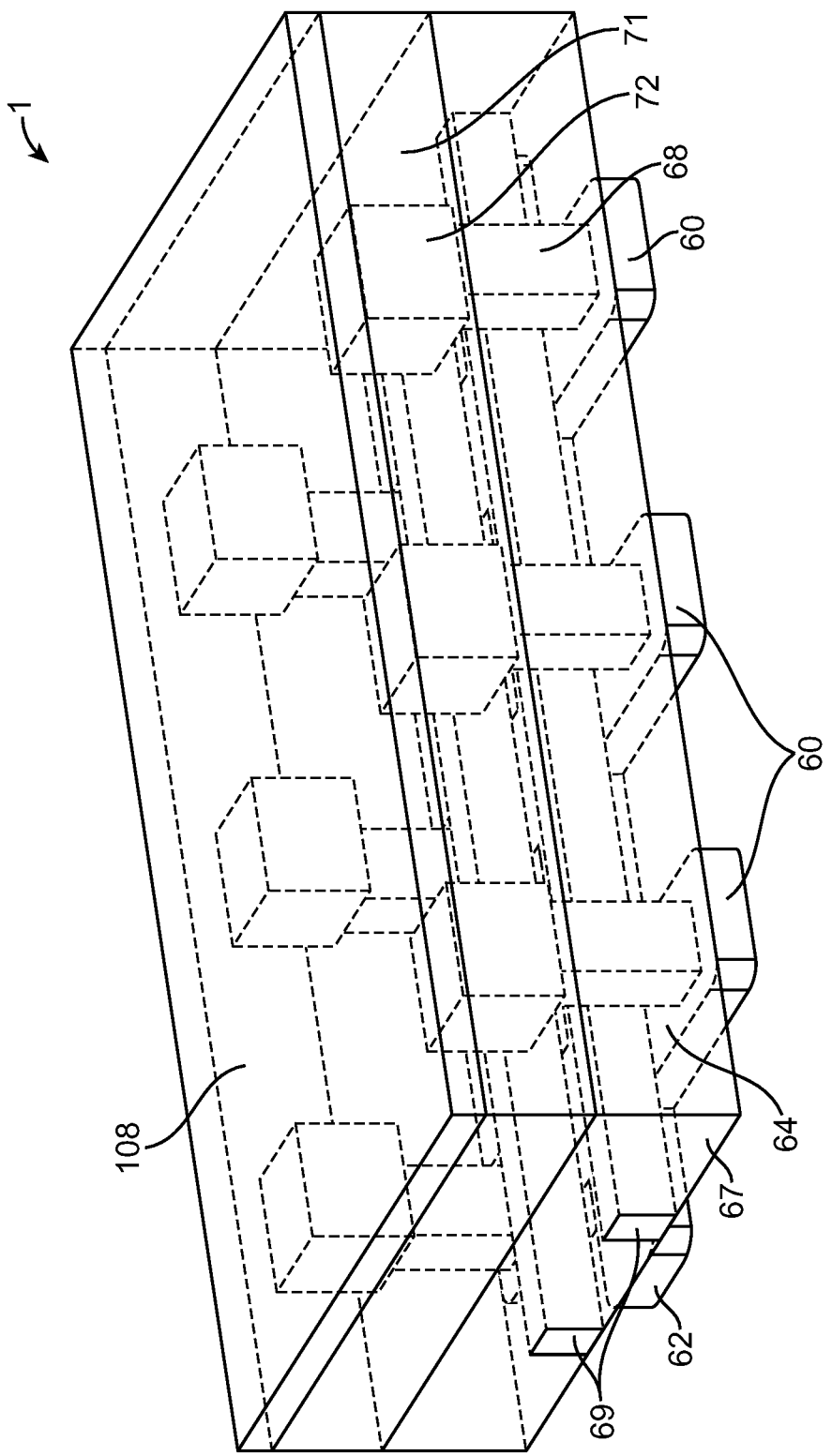

FIG. 9 shows the structure of a number of memory cells after the step 22. The memory cell is shown to include the drain, source, and gate, ILD layer, metal contact pillar, ILD layer, metal pillar, and conductive metal cap.

Figure 10:
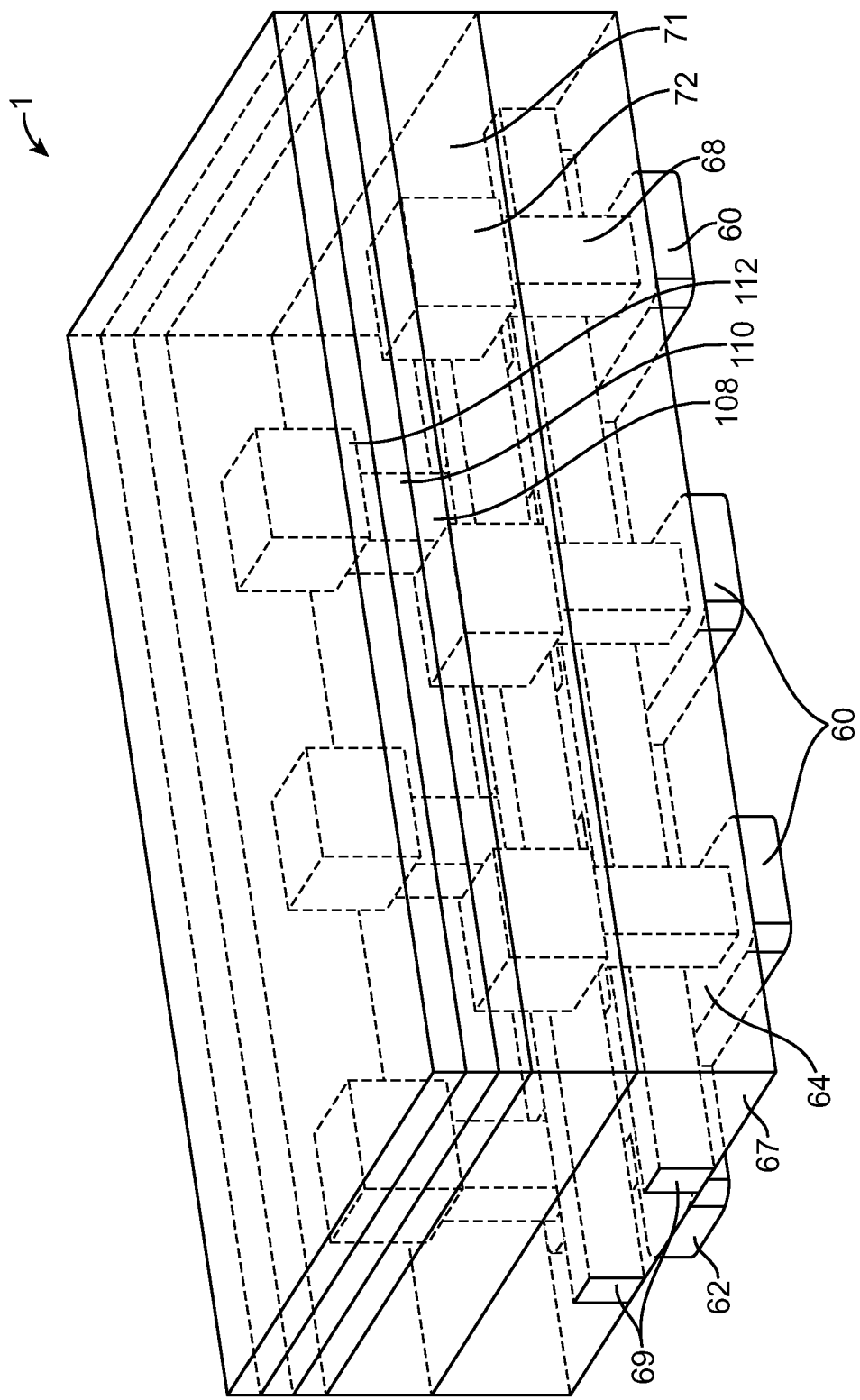

FIG. 10 shows the structure of six memory cells after the step 24. The memory cell is shown to include the drain, source, and gate, ILD layer, metal contact pillar, ILD layer, metal pillar, conductive metal cap, MTJ film, and conductive metal cap/hard mask.

Figure 11:
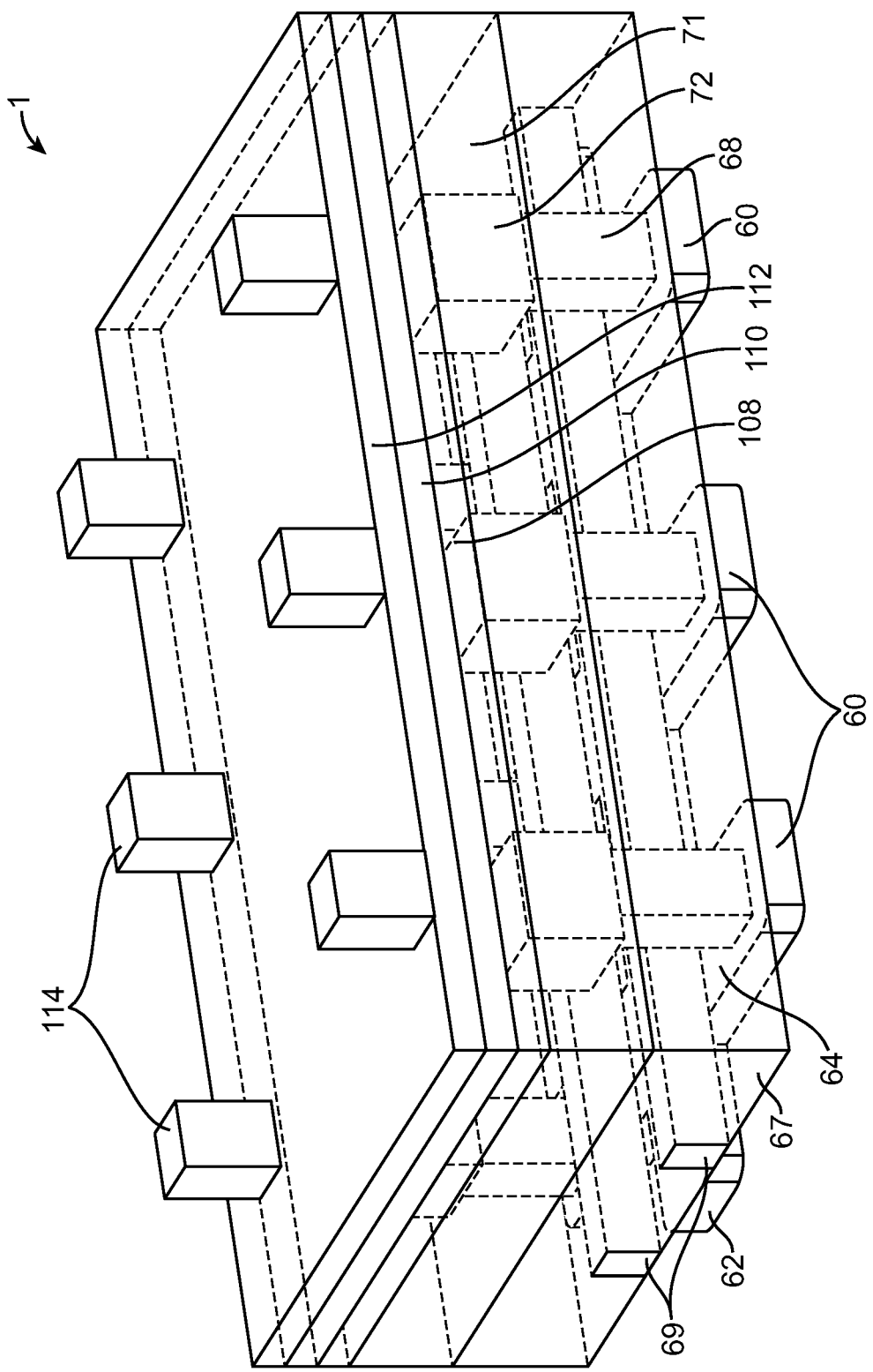

FIG. 11 shows the structure of a number of memory cells after the step 26. The memory cell is shown to include the drain, source, and gate, ILD layer, metal contact pillar, ILD layer, metal pillar, conductive metal cap, MTJ film, conductive metal cap/hard mask and photo-resist pillars.

Figure 12:
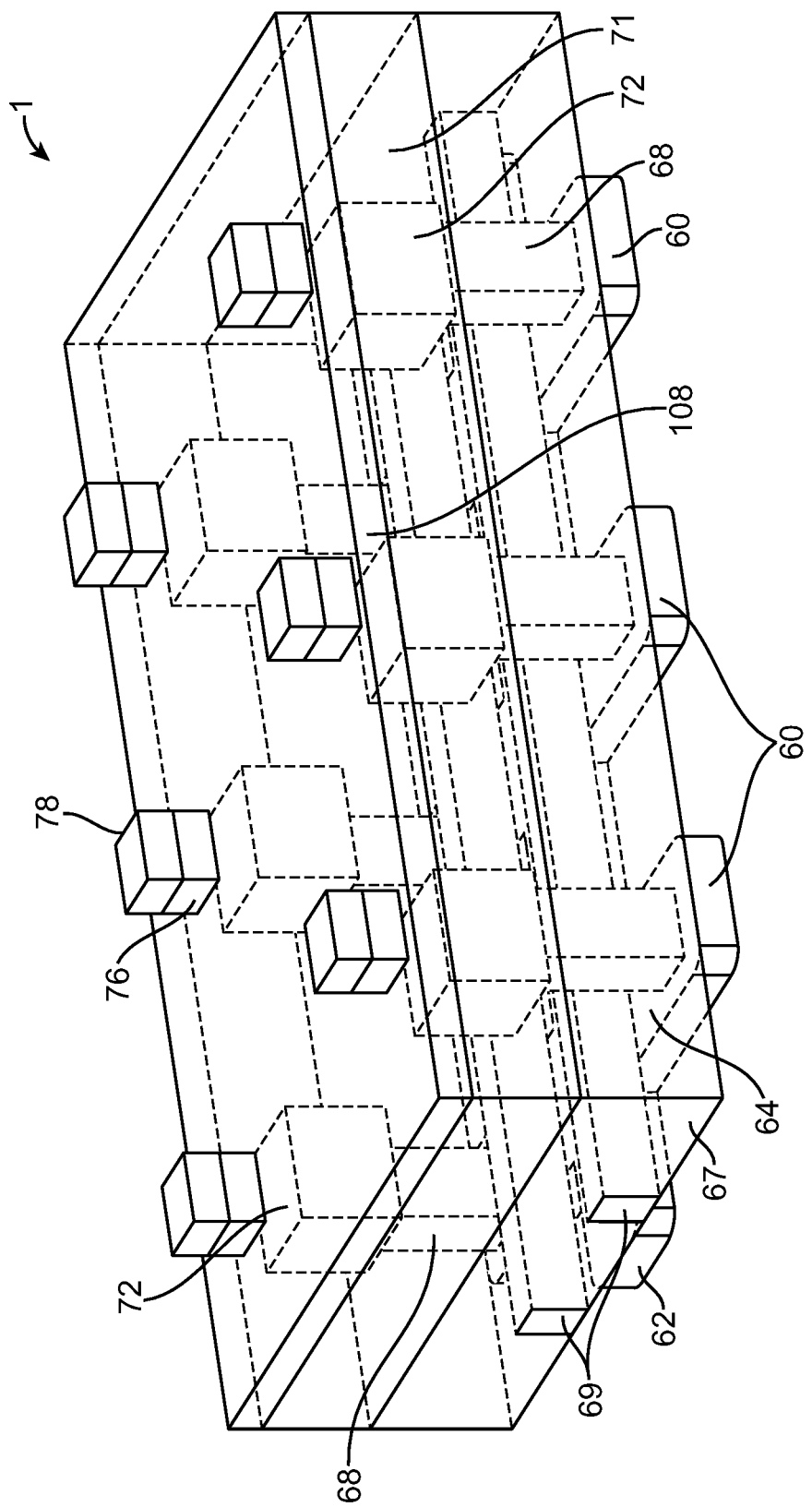

FIG. 12 shows the structure of six memory cells after the step 28. The memory cell is shown to include drain, source, and gate, ILD layer, metal contact pillar, ILD layer, metal pillar, conductive metal cap, MTJ, and conductive metal cap/hard mask.

Figure 13:
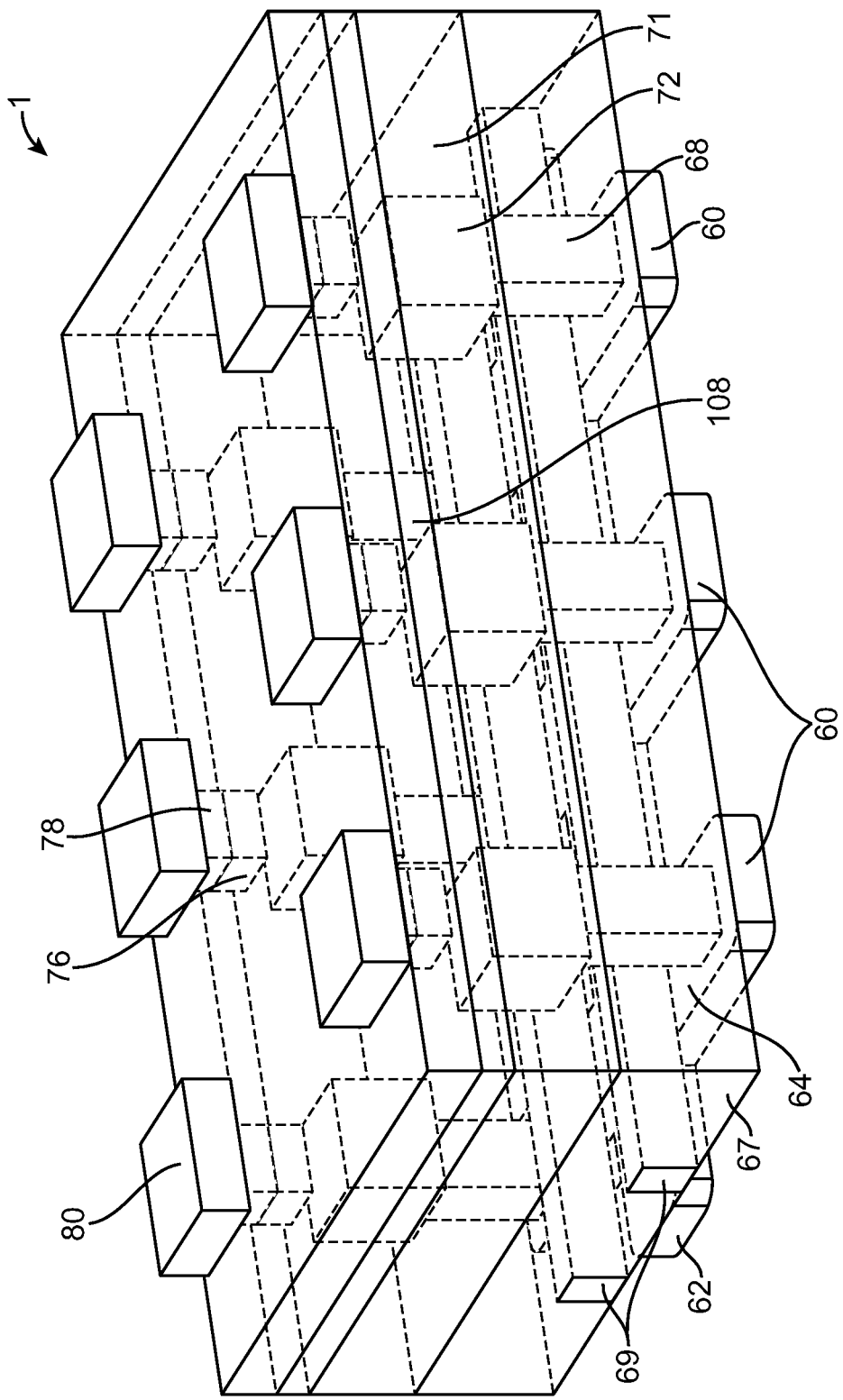

FIG. 13 shows the structure of a number of memory cells after the step 30. The memory cell is shown to include the drain, source, and gate, ILD layer, metal contact pillar, ILD layer, metal pillar, conductive metal cap, MTJ, conductive metal cap/hard mask, and passivation layer.

Figure 14:
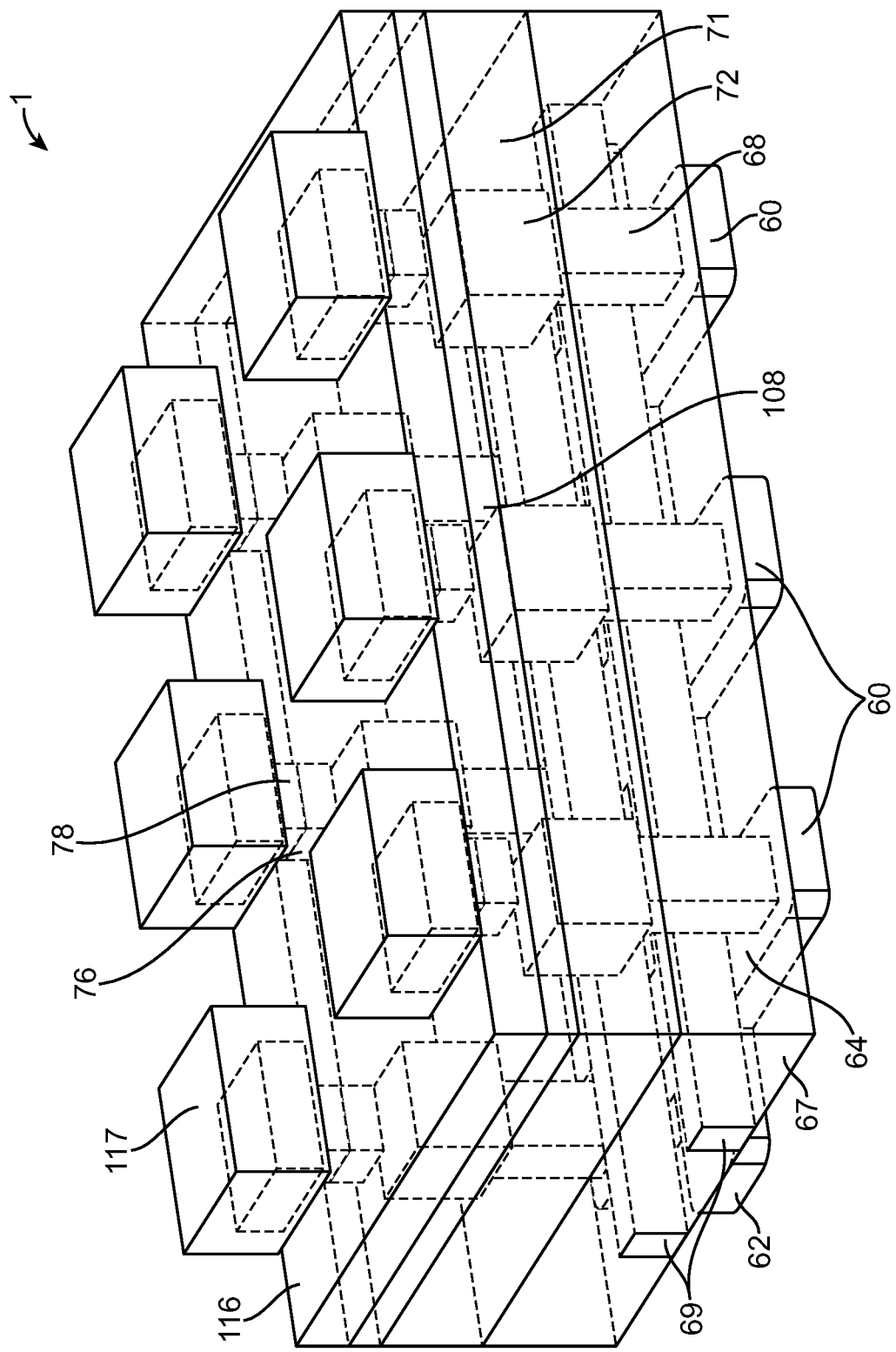

FIG. 14 shows the structure of a number of memory cells after the step 32. The memory cell is shown to include the drain, source, and gate, ILD layer, metal contact pillar, ILD layer, metal pillar, conductive metal cap, MTJ, conductive metal cap/hard mask, passivation layer, and photo resist pillars.

Figure 15:
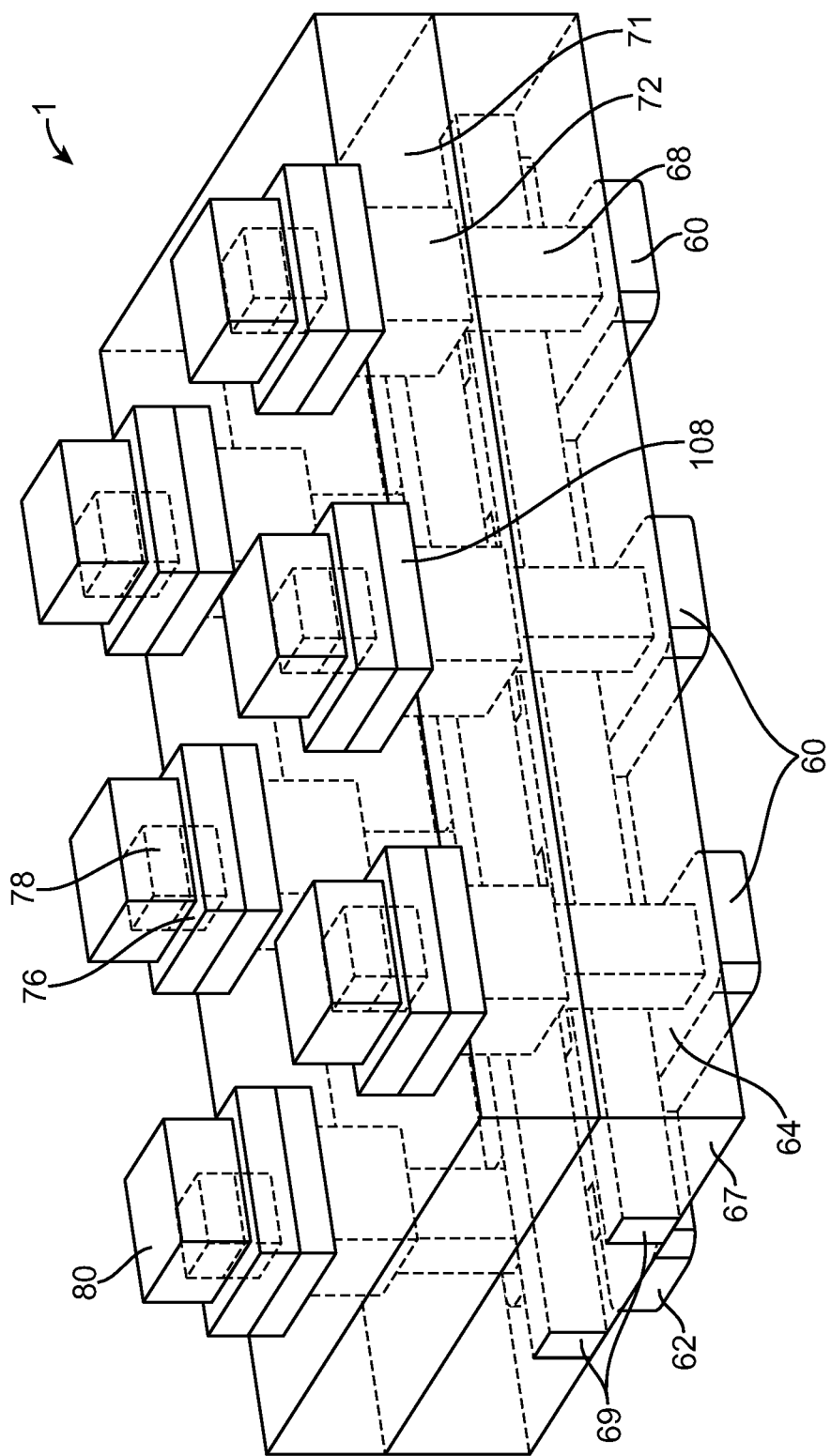

FIG. 15 shows the structure of a number of memory cells after the step 34. The memory cell is shown to include the drain, source, and gate, ILD layer, metal contact pillar, ILD layer, metal pillar, conductive metal cap, MTJ, conductive metal cap/hard mask, and passivation cap.

Figure 16:
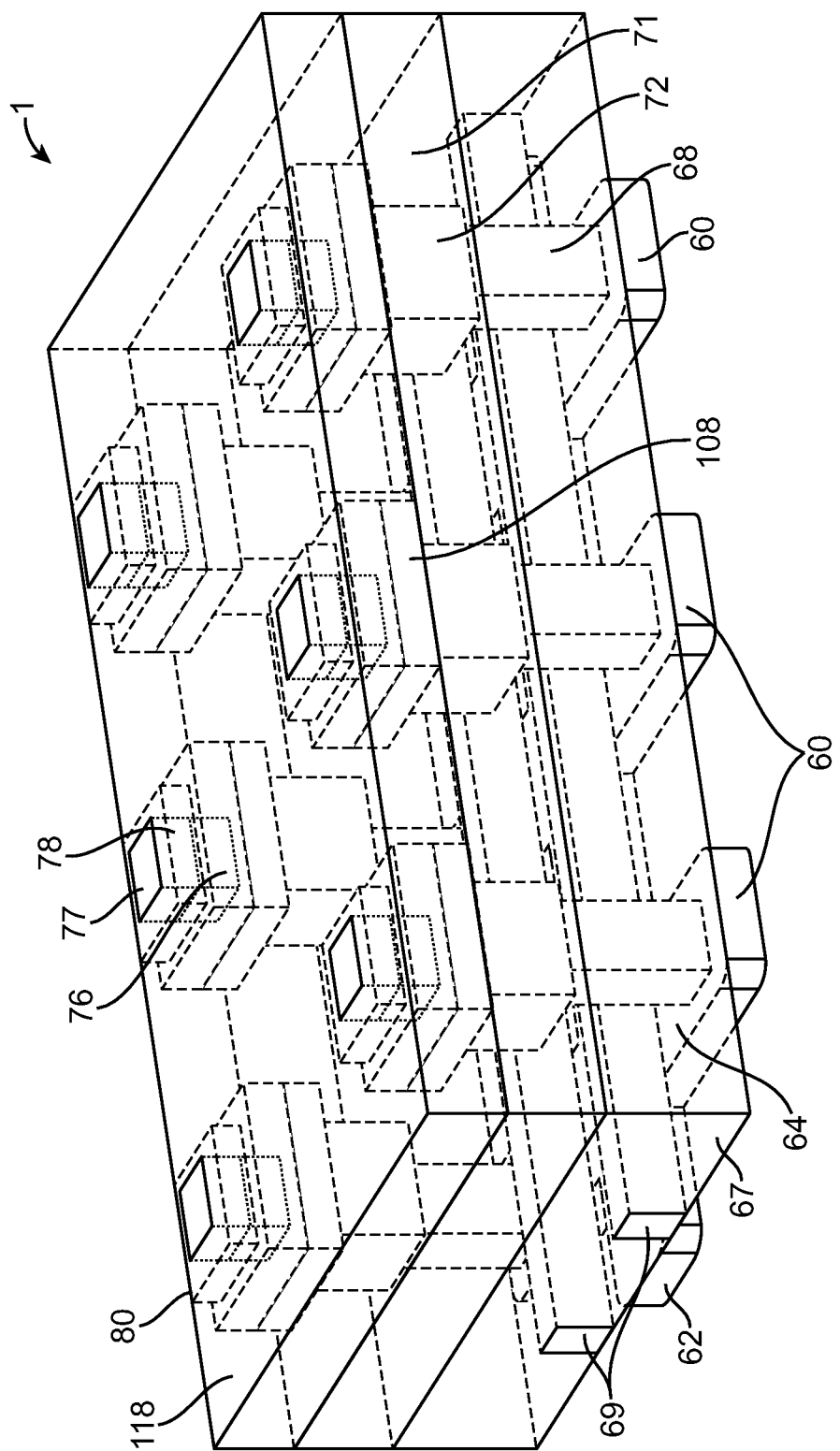

FIG. 16 shows the structure of a number of memory cells after the step 36. The memory cell is shown to include the drain, source, and gate, ILD layer, metal contact pillar, ILD layer, metal pillar, conductive metal cap, MTJ, conductive metal cap/hard mask, passivation cap, and ILD layer.

Figure 17:
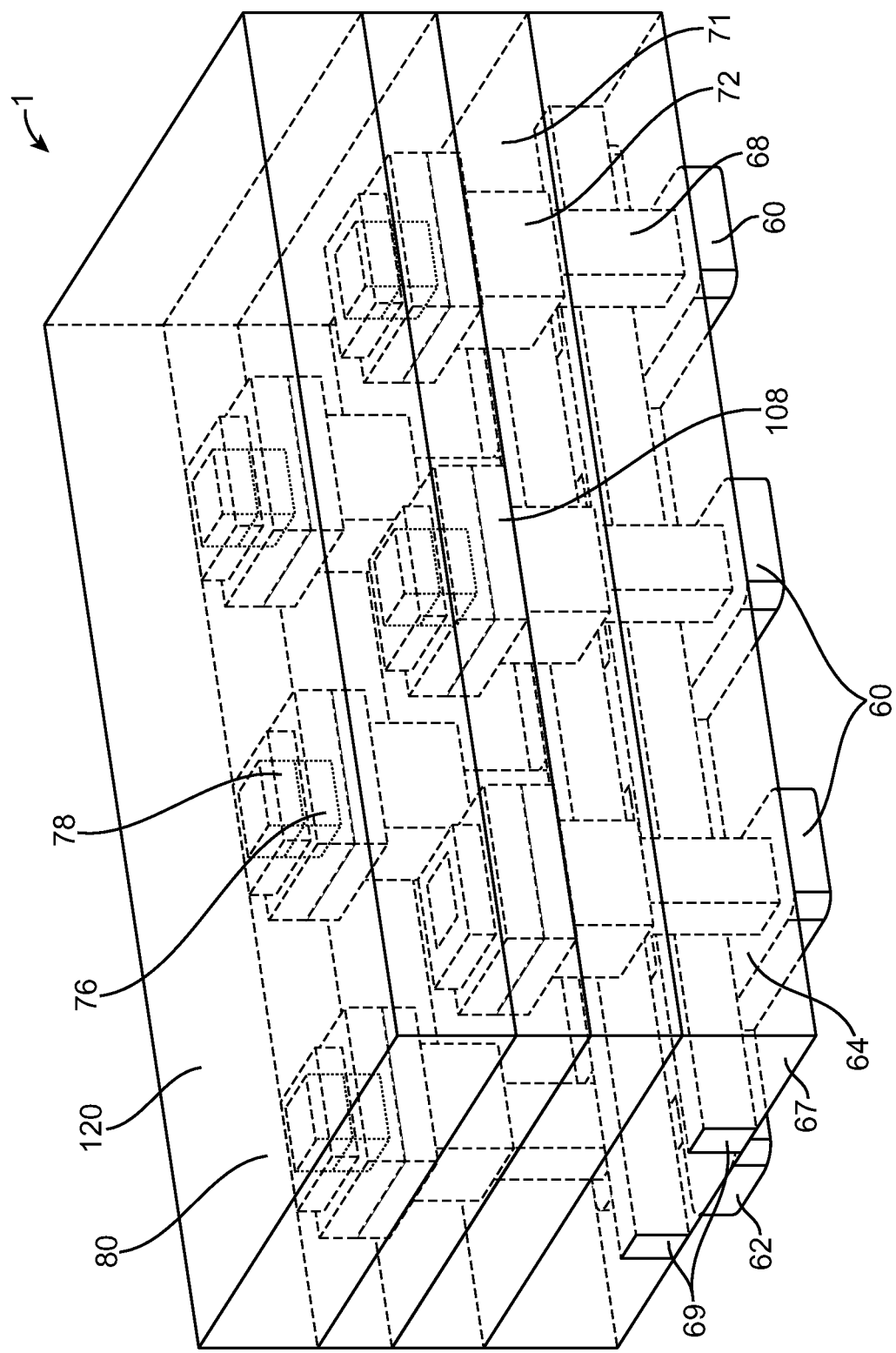

FIG. 17 shows the structure of a number of memory cells after the step 38. The memory cell is shown to include the drain, source, and gate, ILD layer, metal contact pillar, ILD layer, metal pillar, conductive metal cap, MTJ, conductive metal cap layer, passivation cap, ILD layer, and the metal layer.

Figure 18:
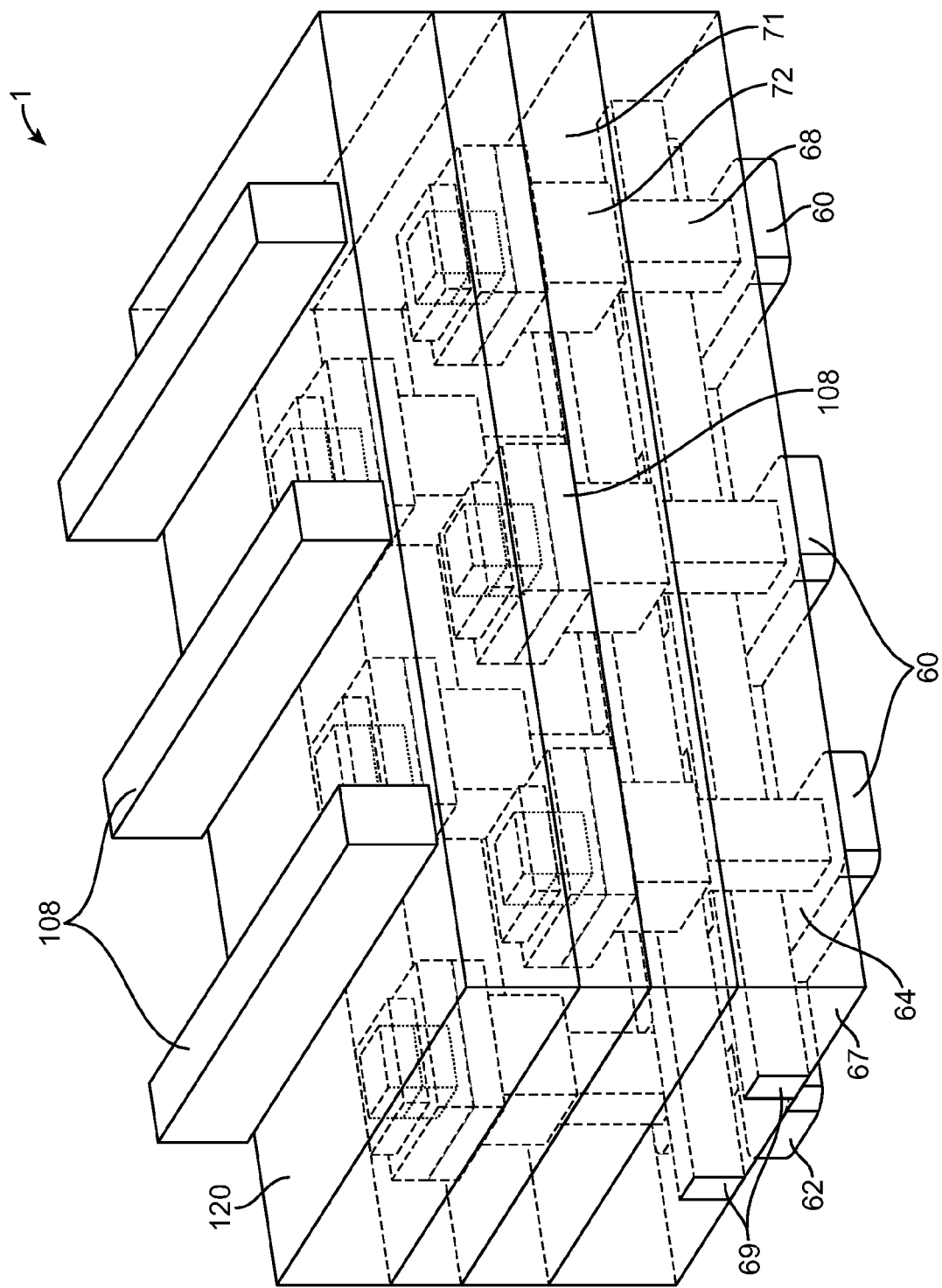

FIG. 18 shows the structure of a number of memory cells after the step 40. The memory cell is shown to include the drain, source, and gate, ILD layer, metal contact pillar, ILD layer, metal pillar, conductive metal cap, MTJ, conductive metal cap layer, passivation cap, ILD layer, a metal layer, and a photo resist bars.

Figure 19:
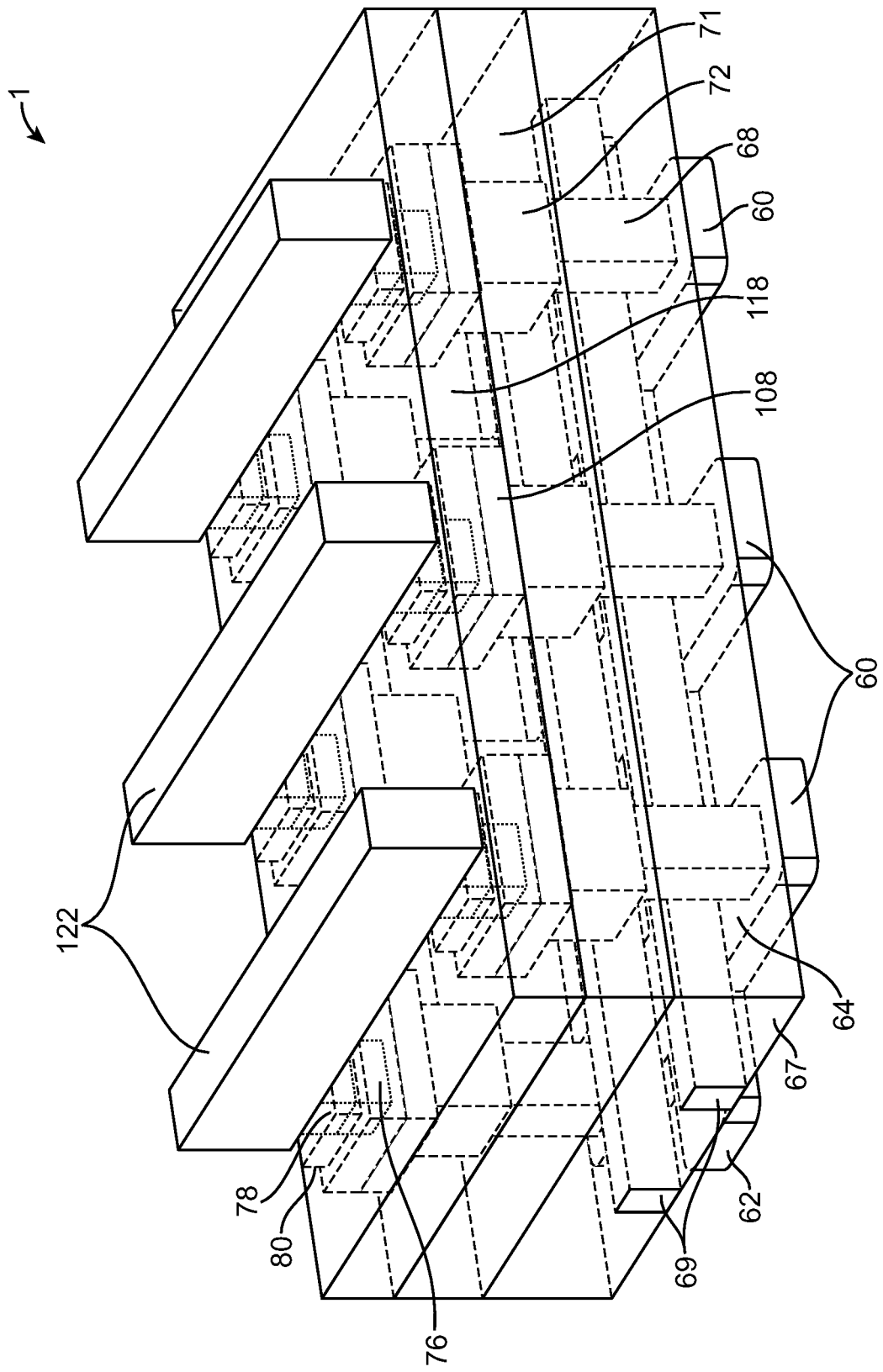

FIG. 19 shows the structure of a number of memory cells after the step 42. The memory cell is shown to include the drain, source, and gate, ILD layer, metal contact pillar, ILD layer, metal pillar, conductive metal cap, MTJ, conductive metal cap layer, passivation cap, ILD layer, and metal bars.

Figure 20:
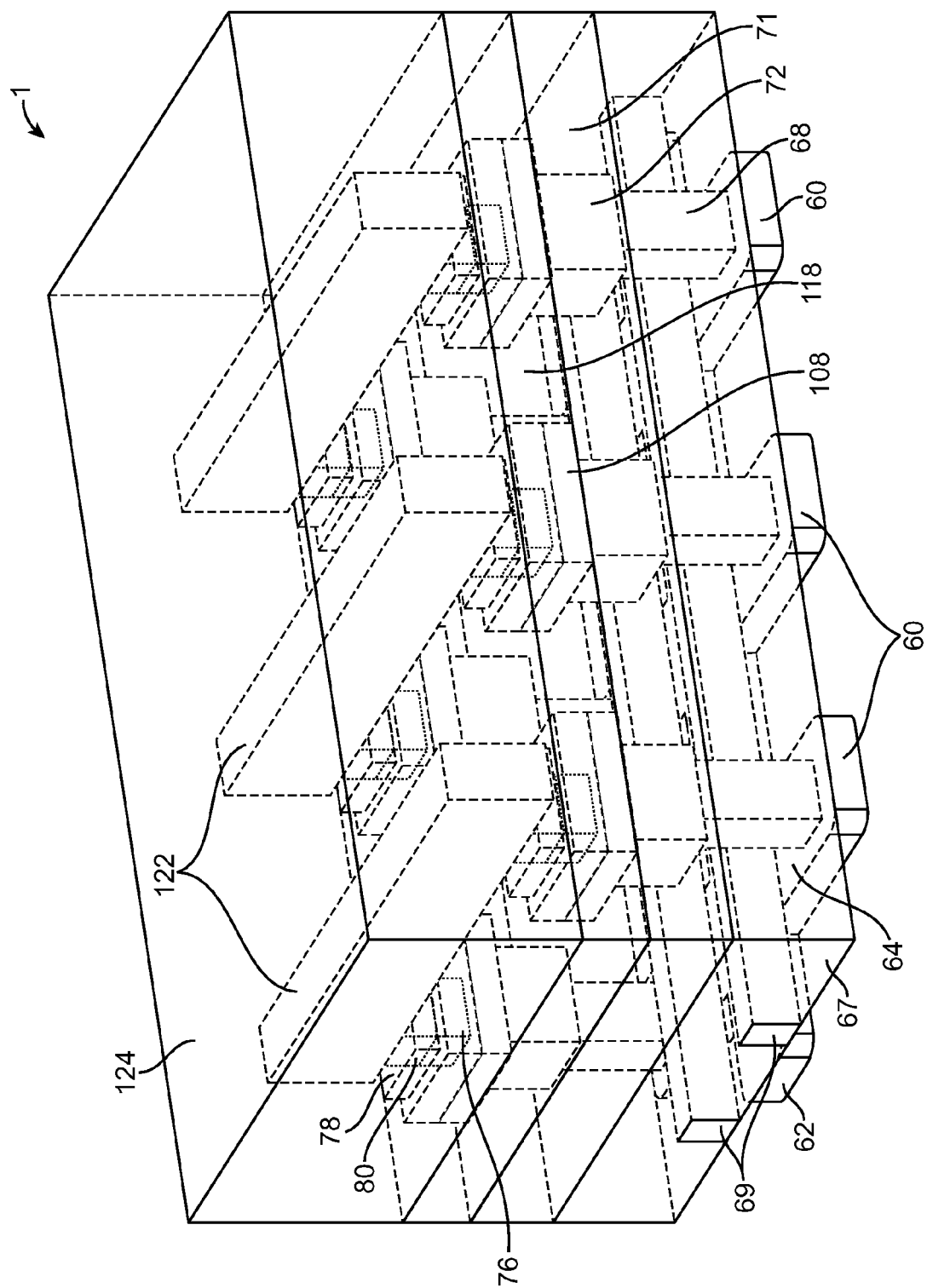
Figure 21:
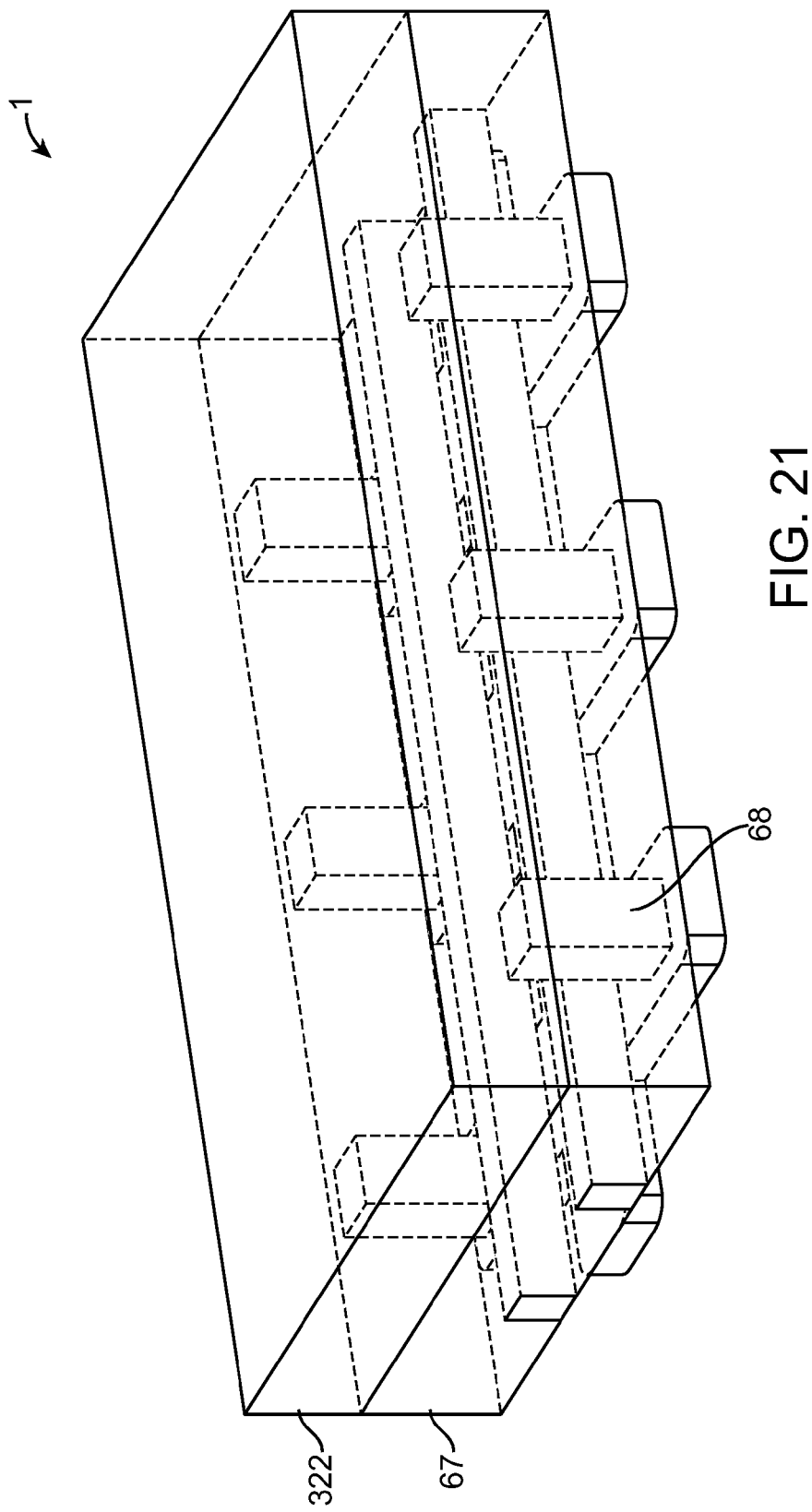

FIG. 20 shows the structure of a number of memory cells after the step 44. The memory cell is shown to include the drain, source, and gate, ILD layer, metal contact pillar, ILD layer, metal pillar, conductive metal cap, MTJ, conductive metal cap layer, passivation cap, ILD layer, metal bars, and a passivation layer.

Figure 21:
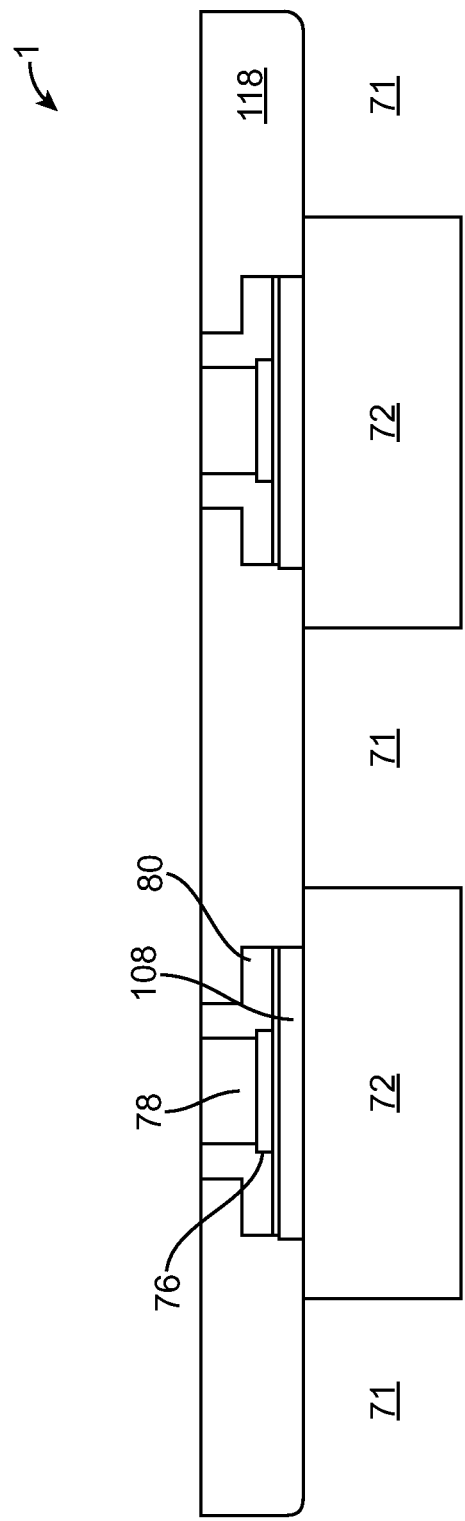
FIGS. 3-21 show 3-dimensional views of the relevant part of a wafer onto which memory cells are formed in accordance with the method of FIG. 1.

FIG. 21 shows the structure of the memory cells after step 314 is performed. The memory cell is shown to include the drain, source, resistor, ILD layer, metal contact pillar, and metal layer.

Figure 22:
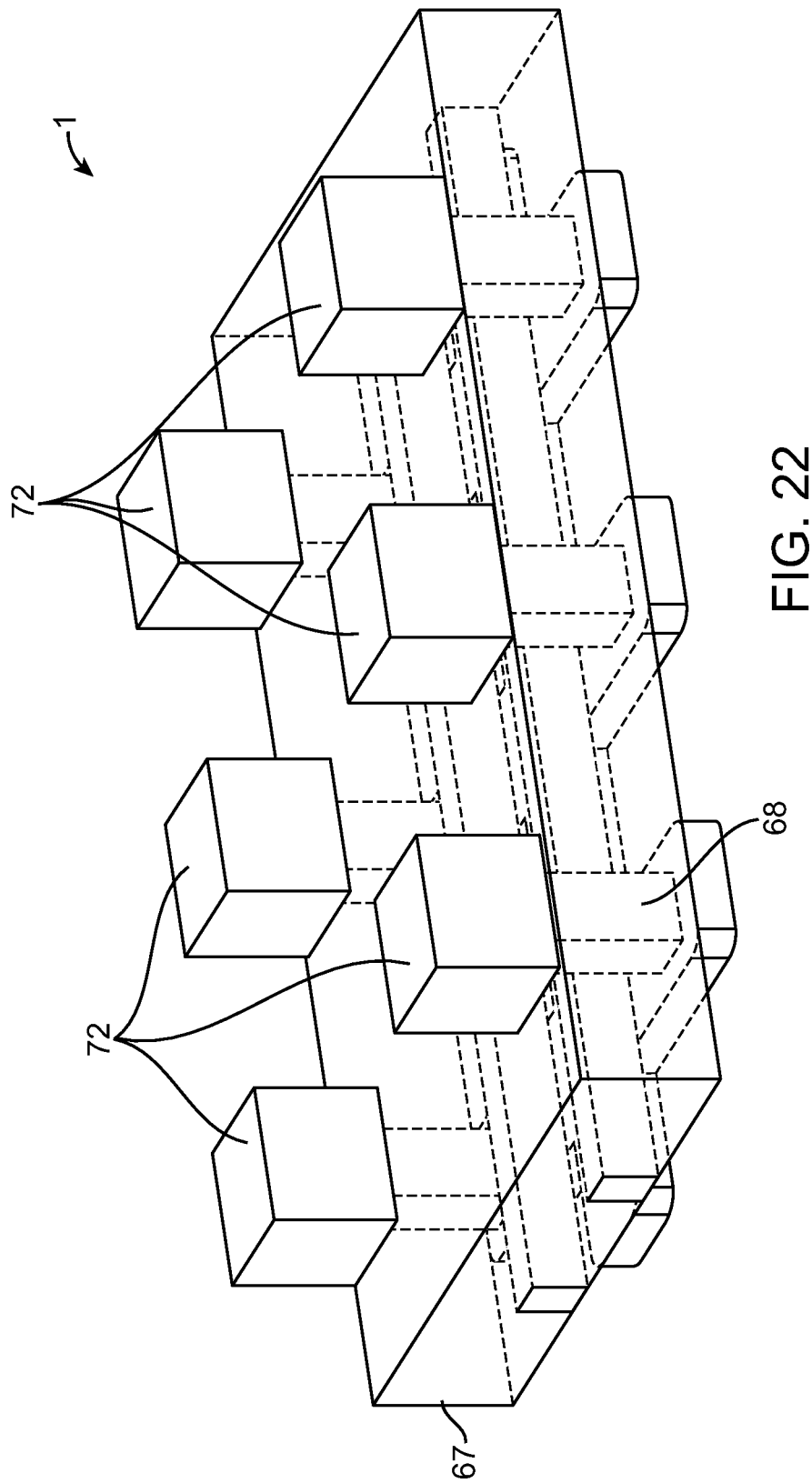

FIG. 22 shows the structure of the memory cells after step 316 is performed. The memory cell is shown to include the drain, source, resistor, ILD layer, metal contact pillar, and metal pillars.

Figure 23:
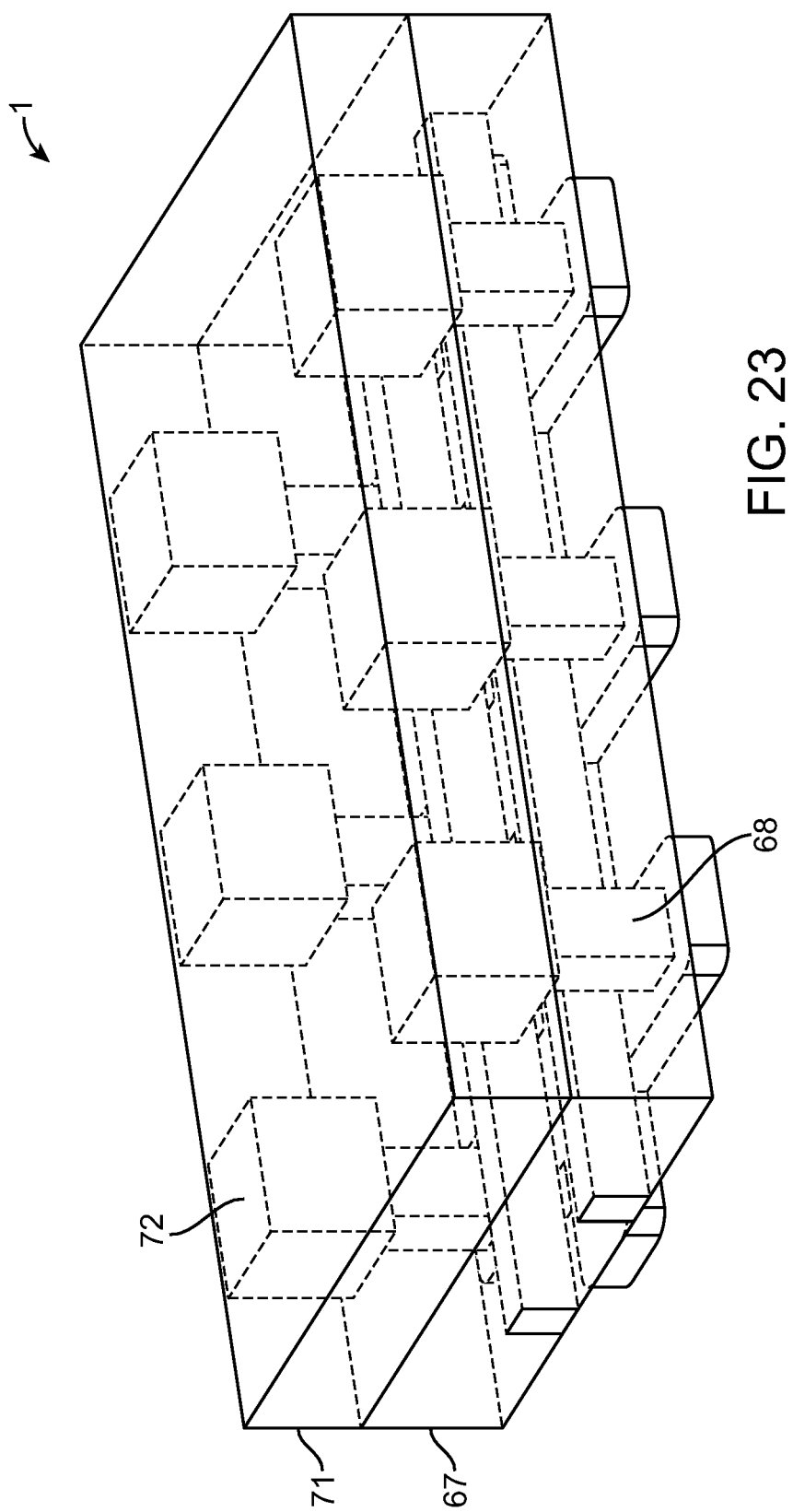

FIG. 23 shows the structure of the memory cells after steps 318 and 320. The memory cell is shown to include the drain, source, resistor, ILD layer, metal contact pillar, ILD layer and metal pillars.

DETAILED DESCRIPTION OF THE EMBODIMENT

Figure 1:
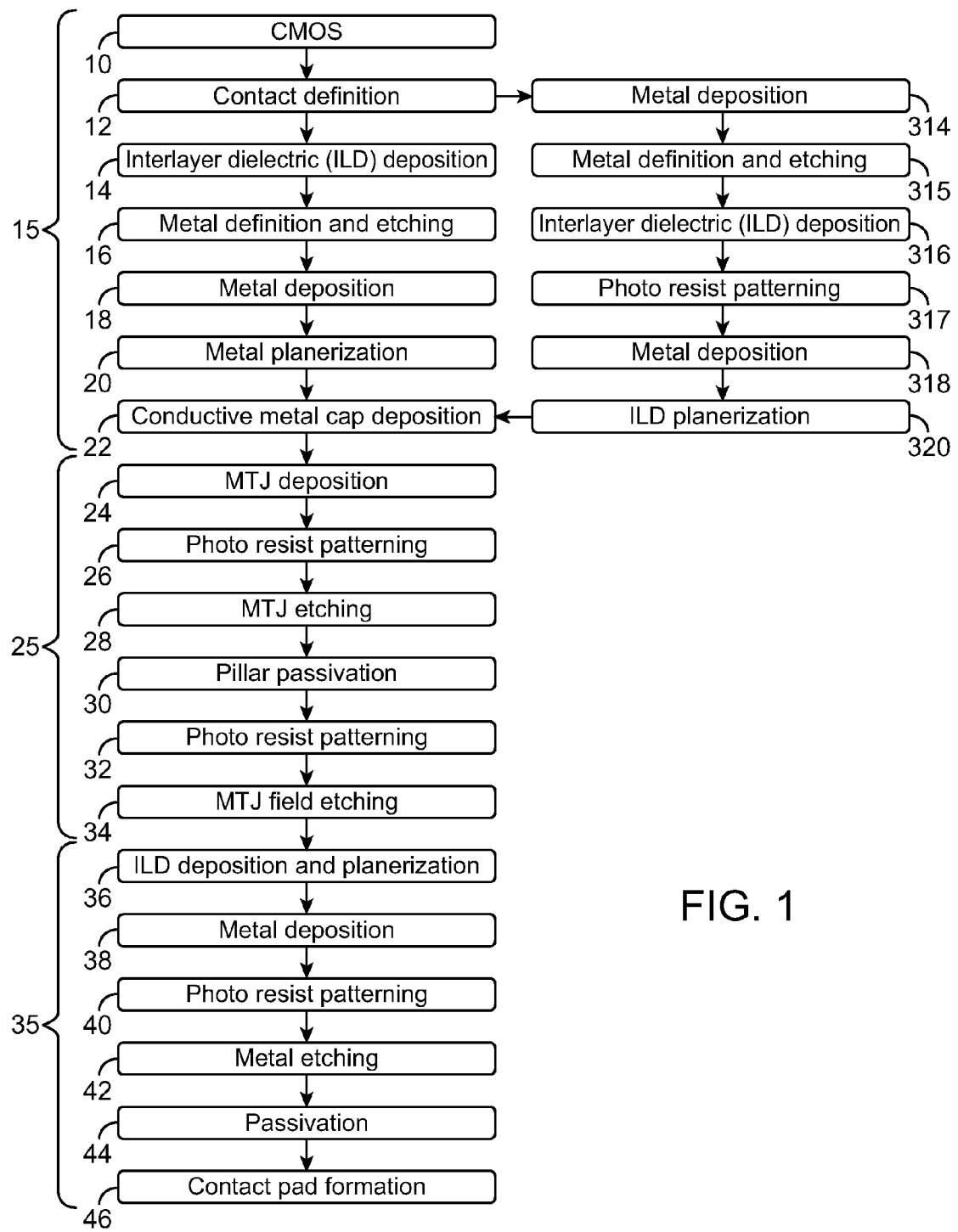

Referring now to FIG. 1, a flow-chart of the relevant steps performed for manufacturing non-volatile magnetic memory cells (for example, magnetic random access memory (MRAM)) is shown in accordance with a method of the present invention. In FIG. 1, a damascene process is used to efficiently and reliably manufacture arrays of memory cells, onto, for example, a wafer, which includes many memory cells. In manufacturing MRAMs, a complimentary metal-oxide-semiconductor (CMOS) as well as magnetic manufacturing processes are employed. That is, magnetic memory is manufactured using magnetic processes and logic or transistors, used to connect the magnetic memory and other logic for addressing and/or reading and writing to the magnetic memory, is manufactured generally using CMOS processes. The method of FIG. 1 allows modularity of the CMOS and magnetic processes in that the magnetic memory can be manufactured at a processing plant (or facility) that is independent and separate from a plant used to manufacture the logic. Additionally, intermediate process control steps are introduced to ensure that the process is within the process tolerance limits for a high yielding low-cost manufacturing process. Intermediate process control steps refer to wafer probing step to ensure that the preceding process steps were completed within specifications and are most efficiently inserted after step 20 in FIG. 1.

Multiple stages of manufacturing are employed for advantageously causing modularity of manufacturing to reduce costs and contamination. For example, during a front end on-line (FEOL) stage 15, logic and non-magnetic portions of a memory cell are manufactured and during to a magnetic fabrication stage 25, the magnetic material portion of the memory cell is manufactured. Finally, a back end on-line (BEOL) stage 35 is employed to manufacture metal and other types of contacts.

In FIG. 1, the FEOL stage 15 is shown to include steps 10-22, the magnetic fabrication stage 25 is shown to include steps 24-34 and the BEOL stage 35 is shown to include steps 36-46, in accordance with a method of the present invention. Accordingly, the FEOL stage 15 is performed, followed by the magnetic fabrication stage 25, followed by the BEOL stage 35.

Alternatively, the FEOL stage 15 includes steps 314-320 and 22 with the steps 314-320 replacing the steps 14-20, respectively, in which case steps 10 and 12 are performed followed by steps 314-320, followed by the magnetic fabrication stage 25 followed by the BEOL stage 35.

Figure 2:
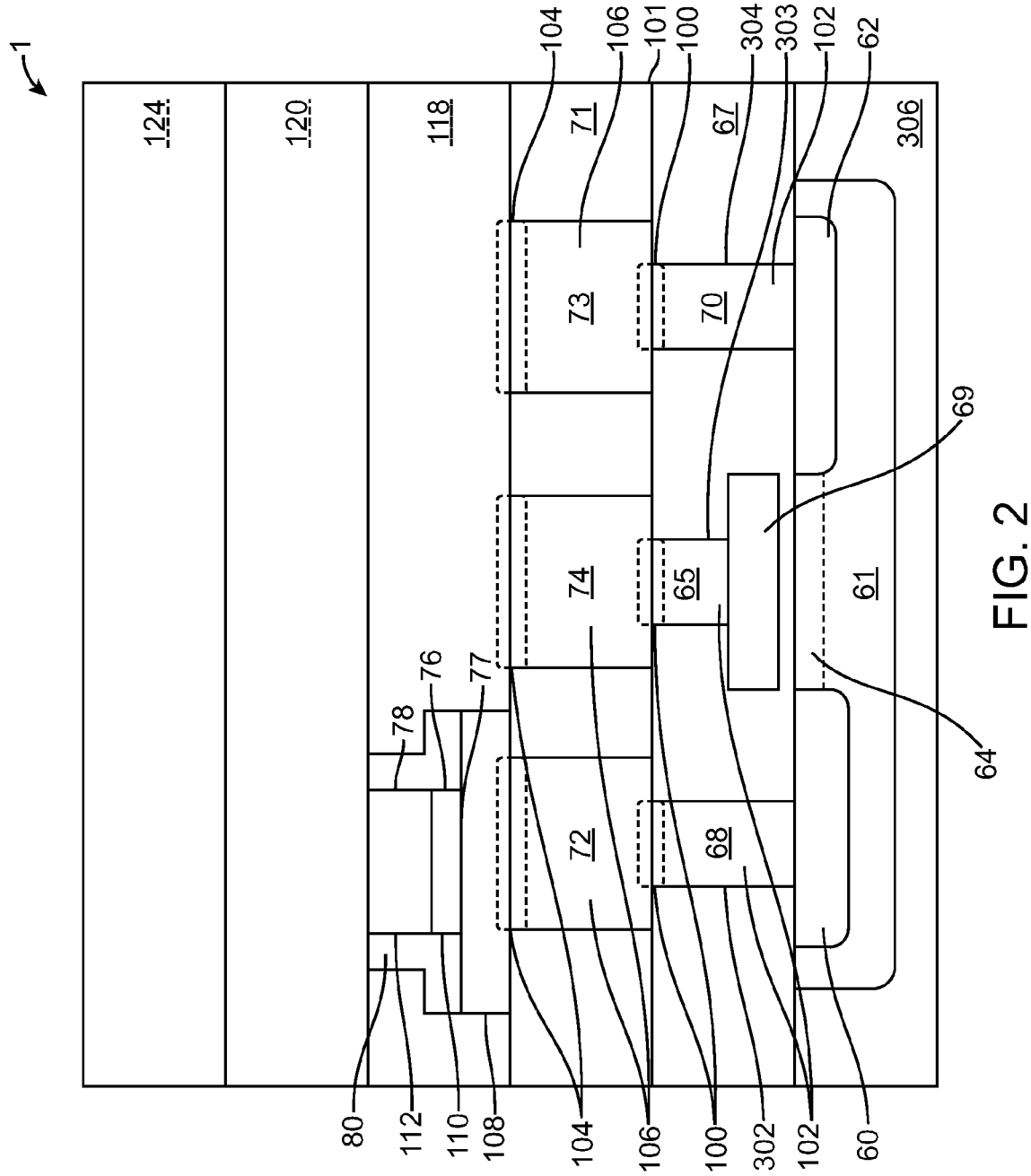
FIG. 2b shows the structure of the memory cell after the metal deposition step 314 has been completed.
FIGS. 2c and 2d show the structure of the memory cell after the metal area defining and etching step 315 has been completed.
FIG. 2e shows the structure of the memory cell after the ILD deposition step 316 has been completed.
FIG. 2f shows the structure of the memory cell after the photo resist deposition and etching step 317 has been completed.
FIG. 2g shows the structure of the memory cell after the metal deposition step 318 has been completed.
FIG. 2h shows the structure of the memory cell after the ILD planerization step 320 has been completed.
FIG. 2i shows a cross section of the wafer.
FIG. 2j shows the small hump 130 that forms above the MTJ 76 as part of the deposition process.
FIG. 2k shows the ILD layer 118 is planerized using CMP until the top of the passivation cap 80 is exposed.
FIG. 2l shows the CMP slurry is changed and the passivation cap 80 is planerized using CMP until the top of conductive metal pillar 78 is exposed.

FIG. 2 presents a cross section of a memory cell 1, as the memory cell is being built on top of a CMOS circuit element, which is shown formed on a wafer 306, in accordance with the process of FIG. 1. More specifically, FIG. 2 shows a cross section of a single non-volatile magnetic memory cell 1, in accordance with an embodiment of the present invention. For ease of understanding, FIGS. 1 and 2 are discussed interchangeably to further clarify forming the memory cell 1.

Referring back to FIG. 1, a CMOS step 10 is performed, during which logic (also known as semiconductor or circuit) is built. Such semiconductor includes, for example, transistors. In the method of FIG. 1, a transistor is fabricated and covered with a bottom interlayer dielectric (ILD) layer, also known as pre-metal dielectric, which is shown and discussed relative to FIG. 2 as an ILD layer 67.

An exemplary structure formed at the completion of FIG. 1 is shown in FIG. 2 where a transistor (or "circuit(s)", "semiconductor" or "logic") 61 is formed on the wafer 306 above which is formed a bottom ILD layer 67. The transistor 61 is shown in FIG. 2 to include a source 60, drain 62, and a channel 64, and gate 69. The gate 69 is electrically separated from channel with a thin gate oxide. The gate oxide thickness is typically in the range from 2 nm to 200 nm depending on the width of the gate (thickness ~2% of gate width). The ILD layer 67 serves as an insulating layer to prevent the transistor 61 formed at step 10 from short circuiting with circuitry that is not intended to be coupled to the transistor (or undesirable electrical connections). The transistor 61 serves as an access transistor for comparing the resistance of one or more memory cells to a reference transistor for reading/writing from and to the memory cell 1.

After the CMOS step 10, in FIG. 1, a contact definition step 12 is performed. During the contact definition step 12, photo-resist 58 (shown in FIG. 3a) is applied to the entire top of the ILD layer 67 and a contact area 100 is defined. The contact area 100 is defined as a portion on top of the ILD layer 67 that is situated above the source 60, the gate 69 and the drain 62 of the transistor 61, as shown in FIG. 2 and shown with further clarification in FIG. 3. Photo-resist 58 is used to control an etching process by preventing the material covered by the photo-resist from being etched. Thus, the ILD layer 67 is prevented from being etched except above the drain 62, the gate 69 and the source 60 where it is etched.

During the contact definition step 12 of FIG. 1, the ILD layer 67 of FIG. 2 is etched until the source 60, the gate 69 and drain 62 are exposed to form holes 302, 303 and 304. In an exemplary method, reactive ion etching (RIE) is performed to expose the drain and source of the transistor 61. It should be noted that the use of RIE is exemplary only and that other etching methods are contemplated. While other etching techniques are contemplated, an RIE process having a substantially gaseous by-product is used in the method of FIG. 1 to reduce the number of steps during manufacturing by eliminating a clean-up step, which is discussed in further detail below.

Thereafter, metal barrier (seed) layer 101 is deposited on top of the ILD layer 67 and into the sides and bottom of holes 302, 303 and 304 are covered with a barrier (seed) layer 101. Subsequently, a metal material 102 fills the holes 302, 303 and 304, on top of the barrier layer 101 to form metal pillars 65, 68 and 70. The metal pillars formed at this step are dispersed (or embedded) in the ILD layer 67.

In an exemplary manufacturing process, Physical Vapor Deposition (PVD) is used to deposit a barrier/seed layer 101 and Chemical Vapor Deposition (CVD) is used for the metal material 102. The barrier layer 101 is deposited on top of the ILD layer 67 and the metal material 102 is deposited on top of the barrier/seed layer 101.

It should be noted that the use of PVD to layer the barrier/seed layer 101 and the use of CVD to layer the metal materials 102 is exemplary only and other methods, such as atomic layer deposition (ALD), or electro-plating, are contemplated. The remaining metal material 102, or the metal material that covers the ILD layer 67 but that is not in the holes 302, 303 and 304, is planarized using chemical-mechanical polishing (CMP) until substantially only the pillars 65, 68 and 70 remain embedded in the ILD layer 67. CMP is used to remove excess metal material from metal layer 102 and the barrier/seed layer 101 thereby advantageously preventing short-circuits between pillars 65, 68 and 70 to undesirable electrical components. Pillar 68 is used to pass current from the source 60 to the MTJ 76. Pillar 70 serves to ground the MTJ 76.

In an exemplary embodiment, the metal material 102 is made of tungsten. It should be noted that use of tungsten is exemplary only and that the use of other conductive material that does not chemically react with silicon is contemplated.

After the contact definition step 12 in FIG. 1 is performed, an ILD step 14 is performed during which, an intermediate ILD layer 71 is deposited on top of the ILD layer 67, covering substantially the entire ILD layer 67, and pillars 65, 68, and 70. In an exemplary application, Silicon Oxide ($SiO_2$) is used as the ILD layer 71. It should be noted that the use of $SiO_2$ is exemplary only and other forms of ILD layers are contemplated. Typically, a thinner layer of SiN is deposited prior to the SiO2 layer to create an etch stop for the subsequent etch process step 16.

After the ILD step 14 in FIG. 1, a metal area definition and etching step 16 is performed during which a metal deposition area 104 is defined, which is an area substantially on top of the ILD layer 67 and above pillars 68, 65 and 70. Subsequently, photo-resist 75, which is shown in FIG. 5a, is applied to substantially the entire top surface of the ILD layer 71 and patterned. ILD layer 71 is etched until the pillars 68, 65 and 70 are exposed. In an exemplary application, RIE is used to etch the ILD layer 71. It should be noted that the use of RIE to etch the ILD layer is exemplary only and other forms of etching are also contemplated.

After the metal area definition and etching step 16 in FIG. 1 is completed, a metal barrier (seed) layer 101 is deposited on top of the ILD layer 71 and into the sides and bottom of holes are covered with a barrier (seed) layer 101. Subsequently, a metal material 106 fills the holes on top of the barrier layer 101 to form metal pillars 72, 73 and 74, as shown in FIG. 2. The metal pillars formed at this step are dispersed (or embedded) in the ILD layer 71. The width of the metal pillars 72, 74 and 73 are each defined by the metal deposition area 104. In an exemplary application, the metal material 106 is copper. The use of copper is exemplary only and the use of other metals is also contemplated. Steps 16 and 18 are collectively a form of a Damascene process where trenches and vias are formed and thereafter filled with metal, such as copper, in the process flow of FIG. 1. While only a single metal is mentioned, other metal layers may be formed on top of a previous metal layer, separated by vias, in which case the MTJ 76 is formed in between the second to the top and the top-most layer and the top-most metal layer.

After the metal deposition step 18, in FIG. 1, a metal planerization step 20 is performed during which the metal material 106 is partially removed using CMP, leaving in place metal pillars 72, 74 and 73 (collectively known as "intermediate metal pillars"), and the ILD layer 71, as shown in FIG. 2. The metal pillar 72 is advantageously low in resistance and substantially thin in size thereby increasing power efficiency for the non-volatile magnetic memory elements included in the memory cell. For example, the metal pillar 72 may be made of copper, which has a very low resistance of approximately 0.05 ohm/square and a thickness of 2000 to 4000 Angstroms. It should be noted that all resistance and thickness values for the pillar 72 are exemplary only and other resistance values and thicknesses are also contemplated.

Figure 2A:
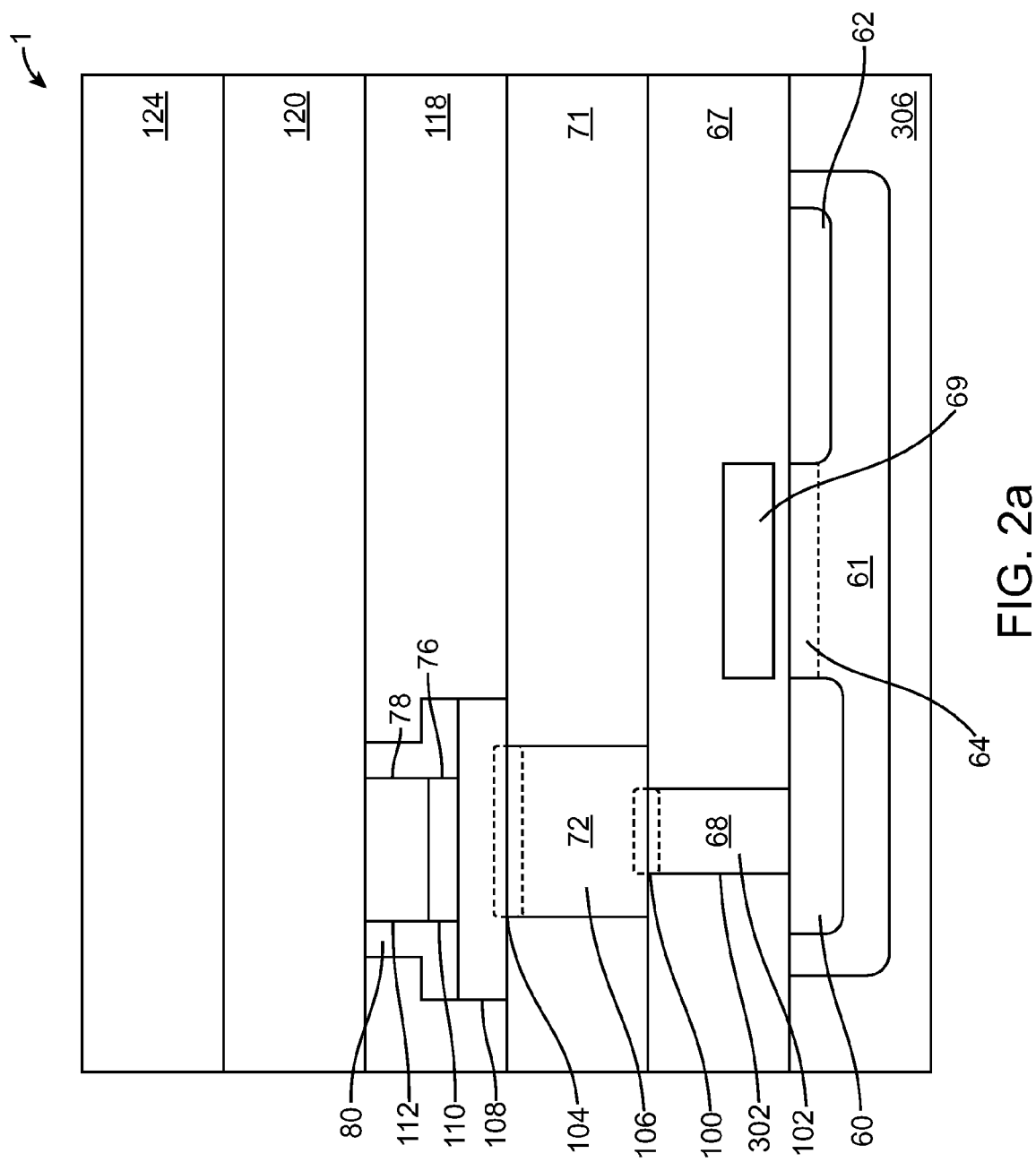
Figure 2G:
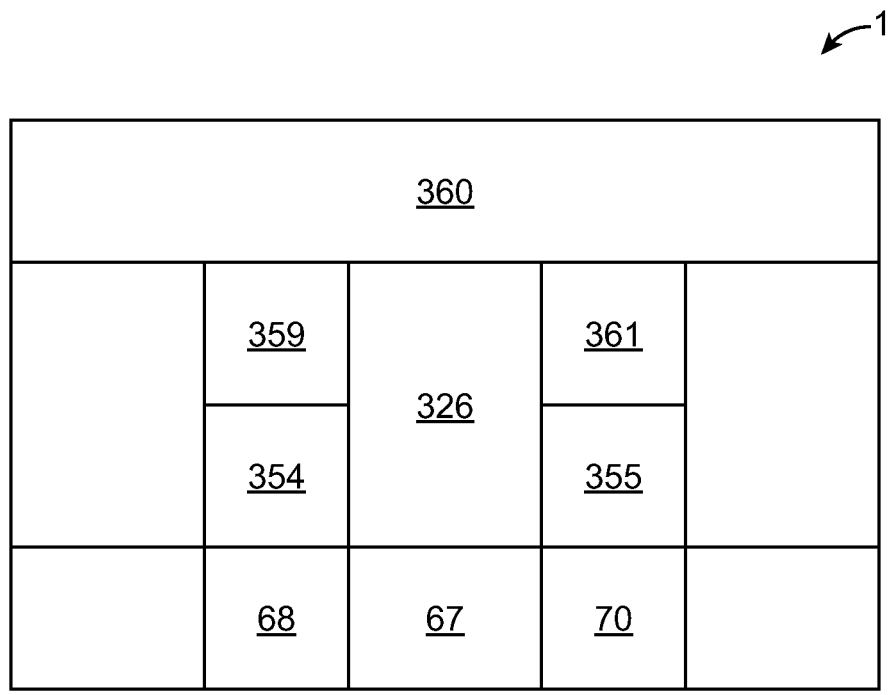
Figure 2H:
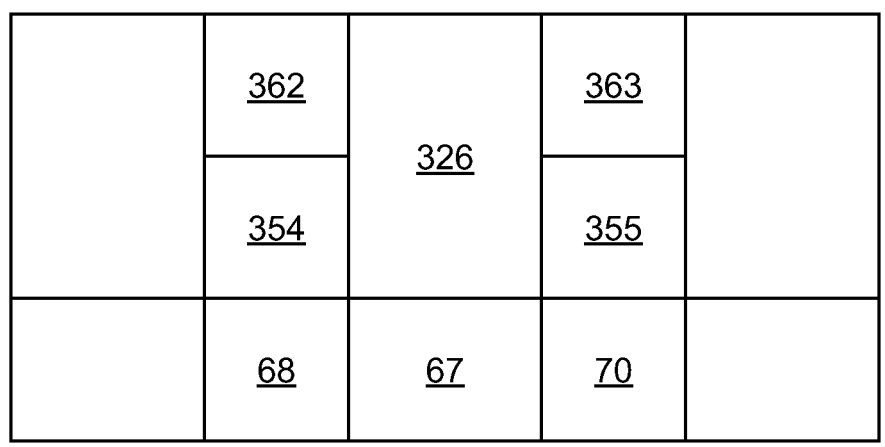

It should be noted that pillars 65, 73, and 74 are not present in every single memory cell. In an exemplary application, pillars 65, 70, 73, and 74 are formed every eighth circuit, but it is contemplated this number might change. It is shown in FIG. 2 to show how circuits with pillars 65, 70, 73, and 74 look. FIG. 2a shows a circuit without pillars 65, 70, 73, and 74. In embodiments where the pillars 65, 70, 73, and 74 are included only every so many, such as eight, circuits, is to reduce cell size hence reduce the cost as well as to decrease power and increase the reliability of the manufactured memory cell 1.

Alternatively, rather than the steps 14 through 20, a non-damascene process comprised of steps 314 through 320 shown in FIGS. 1 and 2b-2h may used. If this alternative method is used, after the contact definition step 12 in FIG. 1, a metal deposition step 314 is performed where a metal layer 322 is deposited covering substantially the entire ILD layer 67 including the pillars 68 and 70. In an exemplary application, the metal layer is made of aluminum. It should be noted that the use of aluminum is exemplary only and the use of other conductive material is also contemplated. For instance, aluminum with a cap of a harder metal like Ti to act as a mechanical stop to the subsequent CMP process step 320 may be employed.

After the metal deposition step 314 in FIG. 1, a metal area defining and etching step 315 is performed where a photo-resist pillar 324 are applied substantially above metal pillar 68. The metal layer is etched until metal pillars 354 and 355 remain.

After the metal area defining and etching step 315 FIG. 1, an ILD deposition step 316 is performed during which an ILD layer 326 is deposited covering substantially the entire wafer including metal pillars 354 and 355. In an exemplary application, Silicon Oxide ($SiO_2$) is used as the ILD layer 326. It should be noted that the use of $SiO_2$ is exemplary only and other forms of ILD layers are contemplated.

After the ILD deposition step 316 in FIG. 1, a photo-resist deposition and etching step 317 is performed during which photo resist 357 is deposited across the entire ILD layer 326 except in the defined area 358, which is substantially above metal pillars 354 and 355. After the photo resist is applied, the ILD layer 326 is etching until metal pillars 354 and 355 are exposed.

After the photo-resist deposition and etching step 317 in FIG. 1, a metal deposition step 318 is performed during which a metal layer 360 is deposited over the entire wafer, filling in holes 359 and 361. In an exemplary application, tungsten is used. It should be noted that the use of tungsten is exemplary only and the use of other materials is contemplated.

After a metal deposition step 318 in FIG. 1, an ILD planerization step 320 is performed during which the metal layer 360 is planerized until only metal pillars 362 and 363 remain embedded in ILD layer 326. This planerization process leaves metal pillars 362 and 363 and ILD layer 326.

After the metal planerization step 20 or ILD planerization step 320 in FIG. 1, a conductive metal-cap deposition step 22 is performed during which a conductive metal cap 108 is applied on top of the ILD layer 71 and metal pillars 72, 73 and 74. The conductive metal cap 108 allows for modular fabrication by sealing the non-volatile magnetic memory cell. The conductive metal cap 108 advantageously protects the pillars 72, 73 and 74 from oxidizing during transport by manufacturing the memory in multiple stages. For example, during the FEOL stage 15, the transistor 61 and non-magnetic portions of the memory cell 1 are manufactured and during to a magnetic fabrication stage 25, the magnetic material portion of the memory cell 1 is manufactured. During fabrication, a number of stages of manufacturing are performed. For example, in the embodiment related to and method of FIG. 1, there are three stages of fabrication shown. These stages include: FEOL 15, magnetic fabrication 25, and BEOL 35 stages. The FEOL 15 facility is the facility used to perform CMOS and/or non-magnetic metal fabrication. The BEOL 35 facility is the facility used to perform the subsequent metal fabrication. By allowing for transport (modularity of the processes), the need to have the FEOL 15, magnetic fabrication, and BEOL 35 processes in the same facility is eliminated. This allows for production in the least expensive CMOS factory without regard to the BEOL 35 wherein the FEOL 15 further enhances cost-effectiveness. Additionally, separating the FEOL 15 and the BEOL 35 in separate facilities further prevents contamination of the CMOS fabrication by the magnetic fabrication.

During magnetic fabrication 25 all the magnetic elements, namely the MTJ 74, are deposited and formed. In the present application, steps 10-22, and alternatively 314-320, comprise the FEOL 15. Steps 24-34 are included in the magnetic fabrication 25. Steps 36-46 are included in the BEOL 35. It should be noted that the use of FEOL 15, magnetic fabrication 25, and BEOL 35 are exemplary only. Further, it is contemplated that two or more of these stages may be combined into a single stage in the same fabrication facility.

The conductive metal cap 108 also provides a smoother surface for the MTJ 76 to be positioned thereon. A lower surface roughness allows for advantageously forming the MTJ, which results in a higher tunneling-magneto resistance (TMR). An exemplary average surface roughness (Ra) of the metal cap 108 is 10 angstroms or smoother. The metal cap 108 helps to control the surface roughness onto which the MTJ 76 is deposited. The conductive metal cap 108 also advantageously increases the height of the MTJ 76. This improves the CMP error threshold because less attention need be given to avoid over-planarization, which is a known problem with CMP methods. This leads to faster CMP thereby decreasing manufacturing time. That is, the conductive metal cap 108 advantageously raises the height of the MTJ 76 that is to be positioned thereon. This increases the CMP error threshold thereby increasing the reliability of manufacturing. Increased reliability in manufacturing allows for a better reliability (i.e. a higher percentage of working memory cells-per-wafer), thereby reducing the cost-per-element. The increase in speed also decreases fabrication time, increasing yield, thereby further decreasing overall cost.

In one embodiment of the present invention, the metal cap 108 is typically less than 500 Angstroms in its thickness. When compared with the thickness of metal pillar 72, the metal cap 108 is anywhere typically less than ¼th as thick.

In an exemplary application the conductive metal cap 108 is made of tantalum nitride (TaN), and has a resistivity of approximately 20 micro Ohms-centimeter. It should be noted that all resistance and thickness values for the conductive metal cap 108 and any other layer are merely exemplary and different resistance values and thicknesses are contemplated. It also should be noted that the use TaN as the cap layer is exemplary only and that other conductive metal materials are contemplated. These other conductive metal material are preferrably conductive and substantially non-reactive so as to avoid oxidation, and have a high melting point (e.g. greater than 1200 degrees Celcius), and have a resistivity less than 100 micro Ohms-cm, and a deposited film Ra of less than 20 Angstroms. If the reposited film Ra is higher than 20 Angstroms, but otherwise meets the criteria, it will be kiss-polished to less than 20 Angstroms. "Kiss-polish" refers to a very short or light polishing process without having much material removal (typically less than 10 nm of the underlying material) than the preceding polish. Examples of suitable materials include but are not limited to Tantalum, Chromium, Molybdenum, Tungsten, Niobium, Titanium, Zirconium, Vanadium and Ruthenium. In addition, the conductive metal cap 108 may be formed from any alloy that substantially meets the criteria. Also, mixtures containing less than 1% nitrides of a suitable material are also contemplated.

It should also be noted that use of a single layer of metal material metal cap 108 is exemplary only and it is contemplated that layers of different crystalline and amorphous metal materials may be formed together. In an exemplary application of a layered approach, copper nitride (CuN) and tantalum (Ta) may be layered together to reduce resistance and/or decrease the average roughness (Ra). However, other combinations of crystalline and amorphous materials may be used.

After the conductive metal-cap deposition step 22 in FIG. 1, a magnetic tunnel junction film (MTJ) deposition step 24 is performed during which the MTJ film 110 is layered on top of the conductive metal cap 108. The MTJ film 110 is layered onto the conductive metal cap 108 using a cluster tool. A cluster tool is a tool for applying varying materials without breaking vacuum. It is necessary here because of the various ways a MTJ can be formed. The following applications provide further details of various MTJs that can be used to comprise the memory cell 1, the disclosures of which are herein incorporated by reference as though set forth in full:

U.S. application Ser. No. 11/674,124, filed Feb. 12, 2007, titled "Non-Uniform Switching Based Non-Volatile Magnetic Based Memory" by Ranjan et alia, U.S. application Ser. No. 11/678,515, Filed Feb. 23, 2007, titled "A high capacity low cost multi-state magnetic memory" by Ranjan et alia, U.S. application Ser. No. 11/739,648 Filed Apr. 24, 2007, titled "Non-volatile magnetic memory with low switching current and high thermal stability" by Ranjan et alia, U.S. application Ser. No. 11/776,692, filed Jul. 12, 2007, titled "Non-Volatile Magnetic Memory Element with Graded Layer" by Ranjan et alia, U.S. application Ser. No. 11/740,861, filed Apr. 26, 2007, titled "High capacity low cost multi-stacked cross-line magnetic memory" by Ranjan et alia, U.S. Application No. 60/863,812, filed Nov. 1, 2006, titled "Novel spintronic device" by Wang, U.S. application Ser. No. 11/932,940 filed Oct. 31, 2007 titled "current-confined effect of magnetic nano-current-channel (NCC) for magnetic random access memory (MRAM)" by Wang, U.S. application Ser. No. 11/866,830 filed Oct. 3, 2007, titled "Improved high capacity low cost multi-state magnetic memory" by Ranjan et alia, and U.S. application Ser. No. 11/860,467 filed Sep. 24, 2007, titled "Low cost multi-state magnetic memory" by Ranjan et alia.

MTJs other than those disclosed in the patent documents above are contemplated. A conductive metal cap 112 is then formed on top of the MTJ film 110. The conductive metal cap 112 essentially serves as the top electrode of a memory element. In an exemplary embodiment, the conductive metal cap 112 is made of Ta. In another embodiment, the conductive metal cap 112 is approximately 40 nanometers in thickness.

After the MTJ deposition step 24 in FIG. 1, a photo resist step 26 is performed during which photo-resist pillars 114 are formed above metal pillars 72, 73 and 74, as is later shown in FIG. 11.

After the photo resist step 26 in FIG. 1, an MTJ etching step 28 is performed during which the conductive metal cap 112 and MTJ film 110 are partially etched leaving a pillar of conductive-metal pillar 78 and MTJ (or MTJ pillar) 76, as shown in FIG. 2. In an exemplary application, the MTJ etching step 28 is done in two stages. The first stage is a selective etching used to target the conductive metal cap 112. The second stage selectively etches the MTJ film 110. In an exemplary application, the first stage is accomplished using carbon tetrafluoride (CF4) and the second stage is accomplished using methanol (CH3OH) or carbon monoxide (CO)+ammonia (NH3) etching. It should be noted that the two-stage etching and use of CF4, CH3OH and CO+NH3 are exemplary only and the use of other gases are also contemplated. In addition, in an exemplary application, after etching the top electrode is approximately 20 to 60 nanometers thick.

After the MTJ etching step 28 in FIG. 1, a pillar passivation step 30 is performed during which the MTJ 76 and conductive metal pillar 78 are covered with a passivation layer 116 to protect the MTJ from oxidization and other damage during potential transport from the magnetic fabrication 25 to BEOL 35 facilities. In an exemplary application, the passivation layer 116 is formed using silicon nitride (Si3N4). Si3N4 is a dielectric material with excellent protective qualities. The use of Si3N4 is exemplary only and other materials that are non-conductive, have good adhesion, and a temperature deposition of below approximately 350 degrees Celsius are also contemplated. Other such materials include, but are not limited to, silicon nitride (SiN), silicon oxy-nitride (SiON), zirconium oxide (ZrO2), zirconium nitride (ZrN), hafnium oxide (HfO2), and hafnium nitride (HfN).

After the pillar passivation step 30 in FIG. 1, a photo resist step 32 is performed during which photo resist is applied over the passivation layer 116 as shown in FIG. 14. The photo resist area is substantially larger than the MTJ 76 and conductive metal cap 78. The larger size is to advantageously avoid redeposition during etching. Redeposition is a process whereby material from one area is moved to another during etching. Redeposition affects memory cell 1 reliability and yield. In addition, a larger etching area allows for greater variation in MTJ 74 placement. A larger variation in MTJ placement reduces the number of non-functioning memory cells by assuring an electrical connection and reduces the number of quality assurance steps.

After the photo resist step 32 in FIG. 1, a MTJ etch step 34 is performed during which the passivation layer 116 and conductive metal cap 108 is etched away except in the over-sized area substantially above the MTJ 76 and conductive metal pillar 78, leaving conductive metal pillar 74, MTJ 76, conductive metal pillar 78, and passivation cap 80.

The passivation cap 80 is typically made of oxide and nitrides of transition metals which are readily available for high volume Integrated Circuit (IC) manufacturing. Examples of materials that the passivation cap 80 is made of include, but are not limited to, silicon nitride (Si3N4), silicon nitride (SiN), silicon oxy-nitride (SiON), zirconium oxide (ZrO2), zirconium nitride (ZrN), hafnium oxide (HfO2), hafnium nitride (HfN), tantalum nitride (TaN), titanium nitride (TiN), tantalum oxide (Ta2O5), aluminum oxide (Al2O3), or aluminum nitride (AlN). The passivation cap 80 is the passivation layer 116 after the latter has been patterned.

After etching the MTJ is substantially oval in shape with a Length/Depth ratio (L/D ratio) ranging from 1 to 3. This L/D ratio is achieved during the etching process by selective application of the photo-resist mask. Unlike other etching applications, there is generally no use of optical pattern correction (OPC). OPC is commonly used to maintain a substantially square edge during etching. However, it is desirable to have an oval shape for the MTJ to decrease switching current which may require some unique OPC depending upon the resulting shape and size of the etched pillar as well as the process conditions. In an exemplary application, RIE with an etch rate of greater than 0.1 Angstroms/sec is used to etch the passivation layer 116. Specifically, gases are used which have a substantially gaseous by-product and the by-products are vacuumed away during etching. RIE with gaseous by-products advantageously reduces the number of steps by eliminating the need for a cleaning step. In addition, RIE with a substantially gaseous by-product produces less re-deposition, which advantageously increases reliability, as discussed above. For example, carbon monoxide (CO) may be used to etch the MTJ. It should be noted, however that the use of RIE with gaseous by-products is exemplary only and other forms of etching are contemplated. Other forms of RIE may be used such as a chlorine etching. In addition, ion milling (also "ion bombardment") may be used to etch the passivation layer 116. However, ion milling causes significant redeposition and requires additional clean-up steps.

After the MTJ etch step 34 in FIG. 1, an ILD deposition and planerization step 36 is performed during which an ILD layer 118 is deposited on ILD layer 71 and metal pillars 72, 74 and 73. In an exemplary application, the ILD layer 118 is silicon oxide (SiO2) but it should be noted that other materials are contemplated Referring now to FIGS. 2i-2l, showing the stages of the CMP process in step 36 to include a plurality of stages. After the ILD layer 118 is deposited, ILD layer 118 is planerized using CMP until substantially the top of the conductive metal pillar 78 is exposed.

Figure 2I:
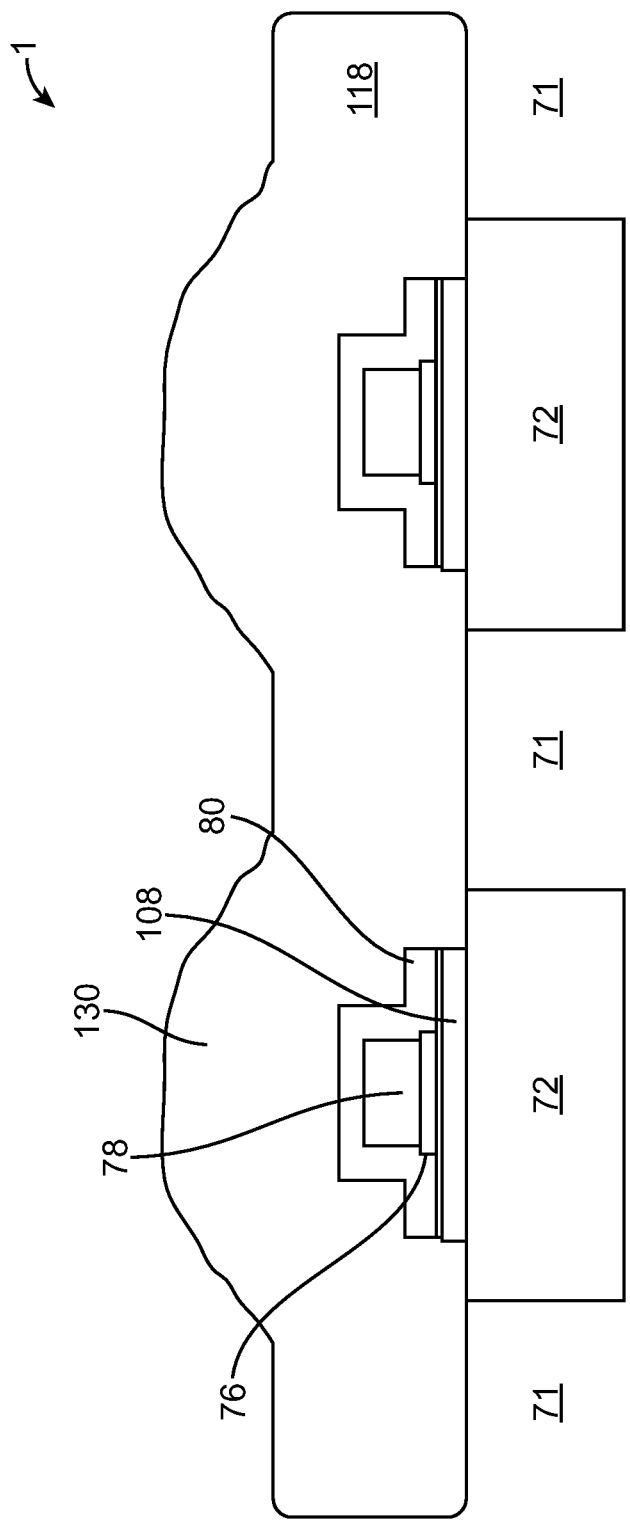

Referring now to FIG. 2i, showing a cross section of the wafer to include ILD layer 71, metal pillar 72, conductive metal cap 74, MTJ 76, conductive metal cap 76, passivation layer 116, and ILD layer 118. FIG. 2i shows a small hump 130 over the MTJ 76.

Figure 2J:
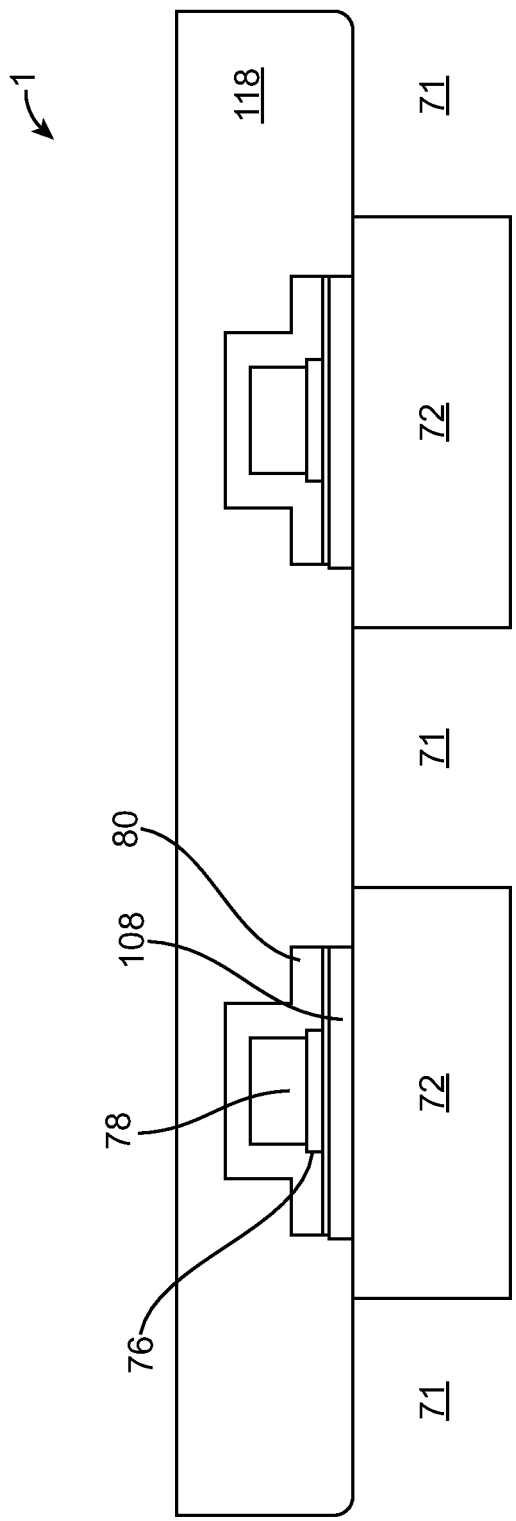

Referring now to FIGS. 2i and 2j, the small hump 130 that forms above the MTJ 76 as part of the deposition process is flattened using CMP so that the ILD layer 118 is flat.

Figure 2K:
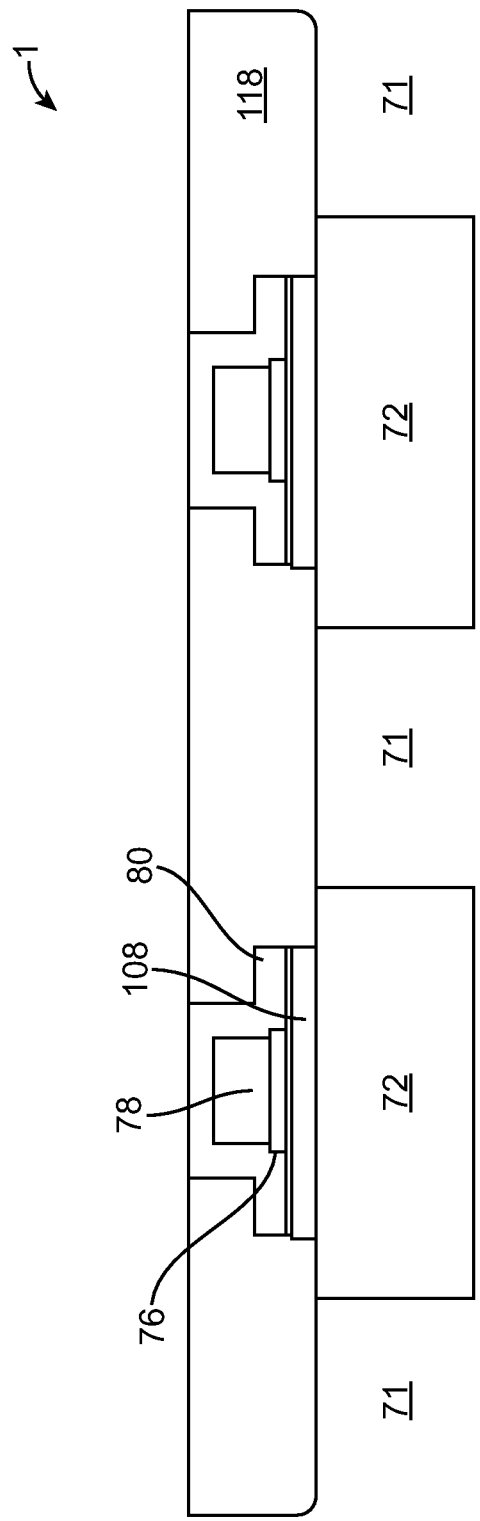

Referring now to FIG. 2k, the ILD layer 118 is planerized using CMP until the top of the passivation cap 80 is exposed. Passivation cap 80 results from the patterning of the passivation layer 16.

Referring now to FIG. 2l, the CMP slurry is changed and the passivation cap 80 is planerized using CMP until the top of conductive metal pillar 78 is exposed.

After the ILD deposition and planerization step 36 in FIG. 1, a metal deposition step 38 is performed during which a metal layer 120 is deposited on top of the ILD layer 118 and MTJ-stack top 77. In an exemplary application, aluminum is used for this step. It should be noted that other metals are also contemplated.

After the metal deposition step 38 in FIG. 1, a photo resist step 40 is performed during which photo resist 121 is patterned into bars on top of the metal cap 120 as shown in FIG. 18.

After the photo resist step 40 in FIG. 1, a metal etching step 42 is performed during which the metal cap 120 is etched away leaving metal bars 122. The metal bars connect multiple conductive metal caps 78 in order to pass a current and read from and write to the non-volatile magnetic memory cell. In an exemplary application, RIE is used to etch the metal bars 122. It should be noted that the use of RIE is exemplary only and other forms of etching are contemplated.

After the metal etching step 42 in FIG. 1, a passivation step 44 is performed during which a passivation layer 124 is deposited encapsulating the metal bars 122. The passivation layer 124 is necessary to prevent undesirable electrical connections between electrical components.

After the passivation step 44 in FIG. 1, a contact pads step 46 is performed during which contact pads are opened up to the memory cell 1 allowing the memory cells to connect to the rest of the circuits and logic.

FIGS. 3-21 show 3-dimensional views of the relevant part of a wafer 306 onto which memory cells are formed in accordance with the method of FIG. 1. Each figure shows six memory cells.

Figure 3:
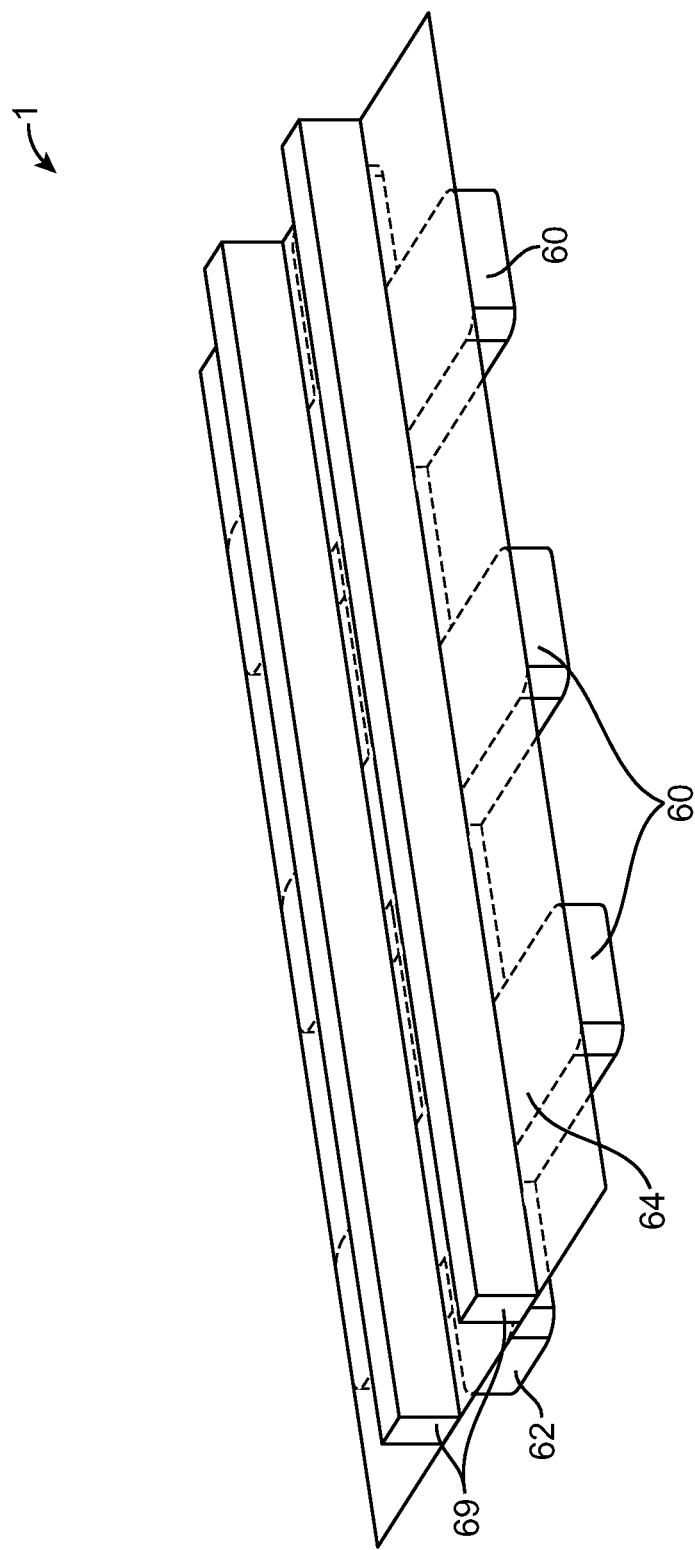

Referring now to FIG. 3 which shows the structure of the memory cell 1 after the CMOS step 10 has been completed, the source 60 and drain 62 are shown to be formed substantially parallel to one another. The gate 69 is shown to be form substantially on top of the source 60, drain 62, and the channel 64 is formed substantially underneath the gate.

Figure 3A:
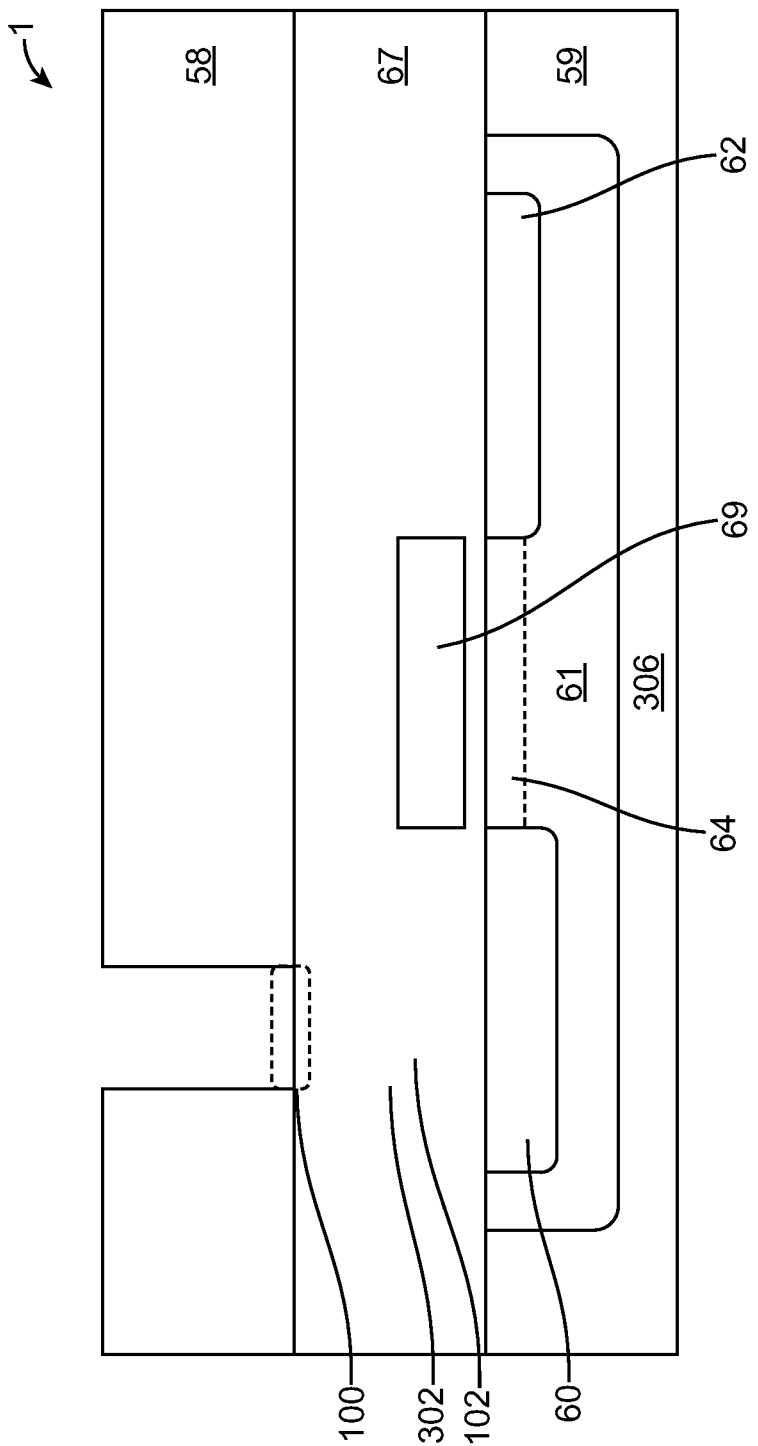
FIG. 3a shows the structure of the memory cell during step 12, after photo resist has been applied to the top of the ILD layer except in the contact definition area.
Figure 3B:
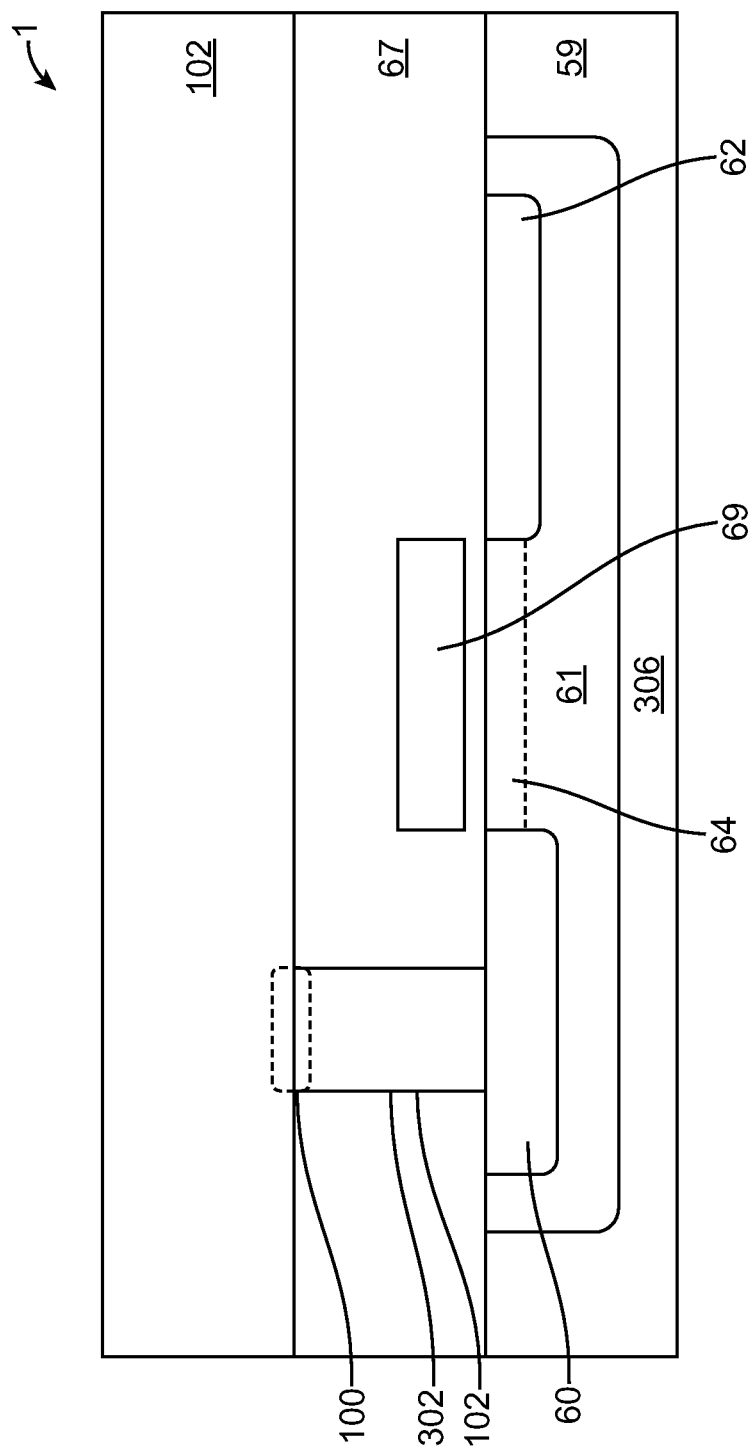
FIG. 3b shows the structure of the memory cell during step 12, after the ILD layer has been etched and a metal material deposited on top of the ILD layer.

FIGS. 3a and 3b show the structure of memory cell 1 after the contact definition step 12. In FIG. 3a, the photo-resist 58 is shown to be patterned on top of the ILD layer 67 except in the contact area 100, as noted above. In FIG. 3b, the barrier layer 101 is shown to fill the hole 302. The barrier layer 101 is formed on top of the ILD layer 67 as well as in the hole 302.

Figure 4:
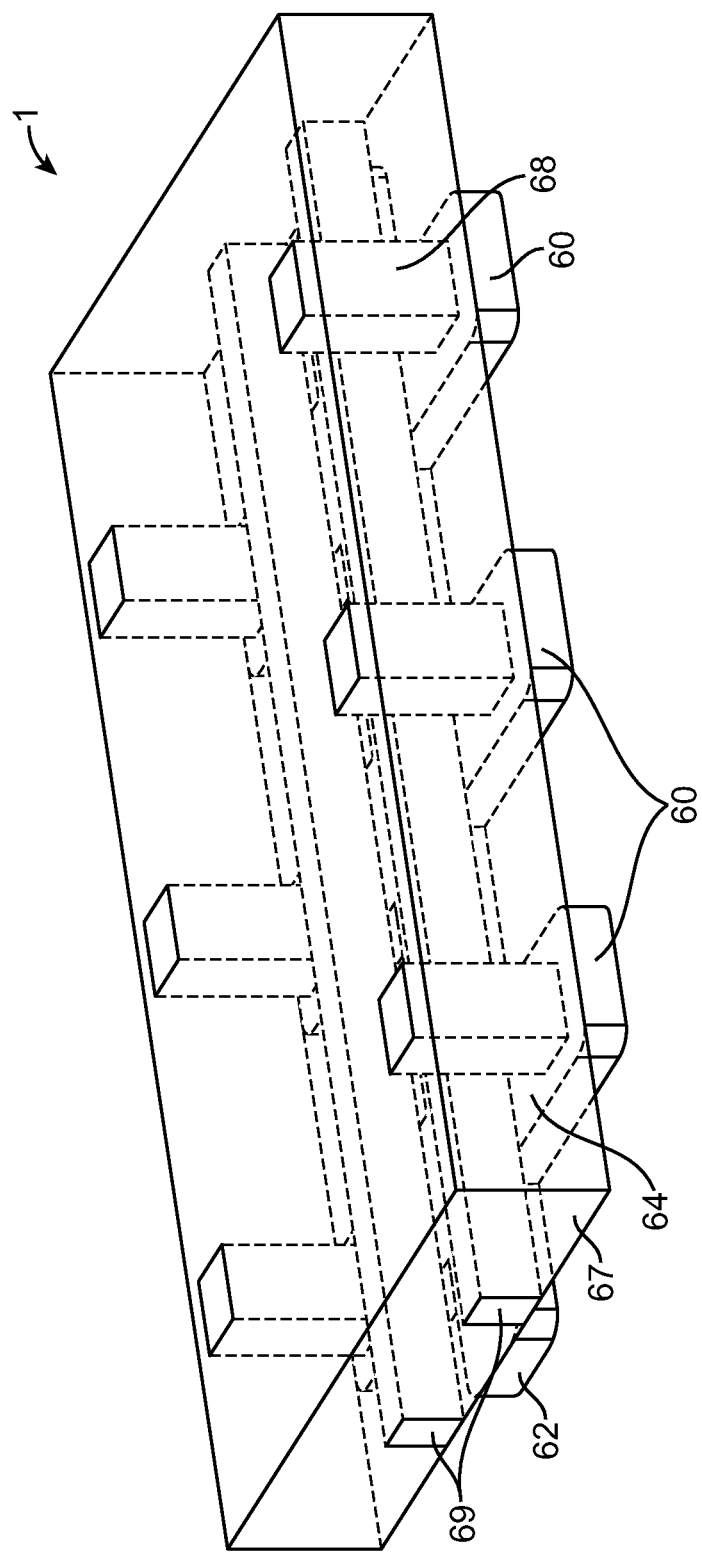

FIG. 4 shows the structure of the memory cell 1 after the step 12. The memory cell 1 is shown to include the drain 62, source 60, channel 64, gate 69, ILD layer 67 and metal contact pillar 68. The metal contact pillar 68 is shown formed substantially on top of the source 60. The ILD layer 67 is shown formed substantially around the metal pillar 68 and of substantially the same thickness as the metal pillar 68.

Figure 5:
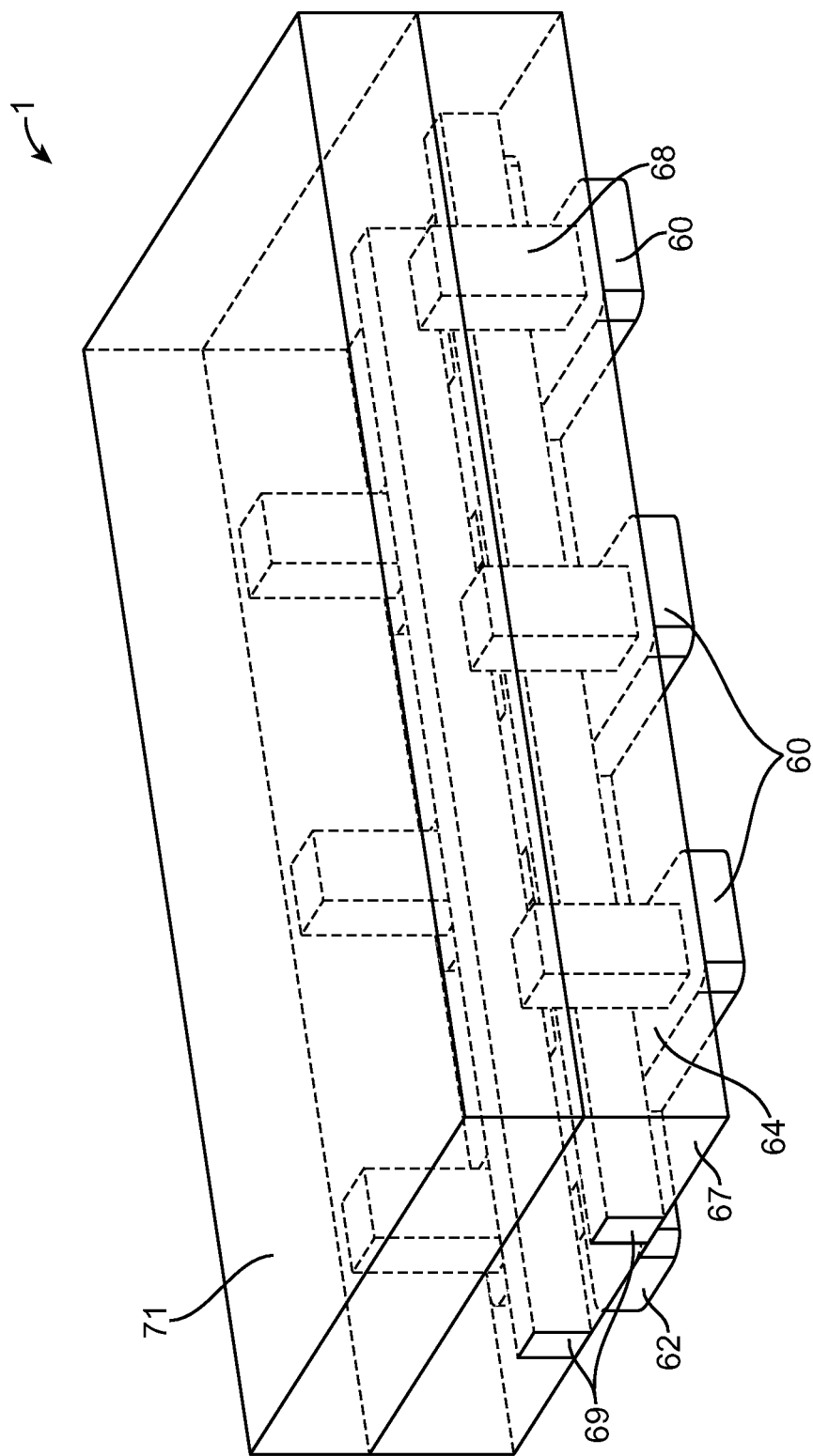
Figure 5A:
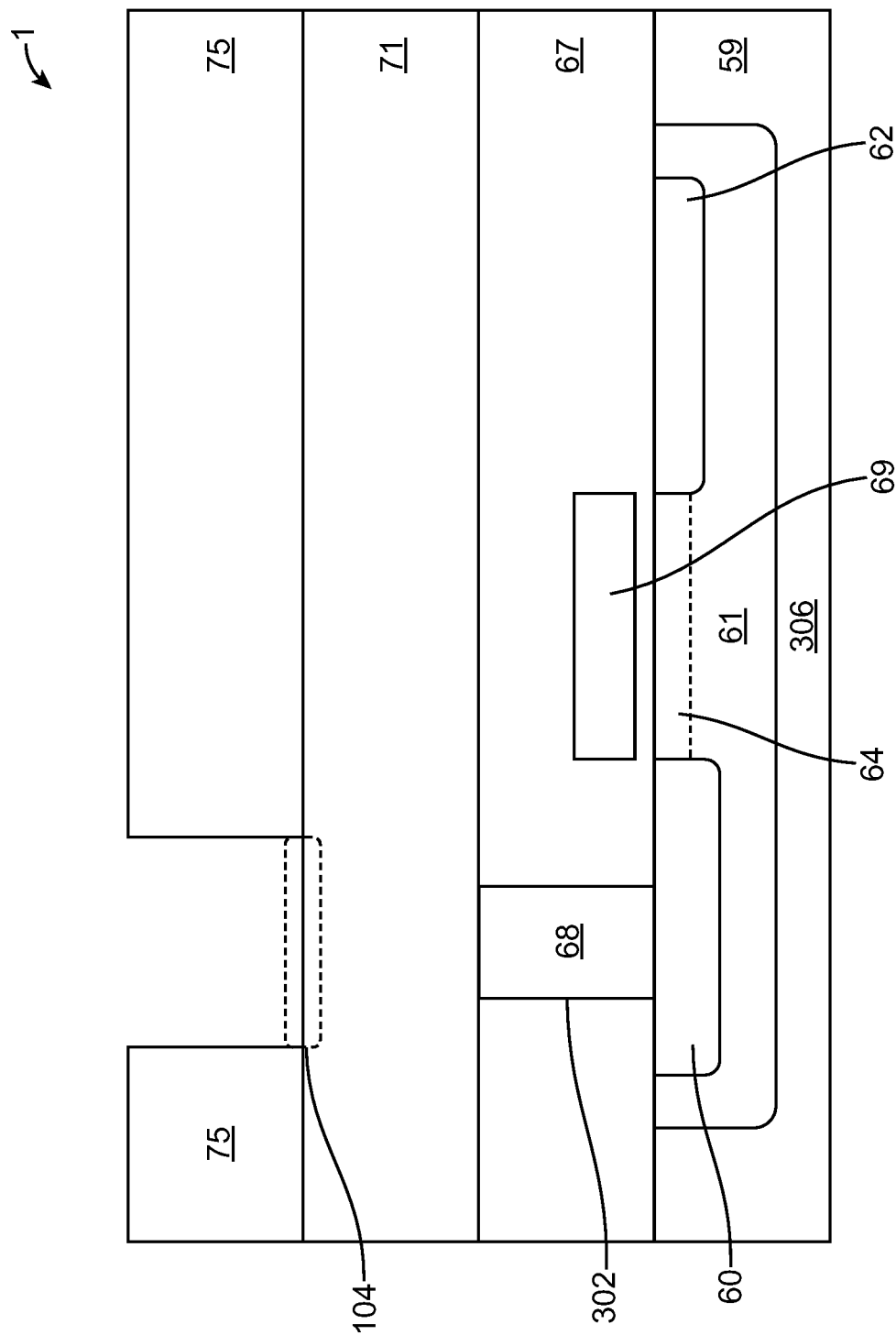
FIG. 5a shows the structure of the memory cell during step 16 where photo resist has been applied to the top of the ILD layer except over the contact definition area.

FIGS. 5 and 5a show the structure of the memory cell 1 after the step 14. In FIG. 5, the memory cell 1 is shown to include the drain 62, source 60, channel 64, gate 69, ILD layer 67, metal contact pillar 68, and ILD layer 71. The ILD layer 71 is shown formed substantially over the ILD layer 67 and metal contact pillar 68. In FIG. 5a, the memory cell 1 is shown when photo-resist 75 is applied on top of the ILD layer 71.

Figure 6:
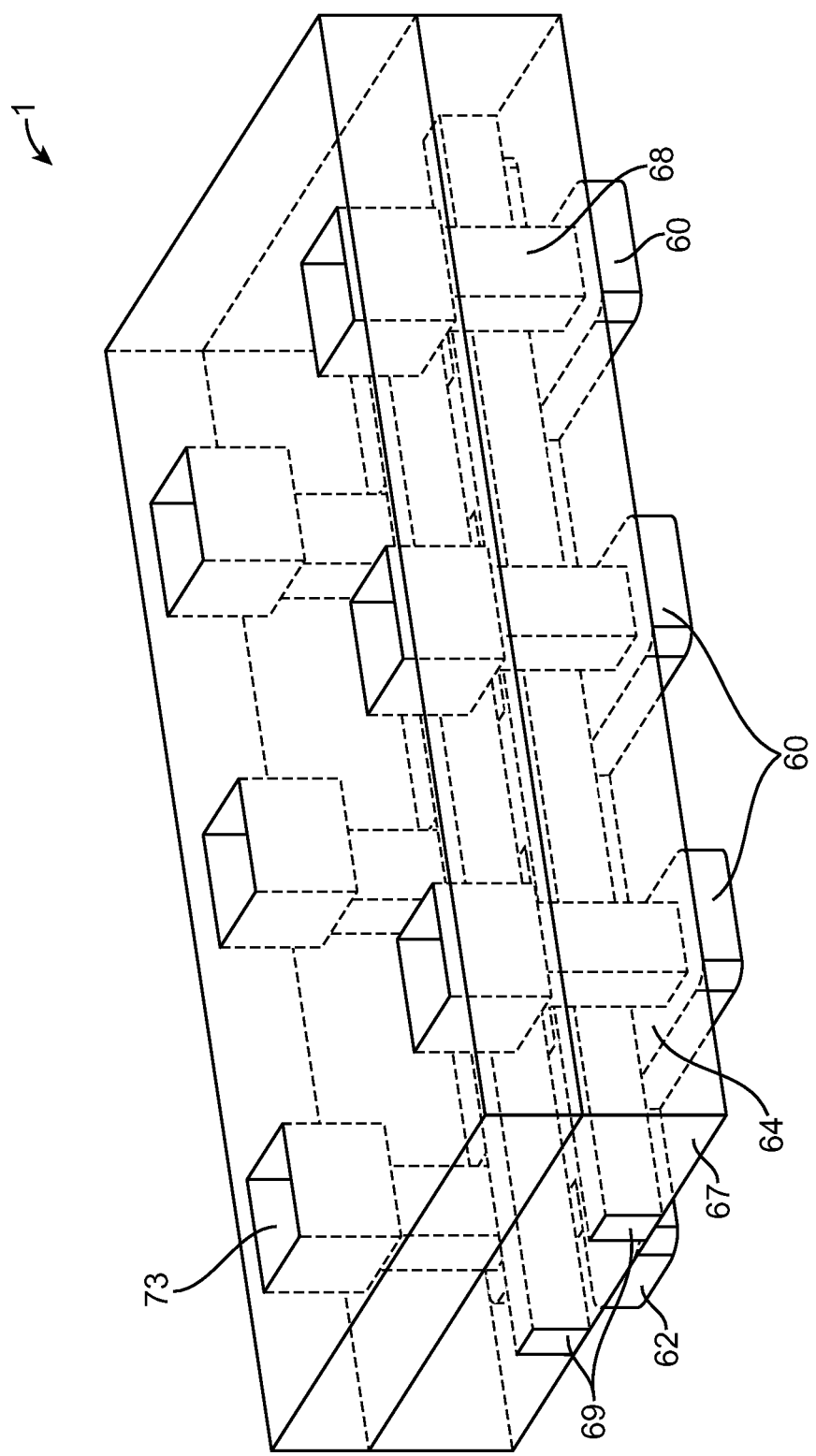

FIG. 6 shows the structure of the memory cell 1 after the step 16. The memory cell 1 is shown to include the drain 62, source 60, channel 64, gate 69, ILD layer 67, metal contact pillar 68, and a post-etch ILD layer with pillar holes 73. The post-etch ILD layer with pillar holes 73 is shown formed above the ILD layer 67 and metal contact pillar 68.

FIG. 7 shows the structure of the memory cell 1 after the step 18. The memory cell 1 is shown to the drain 62, source 60, channel 64, gate 69, ILD layer 67, metal contact pillar 68, post-etch ILD layer with pillar holes 73, and metal material 106. The metal material is formed above the post-etch ILD layer with pillar hole 73. The metal material is also formed in such a way as to fill the pillar holes in the post-etch ILD layer will pillar holes.

FIG. 8 shows the structure of the memory cell 1 after the step 20. The memory cell 1 is shown to include the drain 62, source 60, channel 64, gate 69, ILD layer 67, metal contact pillar 68, ILD layer 71, and metal pillar 72. The metal pillar 72 is shown to be formed substantially above metal contact pillar 68 so as to make electrical contact. ILD layer 71 is shown formed around metal pillar 72 and formed of substantially the same thickness as metal pillar 72.

FIG. 9 shows the structure of the memory cell 1 after the step 22. The memory cell 1 is shown to include the drain 62, source 60, channel 64, gate 69, ILD layer 67, metal contact pillar 68, ILD layer 71, metal pillar 72, and conductive metal cap 108. The conductive metal cap 108 is shown formed substantially above the ILD layer 71 and metal pillar 72.

FIG. 10 shows the structure of the memory cell 1 after the step 24. The memory cell 1 is shown to include the drain 62, source 60, channel 64, gate 69, ILD layer 67, metal contact pillar 68, ILD layer 71, metal pillar 72, conductive metal cap 108, MTJ film 110, and conductive metal cap 112. The MTJ film is shown formed substantially on top of the conductive metal cap 108. The conductive metal cap 112 is shown formed substantially on top of the MTJ film 110.

FIG. 11 shows the structure of the memory cell 1 after the step 26. The memory cell 1 is shown to include the drain 62, source 60, channel 64, gate 69, ILD layer 67, metal contact pillar 68, ILD layer 71, metal pillar 72, conductive metal cap 108, MTJ film 110, conductive metal cap 112 and photo-resist pillars 114. The photo-resist pillars are shown formed on top of the conductive metal cap 112 and are positioned substantially in line with the metal pillar 72 along the vertical axis FIG. 12 shows the structure of the memory cell 1 after the step 26. The memory cell 1 is shown to include drain 62, source 60, and resistor 64, ILD layer 67, metal contact pillar 68, ILD layer 71, metal pillar 72, conductive metal cap 108, MTJ 76, and conductive metal pillar 78. While in FIG. 12, the MTJ 76 and conductive metal pillars are shown as square in shape, other shapes, including but not limited to, circles and ovals are also contemplated. Non-square shapes prove advantageous because they decrease the current required to operate the non-volatile magnetic memory cell.

FIG. 13 shows the structure of the memory cell 1 after the step 28. The memory cell 1 is shown to include the drain 62, source 60, channel 64, gate 69, ILD layer 67, metal contact pillar 68, ILD layer 71, metal pillar 72, conductive metal cap 108, MTJ 76, conductive metal pillar 78, and passivation layer 116. The cap area is raised in the area substantially above the conductive metal pillar 78.

FIG. 14 shows the structure of the memory cell 1 after the step 32. The memory cell 1 is shown to include the drain 62, source 60, channel 64, gate 69, ILD layer 67, metal contact pillar 68, ILD layer 71, metal pillar 72, conductive metal cap 108, MTJ 76, conductive metal pillar 78, Si3N4 layer 116, and photo resist pillars 117. The photo resist is formed substantially above the MTJ 76 and conductive metal pillar 78.

FIG. 15 shows the structure of the memory cell 1 after the step 34. The memory cell 1 is shown to include the drain 62, source 60, channel 64, gate 69, ILD layer 67, metal contact pillar 68, ILD layer 71, metal pillar 72, conductive metal cap 108, MTJ 76, conductive metal pillar 78, and passivation cap

80. The passivation cap 80 substantially encapsulates the conductive metal cap 74, MTJ 76, and conductive metal pillar 78.

FIG. 16 shows the structure of the memory cell 1 after the step 36. The memory cell 1 is shown to include the drain 62, source 60, channel 64, gate 69, ILD layer 67, metal contact pillar 68, ILD layer 71, metal pillar 72, conductive metal cap 108, MTJ 76, conductive metal pillar 78, passivation cap 80, and ILD layer 118. The ILD layer 118 is then planerized using CMP to expose the MTJ-stack top 77.

FIG. 17 shows the structure of the memory cell 1 after the step 38. The memory cell 1 is shown to include the drain 62, source 60, channel 64, gate 69, ILD layer 67, metal contact pillar 68, ILD layer 71, metal pillar 72, conductive metal cap 108, MTJ 76, conductive metal pillar 78, passivation cap 80, ILD layer 118, and the metal cap 120. The metal cap is formed substantially on top of the ILD layer 118.

FIG. 18 shows the structure of the memory cell 1 after the step 40. The memory cell 1 is shown to include the drain 62, source 60, channel 64, gate 69, ILD layer 67, metal contact pillar 68, ILD layer 71, metal pillar 72, conductive metal cap 108, MTJ 76, conductive metal pillar 78, passivation cap 80, ILD layer 118, a metal cap 120, and a photo resist bars 121. The photo resist bars are formed on top of the metal cap 120 and substantially above the conductive metal caps 78.

FIG. 19 shows the structure of the memory cell 1 after the step 42. The memory cell 1 is shown to include the drain 62, source 60, channel 64, gate 69, ILD layer 67, metal contact pillar 68, ILD layer 71, metal pillar 72, conductive metal cap 108, MTJ 76, conductive metal pillar 78, passivation cap 80, ILD layer 118, and metal bars 122. The metal bars are formed substantially above the conductive metal pillar 78 and connect multiple memory cells in order to pass current and operate them.

FIG. 20 shows the structure of the memory cell 1 after the step 44 is performed. The memory cell 1 is shown to include the drain 62, source 60, channel 64, gate 69, ILD layer 67, metal contact pillar 68, ILD layer 71, metal pillar 72, conductive metal cap 108, MTJ 76, conductive metal pillar 78, passivation cap 80, ILD layer 118, metal bars 122, and a passivation layer 124. The passivation layer is formed substantially on top of the metal bars 122 and ILD layer 118.

FIG. 21 shows the structure of the memory cell 398 after step 314 is performed. The memory cell 398 is shown to include the drain 62, source, 62, resistor 64, ILD layer 67, metal contact pillar 68, and metal layer 322. In an exemplary embodiment the metal layer 322 is made out of copper. It should be noted that this is exemplary only and other materials are contemplated.

FIG. 22 shows the structure of the memory cell 398 after step 316 is performed. The memory cell 398 is shown to include the drain 62, source, 62, resistor 64, ILD layer 67, metal contact pillar 68, and metal pillars 72.

FIG. 23 shows the structure of the memory cell 398 after steps 318 and 320. The memory cell 398 is shown to include the drain 62, source, 62, resistor 64, ILD layer 67, metal contact pillar 68, ILD layer 71 and metal pillars 72.

Although the present invention has been described in terms of specific embodiments, it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A method of manufacturing a magnetic random access memory (MRAM) cell comprising:
    a multi-stage manufacturing process including the steps of:
        performing a front end on-line (FEOL) stage, in a first facility, to make logic and non-magnetic portions of a memory cell being manufactured including the steps of,
        forming an intermediate interlayer dielectric (ILD) layer in the first facility;
        forming intermediate metal pillars embedded in the intermediate ILD layer layer in the first facility; and
        depositing a conductive metal cap on top of the intermediate ILD layer and the metal pillars to seal the intermediate ILD layer and the intermediate metal pillars and avoid oxidation of the intermediate metal pillars during transport, after the depositing step, a FEOL stage structure being formed;
        transporting the FEOL stage structure from the first facility to a second facility before forming additional layers on top thereof;
        performing magnetic fabrication stage, in a facility other than the first facility, to make a magnetic material portion of the memory cell being manufactured; and
        performing back end on-line (BEOL) stage, in a facility other than the first facility, to make metal and contacts of the memory cell being manufactured.

2. A method of manufacturing, as recited in claim 1, wherein the FEOL stage further includes the steps of: forming logic on top of a wafer, onto which memory cells are to be formed;
    forming a first ILD layer on top of the logic; and
    forming a plurality of first metal pillars dispersed in the first ILD layer.

3. A method of constructing a MRAM memory cell, as recited in claim 2, where the first metal pillars are made of tungsten.

4. A method of constructing a MRAM memory cell, as recited in claim 2, where the intermediate ILD layer is formed using a damascene process comprising:
    forming a intermediate ILD layer on top of the first ILD layer and first metal pillars;
    depositing photo resist on top of the intermediate ILD layer in a manner which covers substantially all of the ILD layer except the portion above the first metal pillars;
    etching the intermediate ILD layer until the first metal pillars are exposed;
    depositing a metal layer until the metal contacts the exposed, first metal pillars;
    planerizing the metal leaving in place the second metal pillars.

5. A method of constructing a MRAM memory cell, as recited in claim 4, where the second metal pillars are formed from copper.

6. A method of constructing a MRAM memory cell, as recited in claim 4, where the intermediate ILD layer etching is done using reactive ion etching (RIE).

7. A method of constructing a MRAM memory cell, as recited in claim 2, where the intermediate ILD layer is formed using a non-damascene process comprising:
    depositing a metal layer on top of the first ILD layer and first metal pillars;
    depositing photo-resist pillars on top of the metal layer in a pattern substantially above the first metal pillars;
    etching the metal layer until the second metal pillars remain;

depositing an ILD layer covering the entire wafer including the second metal pillars;

planerizing the ILD layer until the tops of the second metal pillars are exposed.

8. A method of constructing a MRAM memory cell, as recited in claim 2, where the second metal pillars are formed of copper.

9. A method of constructing a MRAM memory cell, as recited in claim 2, where the metal layer etching is done using reactive ion etching (RIE).

10. A method of constructing a MRAM memory cell, as recited in claim 2, where the first conductive metal cap is made of Tantalum, Tantalum Nitride, Titanium, Titanium Nitride, Chromium, Tungsten, Niobium or alloys containing one or more of these elements.

11. A method of manufacturing, as recited in claim 1, wherein the magnetic fabrication stage includes the steps of:

after the transporting step, depositing a magnetic tunneling junction (MTJ) film on top of the first conductive metal cap and a second conductive metal cap on top of the MTJ film;

depositing photo-resist pillars on top of the second conductive metal cap so that the photo-resist pillars are positioned substantially above the second metal pillars;

etching the second conductive metal cap and MTJ film but leaving an MTJ pillar;

forming a passivation cap over the remaining MTJ pillar and conductive metal pillar;

depositing photo-resist on the silicon nitride caps;

etching the first conductive metal cap to form the first conductive metal pillar and passivation cap;

depositing an ILD layer on top of the first conductive metal pillar, MTJ film, first conductive metal pillar, and passivation cap; and planerizing the deposited ILD layer to expose the top of the second conductive metal pillar.

12. A method of constructing a MRAM memory cell, as recited in claim 11, wherein the passivation cap covers the MTJ and top-electrode.

13. A method of manufacturing, as recited in claim 12, wherein the passivation cap is made of a non-conductive material, and a temperature deposition of below approximately 350 degrees Celsius.

14. A method of manufacturing, as recited in claim 12, wherein the passivation cap is made of material from a group consisting of: silicon nitride (Si3N4), silicon nitride (SiN), silicon oxy-nitride (SiON), zirconium oxide (ZrO2), zirconium nitride (ZrN), hafnium oxide (HfO2), hafnium nitride (HfN), tantalum nitride(TaN), titanium nitride(TiN), tantalum oxide(Ta2O5), aluminum oxide(Al2O3), or aluminum nitride(AlN).

15. A method of constructing a MRAM memory cell, as recited in claim 11, wherein the MTJ film is constructed using a cluster tool without breaking vacuum.

16. A method of constructing a MRAM memory cell, as recited in claim 11, where the second conductive metal cap is made of Tantalum, Tantalum Nitride, Titanium, Titanium Nitride, Chromium, Tungsten, Niobium or alloys containing one or more of these elements.

17. A method of constructing a MRAM memory cell, as recited in claim 11, where the second conductive metal cap is generally known as the top electrode.

18. A method of constructing a MRAM memory cell, as recited in claim 11, where the MTJ etching is done using reactive ion etching (RIE).

19. A method of constructing a MRAM memory cell, as recited in claim 11, where the MTJ etching is controlled using a hard mask.

20. A method of constructing a MRAM memory cell, as recited in claim 19, wherein the metal bars are formed using aluminum.

21. A method of constructing a MRAM memory cell, as recited in claim 19, wherein the metal bars are etched using reactive ion etching (RIE).

22. A method of manufacturing, as recited in claim 1, wherein the BEOL stage includes the steps of:

depositing a metal cap over the top of the wafer;

depositing photo resist over the top of the wafer;

etching the metal layers until only metal bars remain in a position substantially over the exposed second conductive metal pillars;

depositing a passivation layer over the top of the wafer to prevent electrical short circuit; and depositing contact pads on top of the wafer.

23. A method of manufacturing a magnetic random access memory (MRAM) cell comprising:

a multi-stage manufacturing process including the steps of:

performing a front end on-line (FEOL) stage, in a first facility, to make logic and non-magnetic portions of a memory cell being manufactured including the steps of, forming an intermediate interlayer dielectric (ILD) layer in the first facility;

forming intermediate metal pillars embedded in the intermediate ILD layer layer in the first facility; and depositing a conductive metal cap on top of the intermediate ILD layer and the metal pillars to seal the intermediate ILD layer and the intermediate metal pillars and avoid oxidation of the intermediate metal pillars during transport, after the depositing step, a FEOL stage structure being formed;

transporting the FEOL stage structure from the first facility to a second facility before forming additional layers on top thereof;

performing magnetic fabrication stage to make a magnetic material portion of the memory cell being manufactured; and performing back end on-line (BEOL) stage, in a facility other than the first facility, to make metal and contacts of the memory cell being manufactured.

* * * * *